(12) United States Patent
Nemoto

(10) Patent No.: US 7,358,127 B2
(45) Date of Patent: Apr. 15, 2008

(54) POWER SEMICONDUCTOR RECTIFIER HAVING BROAD BUFFER STRUCTURE AND METHOD OF MANUFACTURING THEREOF

(75) Inventor: Michio Nemoto, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 160 days.

(21) Appl. No.: 11/339,900

(22) Filed: Jan. 26, 2006

(65) Prior Publication Data

US 2006/0138607 A1      Jun. 29, 2006

Related U.S. Application Data

(62) Division of application No. 10/371,163, filed on Feb. 20, 2003, now Pat. No. 7,091,579.

(30) Foreign Application Priority Data

| Feb. 20, 2002 | (JP) | ............................. 2002-042469 |
| Jul. 24, 2002 | (JP) | ............................. 2002-214657 |

(51) Int. Cl.
  *H01L 21/336* (2006.01)
  *H01L 21/8234* (2006.01)
(52) U.S. Cl. ............... 438/197; 438/506; 438/509; 438/535; 257/E21.051; 257/E21.333; 257/E21.334; 257/E21.347
(58) Field of Classification Search ........... 438/197, 438/91, 141, 506, 508, 509, 510, 502, 522, 438/525, 530, 534, 535
See application file for complete search history.

(56) References Cited

U.S. PATENT DOCUMENTS 5,292,672 A * 3/1994 Akiyama et al. ........... 438/197

5,981,981 A * 11/1999 Takahashi ................... 257/133
6,060,745 A    5/2000 Tadokoro et al.

(Continued)

FOREIGN PATENT DOCUMENTS

| JP | 64-82563 A | 3/1989 |
| JP | 11-26779 A | 1/1999 |
| JP | 2000-223720 A | 8/2000 |

OTHER PUBLICATIONS

Nemoto, M. et al.; "An Advanced FWD Design Concept with Superior Soft Reverse Recovery Characteristics"; ISPSD'2000 Copyright by the IEEE; Catalog No. 00CH37094C; 4 pages.

(Continued)

*Primary Examiner*—David Nhu
(74) *Attorney, Agent, or Firm*—Rossi, Kimms & McDowell LLP

(57) ABSTRACT

Impurity concentration ($N_d(X)$) in an n-drift layer in a diode is at a maximum at a position at a distance Xp from an anode electrode in a direction from the anode electrode to a cathode electrode, and gradually decreases from the position toward each of the anode electrode and the cathode electrode. A ratio of the peak impurity concentration $N_p$ to an averaged impurity concentration $N_{dm}$ in the n-drift layer is in the range of 1 to 5. This provides a diode and a manufacturing method thereof by which oscillations in voltage and current at reverse recovery are inhibited to achieve enhancement both in high speed and low-loss characteristics and in soft recovery characteristics.

8 Claims, 49 Drawing Sheets

U.S. PATENT DOCUMENTS

| | | | | |
|---|---|---|---|---|
| 6,163,040 | A | * | 12/2000 | Akiyama et al. ............ 257/131 |
| 6,603,189 | B2 | * | 8/2003 | Takahashi ................... 257/617 |
| 6,791,121 | B2 | * | 9/2004 | Nemoto et al. ............. 257/109 |
| 6,798,001 | B2 | | 9/2004 | Fujisawa et al. |
| 7,091,579 | B2 | * | 8/2006 | Nemoto ...................... 257/656 |

OTHER PUBLICATIONS

Nemoto, M. et al.; "Great Improvement in IGBT Turn-on Characteristics with Trench Oxide PiN Schottky (TOPS) Diode;" Proceedings of 2001 Int'l Symposium on Power Semiconductor Devices & ICs, Osaka, Japan; pp. 307-310.

Baliga, B.J.; "The Pinch Rectifier: A Low-Forward-Drop High Speed Power Diode;" IEEE Electron Device Letters, vol. EDL-5, No. 6; Jun. 1984; pp. 194-196.

Mori, M. et al.; "A Novel Soft and Fast Recovery Kioke (SFD) with Thin P-Layer Formed by Al-Si Electrode;" CH2987-6/91/0000-0113: IEEE 1991; pp. 113-117.

Baglia, B.J.; "Power Semiconductor Devices;" PWS Publishing Company, Boston 1996; p. 73 (4 pgs total).

* cited by examiner

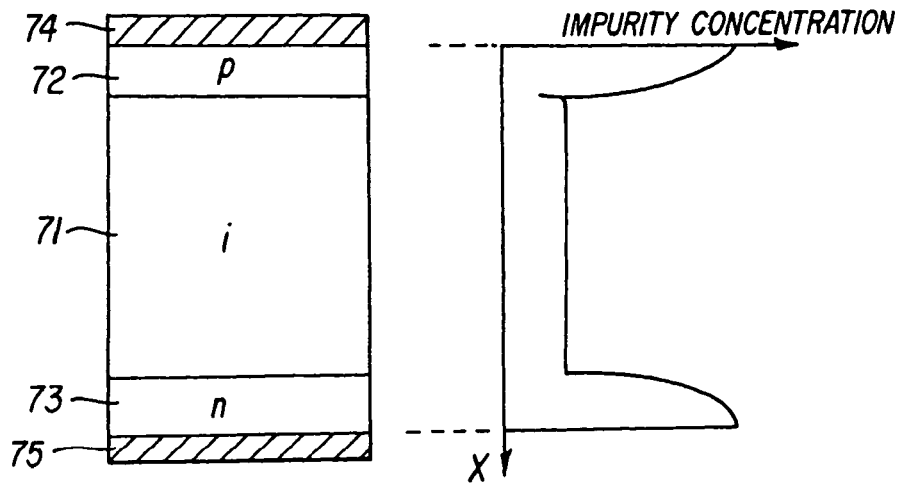
FIG. 1A
(PRIOR ART)
FIG. 1B
(PRIOR ART)
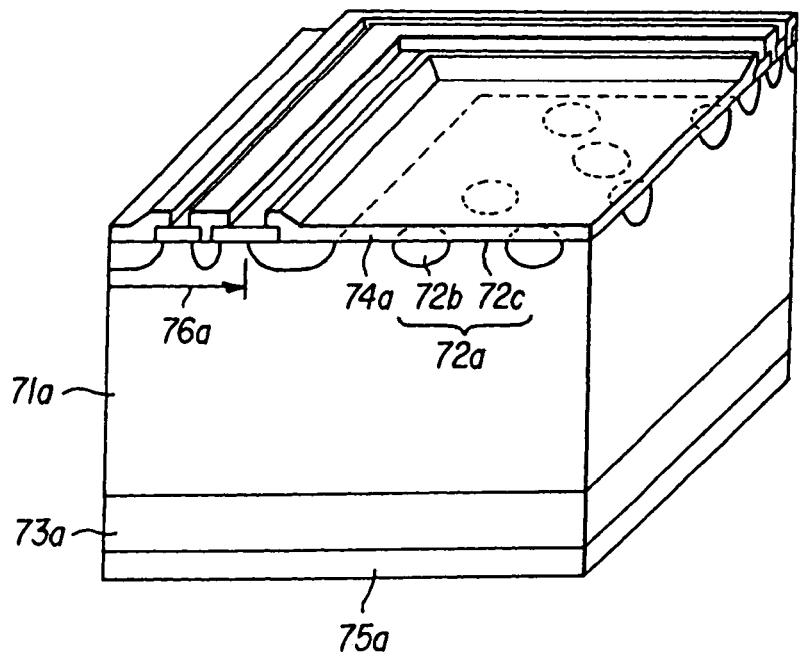
FIG. 2
(PRIOR ART)

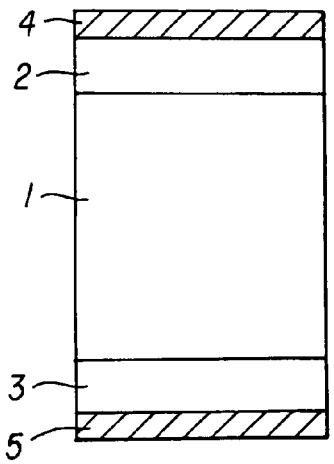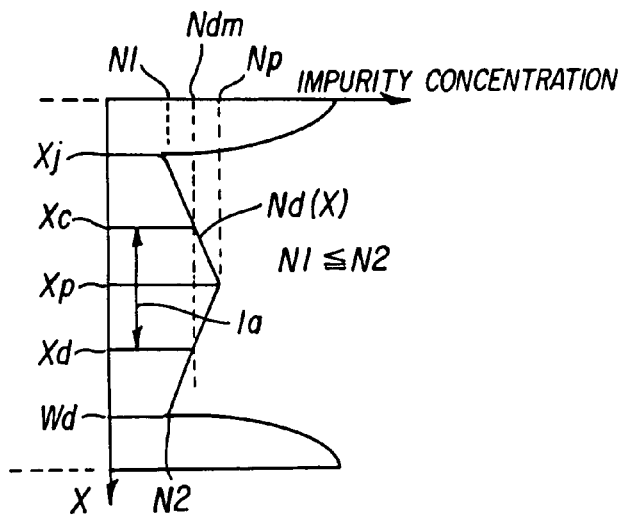
FIG. 12A  FIG. 12B
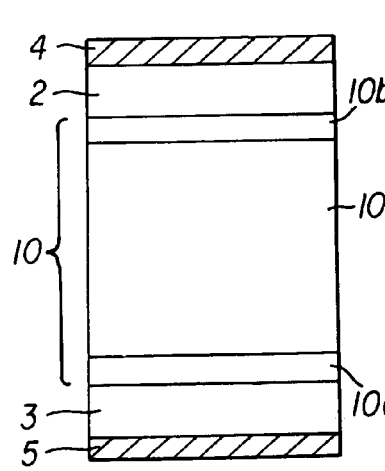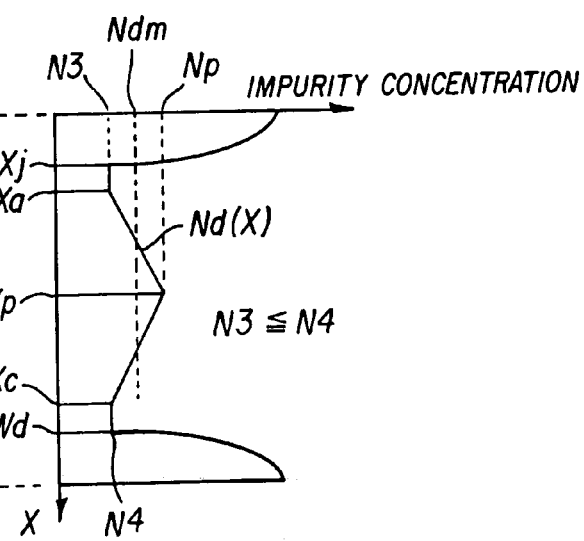
FIG. 13A  FIG. 13B

I —— (PRESENT INVENTION: ELECTRON BEAM IRRADIATION)
II —— (PRESENT INVENTION: PLATIUM DIFFUSION)
III —— (RELATED DEVICE A: ELECTRON BEAM IRRADIATION)
IV —— (RELATED DEVICE A: PLATIUM DIFFUSION)

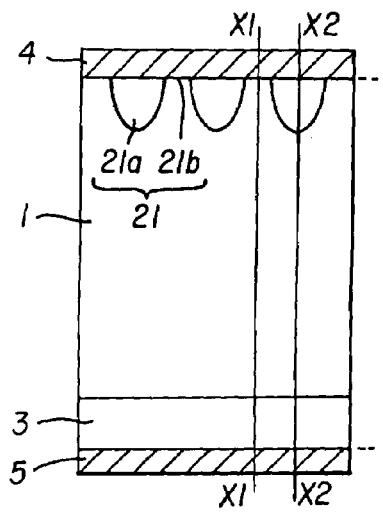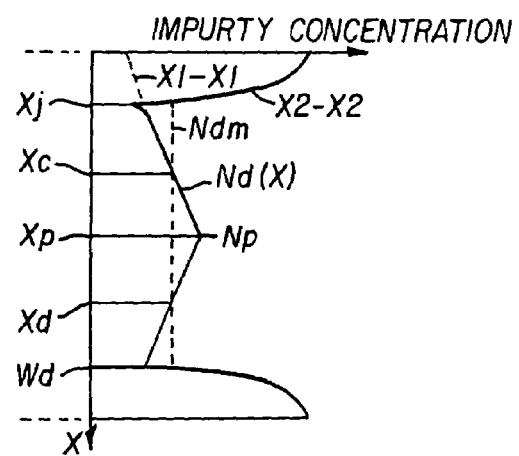
FIG. 38A  FIG. 38B
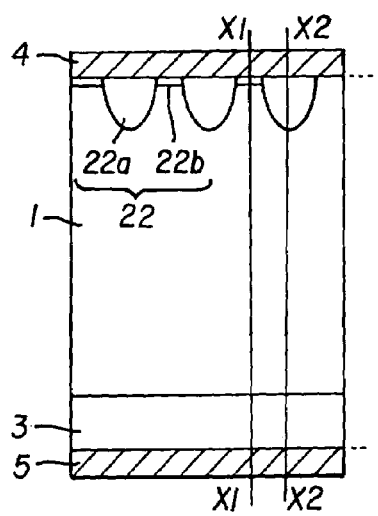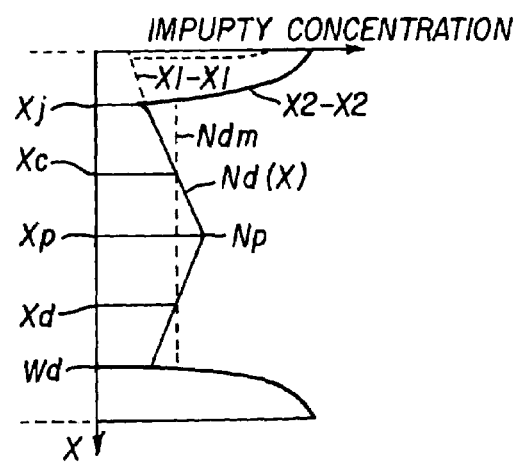
FIG. 39A  FIG. 39B

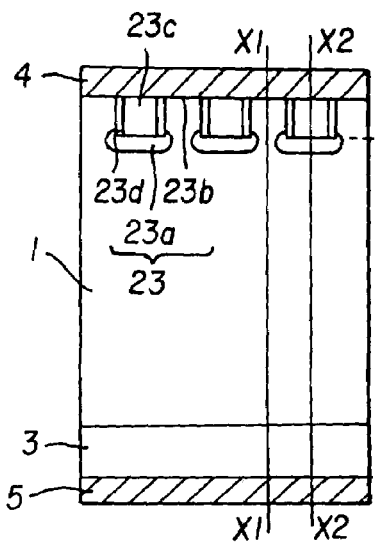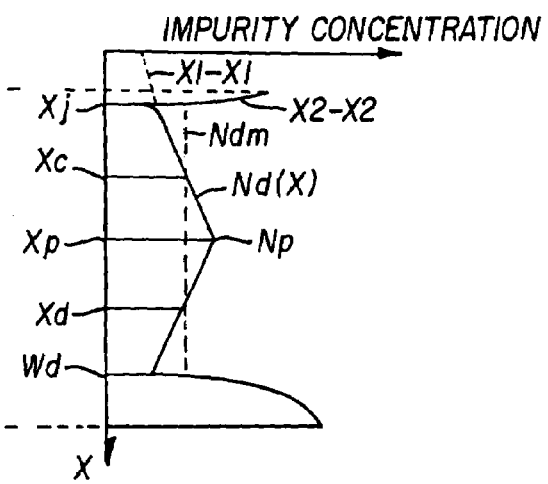
FIG. 40A  FIG. 40B
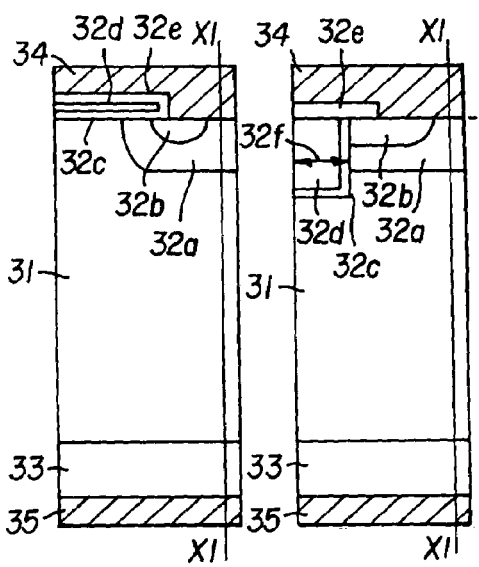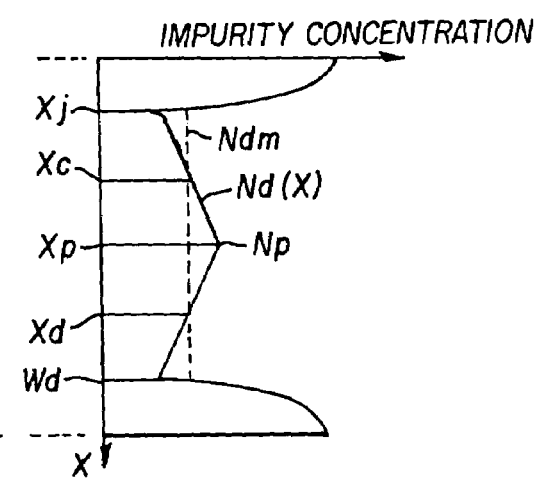
FIG. 41A  FIG. 41B  FIG. 41C

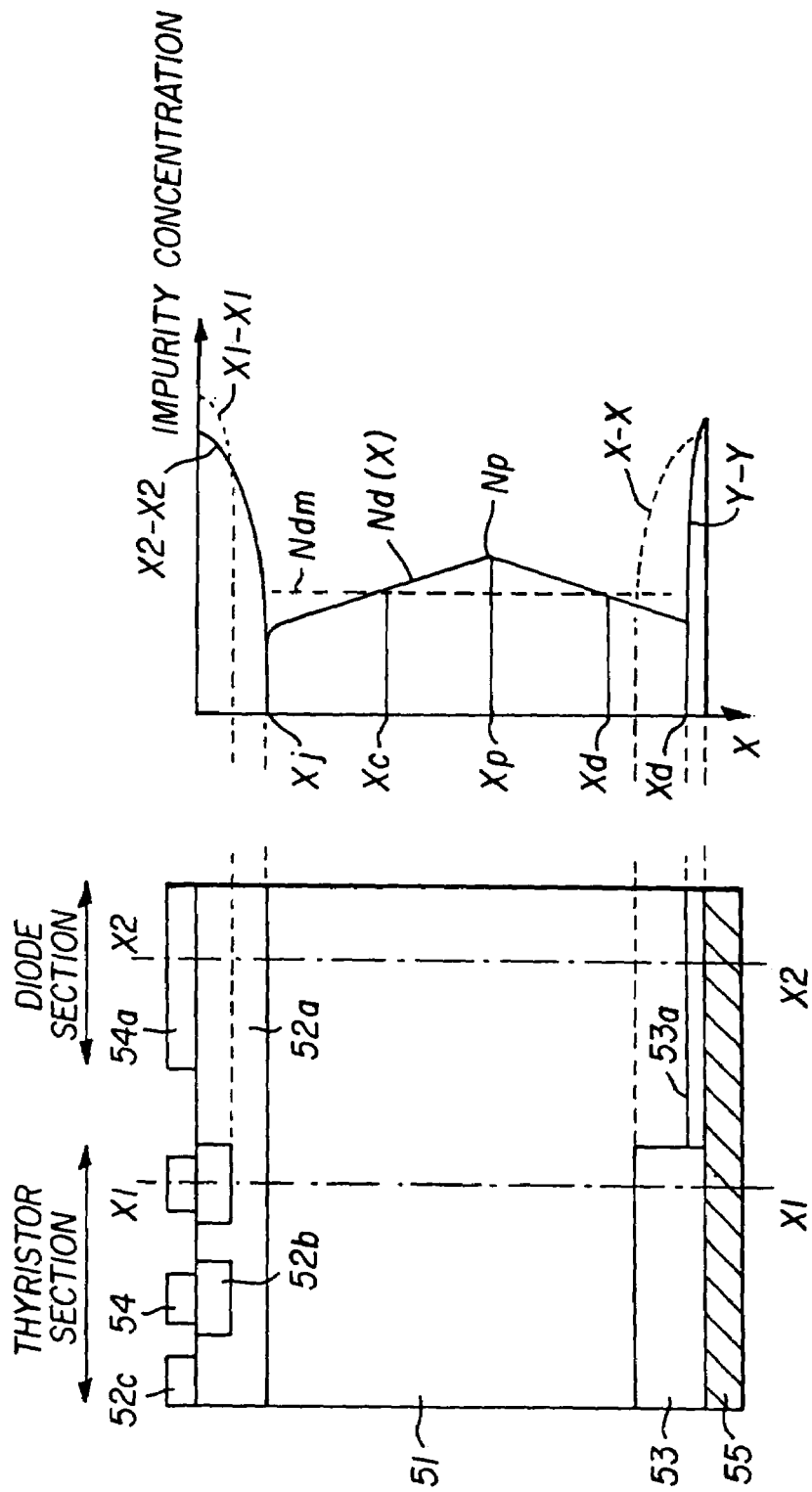

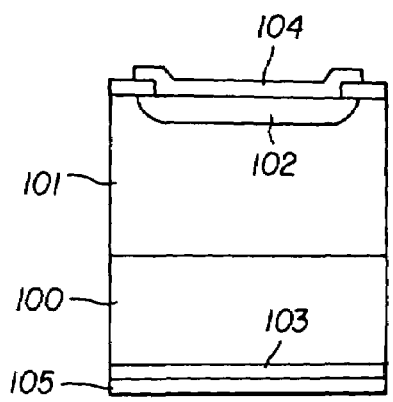 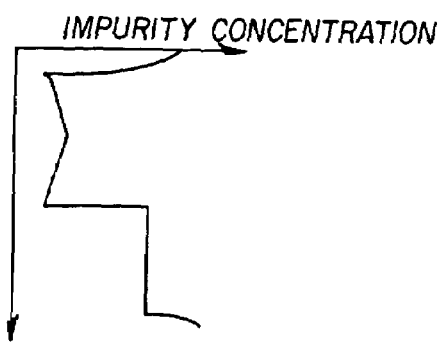
FIG. 46A        FIG. 46B
FIG. 47
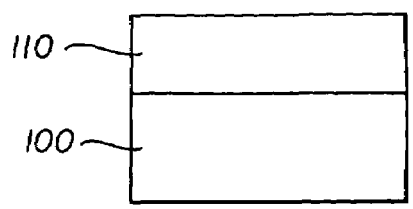
FIG. 48

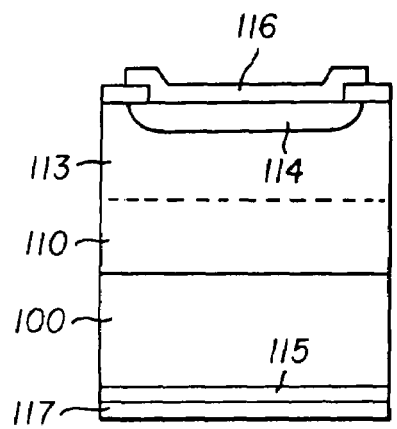
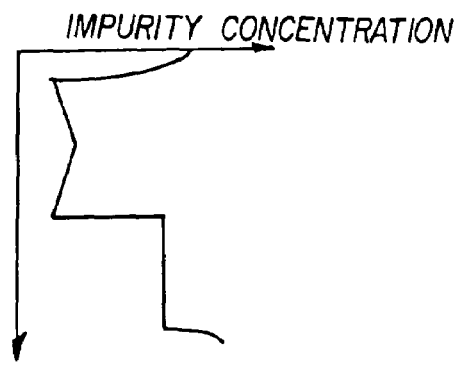
FIG. 52A    FIG. 52B
FIG. 53
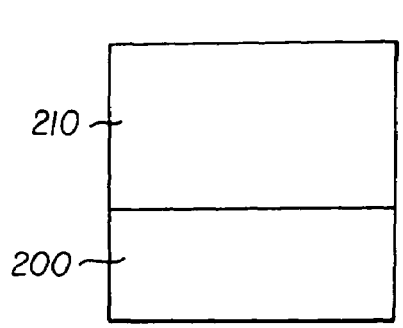
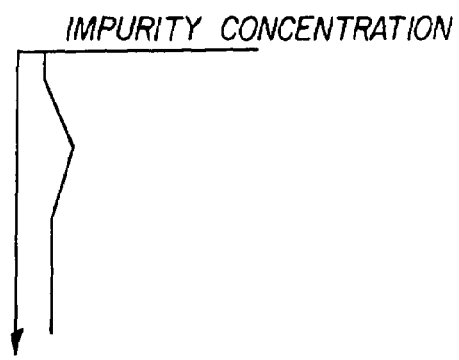
FIG. 54A    FIG. 54B

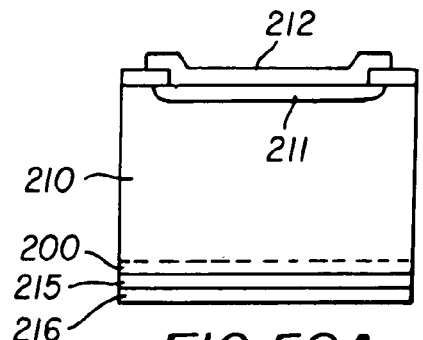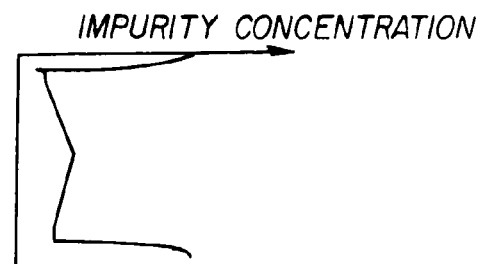
FIG. 58A  FIG. 58B
FIG. 59
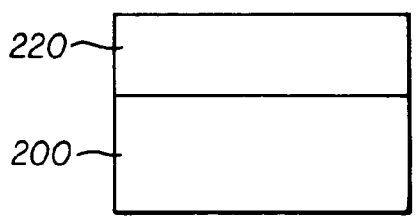
FIG. 60
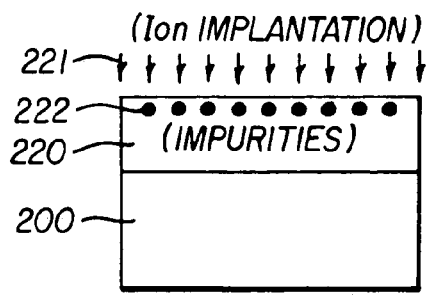
FIG. 61

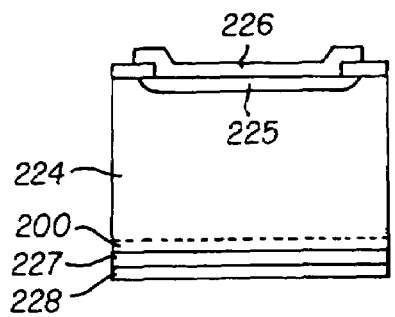
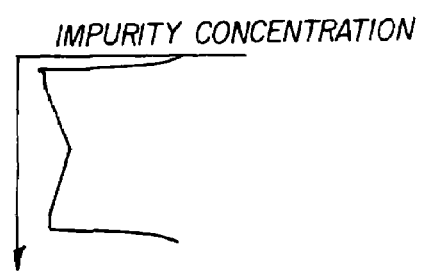
FIG. 65A
FIG. 65B
FIG. 66
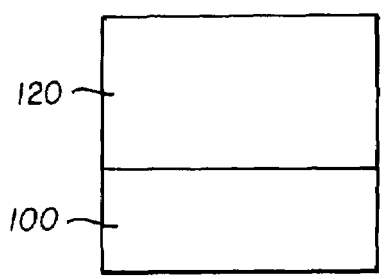
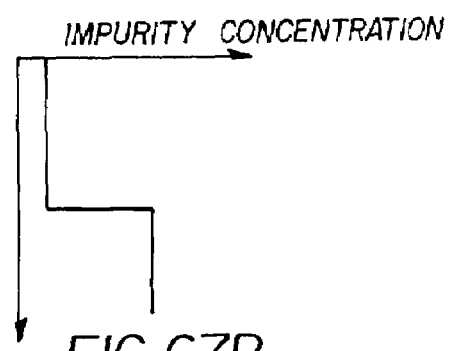
FIG. 67A
FIG. 67B

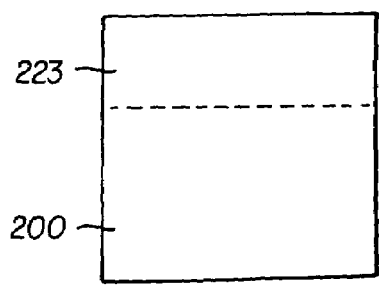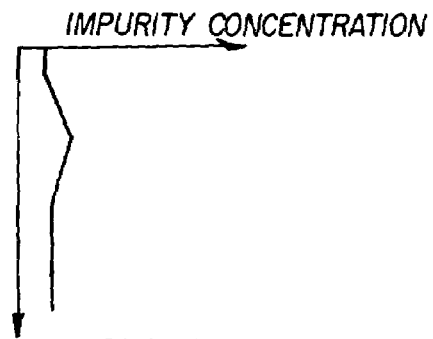
FIG. 80A  FIG. 80B
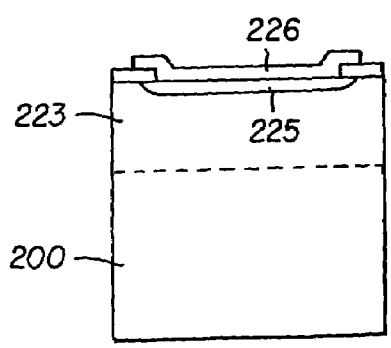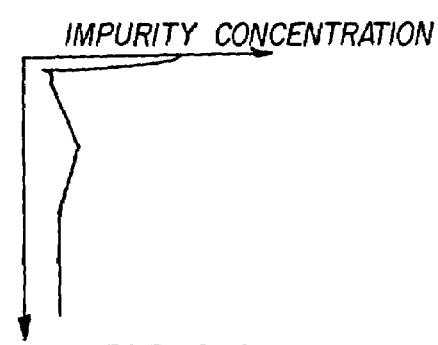
FIG. 81A  FIG. 81B
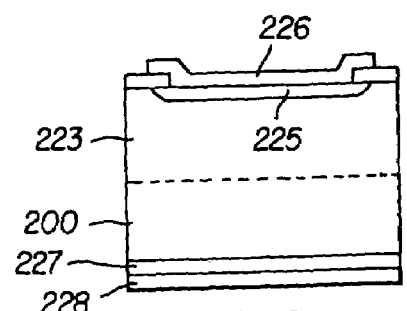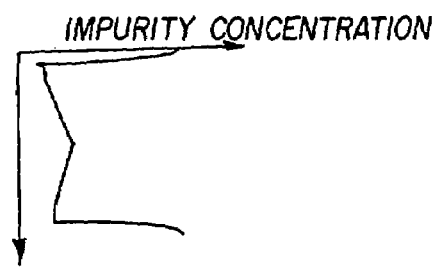
FIG. 82A  FIG. 82B

POWER SEMICONDUCTOR RECTIFIER HAVING BROAD BUFFER STRUCTURE AND METHOD OF MANUFACTURING THEREOF

CROSS-REFERENCE TO RELATED APPLICATION

This is a divisional of U.S. application Ser. No. 10/371,163 filed on Feb. 20, 2003, now U.S. Pat. No. 7,091,579.

BACKGROUND

In a p-i-n diode shown in FIGS. 1A and 1B (a related device A) that is widely used at present, a large transient current flows therein in the reverse direction when switched from a turned-on state to a turned-off state (at reverse recovery). The current is referred to as a reverse recovery current. During that time, a larger electrical loss occurs in the diode than in a steady state. Thus, it is a requisite for the diode to make the loss small to operate at a high-speed. Furthermore, during that time, electrical duty in the diode becomes higher, as compared with that in the steady state. An increased steady current flowing in the diode or an increased DC bus voltage increases the electrical duty to thereby sometimes damage the diode. For assuring high reliability in a diode used for electric power equipment, it is strongly required that reverse recovery withstanding capability be made far higher than the rating one.

As a current measure for improving reverse recovery characteristics and withstanding capability of the p-i-n diode, there is widely applied lifetime control of minority carriers that is performed by using heavy metal diffusion or electron beam irradiation. Namely, by shortening carrier lifetimes, a total carrier concentration in a steady state can be reduced to reduce the concentration of carriers swept-out by a spread space charge region during the reverse recovery. This can decrease a reverse recovery peak current and reverse recovery charges to reduce reverse recovery loss. Moreover, an electric field strength during the reverse recovery, which is due to holes running through the space charge region, is also relaxed by the reduction in the hole concentration. Thus, the duty is reduced to enhance the reverse recovery withstanding capability.

Also, it is important to make the diode perform soft recovery. In recent years, from the view point of environmental safety, the emphasis has been focused on reducing electromagnetic noise generated from power electronics equipment. One of the ways to achieve that goal is with making reverse recovery of the diode performed in a soft recovery mode to inhibit the cause of noise, such as from oscillation. The measure for the soft recovery is well carried out by lowering the efficiency of minority carrier injection from an anode side. Typical examples of this are presented as a Merged P-I-N/Schottky Diode (MPS) (as disclosed in *The Pinch Rectifier* by B. J. Baliga, IEEE Electron. Dev. Lett., ED-5, p. 194 (1984)) and a Soft and Fast recovery Diode (SFD) (as disclosed in *A Novel Soft and Fast Recovery Diode (SFD) with Thin P-layer Formed by Al—Si Electrode* by M. Mori, et al., Proceedings of ISPSD'91, pp. 113-117 (1991)).

The MPS diode is a p-i-n diode with an anode thereof arranged with a p-region and a Schottky region. This arrangement is explained in reference with FIG. 2 is a perspective view showing a principal part of an MPS diode. A surface structure (an anode layer 72a) is formed with p-regions 72b and a Schottky region 72c. In the figure, each of the p-regions 72a has a circular plane shape with the center thereof disposed at each of lattice points of a triangular lattice. Reference numerals 71a, 73a, 74a, 75a, and 76a in the figure denote an n-drift layer, an n-cathode layer, an anode electrode, a cathode electrode, and a voltage withstanding structure, respectively.

The high speed and low-loss characteristics in the reverse recovery operation and the soft recovery characteristics are in a relation that requires a trade-off (as disclosed in *An Advanced FWD Design Concept with Superior Soft Reverse Recovery Characteristics* by M. Nemoto, et al., Proceedings of ISPSD2000, pp. 119-122 (2000)). Namely, for performing the soft recovery, many minority carriers are made stored particularly on the cathode side. This is for reserving the largest possible number of minority carriers on the cathode side when the space charge region is spread from the anode side toward the cathode side at the reverse recovery. Thus, a decreasing rate of an anode current dir/dt is made lowered. This, however, causes an increase in the reverse recovery loss that requires some time until the reverse recovery is ended. On the contrary, performing high speed and low-loss reverse recovery is to reduce minority carriers stored in the drift layer at turning-on the diode. This, however, results in so-called snappy reverse recovery (hard recovery) to sometimes cause both voltage and current to oscillate.

For example, as is presented in M. Nemoto, et al., Proc. ISPSD'98, pp. 305-308 (1998), disappearance of excess carriers in an n-drift layer before the end of a reverse recovery process causes an abrupt increase in dir/dt. This further causes an accompanied increase in an anode to cathode voltage Vak of a diode to generate a surged voltage. The surged voltage further causes concentration of an electric field to bring about breakdown of the diode. The surged voltage further triggers the voltage itself to oscillate with an oscillation waveform. The oscillation becomes a source of noise radiation from an electric power converting equipment such as an inverter. Therefore, the diode must be provided so that no excess carriers are made to disappear when the diode is in the course of reaching a steady state of current blocking at the reverse recovery.

Moreover, there is also another way of reducing reverse recovery loss by thinning the $n^-$-drift layer within a range, without degrading the breakdown voltage of the element to reduce reverse recovery charges. This, however, reduces carriers stored on the cathode side at the reverse recovery to make the excess carriers liable to disappear during reverse recovery, which easily causes resulting oscillation. Therefore, with current measures, it is becoming difficult to reduce the reverse recovery loss while maintaining the soft recovery characteristics.

One of typical measures for achieving the above trade-off is to combine the previously explained low minority carrier injection structure and the thinned drift layer. By reducing efficiency of minority carrier injection, which increases excess carriers on the cathode side to make the diode perform soft recovery, and by reducing the thickness of the drift layer, the soft recovery can be achieved with high-speed reverse recovery. Moreover, there is also a measure in which irradiation with a beam of light ion particles such as protons or helium ions is carried out for locally controlling lifetime of carriers to make the diode perform improved soft recovery. In these measures, however, the reduced thickness of the drift layer not only lowers breakdown voltage but also imposes limitation in making the diode perform soft recovery. This is because the spread of the space charge region in the drift layer at reverse recovery is mainly dependent on donor distribution in the drift region. Thus, an applied voltage raised within a range below the breakdown voltage of the element eventually increases carriers swept-out into the space charge region by drift even though injection of the minority carriers is lowered. This results in hard recovery.

Another example of the measure for achieving the above trade-off is to provide such a donor distribution that restricts extension of a depletion layer. For example, in a diode shown in FIGS. 3A and 3B (a related device B) that is disclosed in JP-A-8-148699, an n-drift layer 81 is divided into two regions of an n-buffer layer 81a and a constant impurity concentration region 81b. The n-buffer layer 81a on an n-cathode layer 83 side is provided to have low resistivity (high concentration) and the constant impurity concentration region 81 b on a p-anode layer 82 side is provided to have high resitivity (low concentration). This restricts extension of a depletion layer at a voltage equal to or above a certain level.

In a diode shown in FIGS. 4A and 4B (a related device C) that is disclosed in JP-A-8-316500, a structure is provided in which the resitivity decreases gradually toward an n-cathode layer so as to make the diode also perform soft recovery. However, in sweeping out carriers at reverse recovery, with the resitivity being higher on a p-anode layer 92 side, the number of the carriers swept out by drift is sometimes rather increased depending on an operation mode of an application such as a high voltage with a low current. This results in hard recovery.

In a diode shown in FIGS. 5A and 5B (a related device D), which is proposed by the present inventor in unpublished and undisclosed application JP-A-2001-48631, which corresponds to U.S. patent application Ser. No. 10/083,673, the disclosure of which is incorporated herein by reference, an n-buffer layer 61a is provided at about mid-point of an n-drift layer 61. The n-buffer layer 61a has a resitivity lower than that of the n-drift layer 61, and has an impurity concentration and a thickness that make the n-buffer layer 61a itself depleted at reverse recovery. This provides a structure by which extension of a depletion layer is controlled to considerably improve the diode both in soft recovery and in a high-speed operation. In such a structure, however, a phenomenon was observed in which the presence of the n-buffer layer 61a increases a rate-of-rise of voltage dV/dt (a phenomenon of increasing dV/dt near a peak of a reverse recovery voltage). This occurs when a space charge region just reaches the n-buffer layer 61a at reverse recovery. From the view point of noise reduction, this has no merit. Thus, the increase in dV/dt must be suppressed.

FIG. 6 is a diagram showing results of simulations of waveforms about anode to cathode voltages Vak and anode currents Ia at revere recovery in the related semiconductor devices A, B, and D shown in FIGS. 1A and 1B, FIGS. 3A and 3B, and FIGS. 5A and 5B, respectively. FIG. 7, FIG. 8, and FIG. 9 are diagrams each showing results of simulations of variations in time about distributions of concentrations of internal carriers (electrons and holes) and electric field strength at a reverse recovery operation in each of the related device A, B, and D together with an impurity concentration distribution therein. Each distribution is taken to a distance from the surface of the p-anode layer in the direction to the n-cathode layer.

In the related device D of FIGS. 5A and 5B, the n-drift layer 61 is formed as follows. On the side of an n-cathode layer 63, a constant impurity concentration region 61c is formed by epitaxial growth with phosphorus taken as an impurity so that the resistivity becomes 65 Ωcm/52 μm. Next to this, the n-buffer layer 61a having a width of about 5 μm is formed with a dose of phosphorus taken as $2 \times 10^{11}$ cm$^{-2}$. Thereafter, about the side of a p-anode layer 62, a constant impurity concentration region 61b is formed by epitaxial growth so that the resistivity becomes 90 Ωcm/60 μm. The integrated impurity concentration of the n-drift layer 61 is about $1.0 \times 10^{12}$ cm$^{-2}$. The distribution of the impurity concentration in the n-buffer layer 61a is given so as to abruptly rise up to a peak concentration like a pulse. With an averaged concentration over the whole region of the n-drift layer 61 taken as $N_{dm}$, and the peak concentration of the n-buffer layer taken as $N_p$, a ratio of $N_p/N_{dm}$, is given as 20.

As is described in JP-A-2001-48631 (which corresponds to the co-pending application mentioned above) and as is apparent from FIG. 6, the related semiconductor device D of FIGS. 5A and 5B exhibits soft recovery in which oscillation at reverse recovery is inhibited. However, as shown in FIG. 6, the waveform of the reverse recovery voltage Vak for the related device D (shown in dashed line) exhibits an abrupt increase (almost vertical) in the rate-of-change of voltage dV/dt from the time about 0.473 μs. The increase in dV/dt is one of the causes of electromagnetic noise, which needs to be inhibited. As is observed in FIG. 9, a diagram showing results of simulations of variations in time about concentrations of internal carriers (electrons and holes) and electric field strength in the related device D, the space charge region reaches the n-buffer layer 61a at a time between 0.47 μs and 0.475 μs. It is apparent from FIG. 6 that dV/dt is increased during that time. This is a so-called pinning effect of the space charge region (an effect of stopping extension of a depletion region at a buffer layer). By the pinning effect, the spread of the space charge region is stopped at the buffer layer, so that no sweeping out of the carriers by drift occurs any more toward the n-cathode 63 side, causing the current to take hard recovery. However, the presence of the n-buffer layer 61a abruptly increases electric field strength on the side of the p-anode layer 62 to thereby increase dV/dt as shown in FIG. 6.

In the related device A shown in FIGS. 1A and 1B, an n-drift layer 71 (an i layer) is provided by epitaxial growth with the resistivity having 50 Ωcm/117 μm by taking phosphorus as an impurity. The integrated concentration of the donor in the n-drift layer 71 is about $1.1 \times 10^{12}$ cm$^{-2}$. Although not so remarkable as in the related device B shown in FIGS. 3A and 3B, the related device A (shown in dash-dot-dot line) also begins to oscillate at a time of 0.504 μs as shown in FIG. 6. As is observed in FIG. 7, a diagram showing results of simulations of variations in time about concentrations of internal carriers (electrons and holes) and electric field strength in the related device A, the carriers disappear from the time 0.50 μs to the time of 0.52 μs, at which oscillation is started.

In the related device B shown in FIGS. 3A and 3B, an n-drift layer 81 is provided by epitaxial growth with the resistivity made as being 63 Ωcm/70 μm on the side of a p-anode layer 82 and 40 Ωcm/47 μm on the side of an n-cathode layer 83 by taking phosphorus as an impurity. The integrated concentration of the donor in the whole region of the n-drift layer 81 is about $1.1 \times 10^{12}$ cm$^{-2}$. It is observed from FIG. 6 that oscillation of the related device B (shown in dotted line) is started after a peak of the reverse recovery current. As is observed in FIG. 8, a diagram showing results of simulations of variations in time about concentrations of internal carriers (electrons and holes) and electric field strength in the related device B, the carriers disappear when the time goes from 0.49 μs to 0.50 μs, during which oscillation is started as is shown in FIG. 6.

The oscillation at reverse recovery is caused by an abrupt increase in current decreasing rate dir/dt at reverse recovery (i.e. hard recovery). The related device A and related device B perform hard recovery. Thus, there is a need for a semiconductor device and a manufacturing method thereof that inhibits voltage and current oscillations during reverse recovery to achieve enhancement both in high speed and low-loss characteristics and in soft recovery characteristics. The present invention addresses this need

SUMMARY OF THE INVENTION

The present invention relates to a semiconductor device, such as a diode, and a manufacturing method thereof that can achieve high-speed and low-loss, and yet benefit from soft recovery characteristics.

According to one aspect of the present invention, the semiconductor device comprises a first semiconductor layer of a first conduction type, a second semiconductor layer of a second conduction type, and a third semiconductor layer of a first conduction type. The second layer is formed on one principal surface of the first layer with an impurity concentration higher than that of the first layer, and the third layer is formed on the other principal surface of the first layer also with the impurity concentration higher than that of the first semiconductor layer. The first semiconductor layer has an impurity concentration decreasing with an inclination toward each of the second semiconductor layer and the third semiconductor layer.

The first layer can have an impurity concentration that reaches a relative maximum at least at one position in a direction from the second semiconductor layer to the third semiconductor layer. Moreover, the impurity concentration of the first layer can decrease from the position at which the impurity concentration becomes the relative maximum with the impurity concentration thereof decreasing toward each of the second layer and the third layer. The impurity concentration also can decrease with the inclination toward each of the second layer and the third layer to reach each of the second layer and the third layer.

In the first layer, an impurity concentration at an interface with the second layer can be equal to an impurity concentration at an interface with the third semiconductor layer. The impurity concentration at an interface with the third layer can be higher than an impurity concentration at an interface with the second layer.

The maximum impurity concentration $N_p$ in the first semiconductor layer can satisfy a relationship expressed as $1 < N_p/N_{dm} \leq 5$, where $N_{dm}$ is an averaged impurity concentration in the first layer. More specifically, the maximum impurity concentration $N_p$ in the first layer can satisfy a relationship expressed as $1 < N_p/N_{dm} \leq 2$.

An integrated impurity concentration $$\int_{Xc}^{Xd} N_d(X) dX$$

in the first layer, which is in a region between a position nearest to the second layer of positions at each of which the impurity concentration in the first layer can be equal to the averaged impurity concentration $N_{dm}$ and a position nearest to the third layer of the positions at each of which the impurity concentration in the first layer can be equal to the averaged impurity concentration $N_{dm}$, satisfies a relationship expressed as $$\int_{Xc}^{Xd} N_d(X) dX \leq 8 \times 10^{11} / cm^2,$$

where X is a distance from an end of the second layer opposite to the first layer to a position in the first layer in the direction from the second layer to the third layer, $N_d(X)$ is the impurity concentration distribution about the distance X in the first layer in the direction from the second layer to the third layer, Xc is a distance from the end of the second layer opposite to the first layer in the direction from the second layer to the third layer to the position nearest to the second layer of positions at each of which $N_d(X)$ can become $N_d(X)=N_{dm}$, and Xd is a distance from the end of the second layer opposite to the first layer in the direction from the second layer to the third layer to the position nearest to the third layer of the positions at each of which $N_d(X)$ can become $N_d(X)=N_{dm}$.

The integrated impurity concentration $$\int_{Xc}^{Xd} N_d(X) dX$$

in the first layer in the region from the distance Xc to the distance Xd can satisfy a relationship expressed as $$\int_{Xc}^{Xd} N_d(X) dX \leq 6 \times 10^{11} / cm^2.$$

The distance Xp from the end of the second layer opposite to the first layer to a position, at which the impurity concentration in the first layer becomes the maximum in the direction from the second layer to the third layer, can satisfy a relationship expressed as $$0.3 \leq \frac{Xp}{\sqrt{\frac{BV\varepsilon_s}{q\left(\frac{J_F}{qv_{sat}} + N_{dm}\right)}}} \leq 1.7,$$

where BV is a breakdown voltage of a semiconductor element, $\varepsilon_s$ is a semiconductor permittivity, q is the elementary electric charge, $J_F$ is a rated current density of the semiconductor element, $v_{sat}$ is a carrier saturation velocity. More specifically, the distance Xp can satisfy a relationship expressed as $$0.8 \leq \frac{Xp}{\sqrt{\frac{BV\varepsilon_s}{q\left(\frac{J_F}{qv_{sat}} + N_{dm}\right)}}} \leq 1.2.$$

The third layer can have a surface impurity concentration equal to or greater than $1 \times 10^{17}$ cm$^{-3}$, and an integrated impurity concentration in the first layer from the interface with the second layer to the interface with the third layer can be between $8 \times 10^{11}$ cm$^{-2}$ and $2 \times 10^{12}$ cm$^{-2}$. The integrated impurity concentration in the first layer from the interface with the second layer to the interface with the third layer can be between $8 \times 10^{11}$ cm$^{-2}$ and $-1.3 \times 10^{12}$ cm$^{-2}$.

The impurity concentration $N_d(X_j)$ in the first layer at a position of the interface with the second layer, which position is at a distance $X_j$ from the end of the second layer opposite to the first layer in the direction from the second layer to the third layer, can satisfy a relationship expressed as $$\frac{N_d(Xj)}{\left(\frac{5.34 \times 10^{13}}{BV}\right)^{4/3}} \le 1,$$

The impurity concentration can be constant with a specified concentration in a region on each of a side of the second layer and a side of the third layer. The specified impurity concentration made constant on the side of the second semiconductor layer can be equal to that on the side of the third layer. The specified impurity concentration made constant on the side of the third semiconductor layer can be higher than that on the side of the second semiconductor layer.

Positions at boundaries at each of which the impurity concentration decreasing from the maximum concentration can be constant with the specified concentration, with a position on the side of the second layer taken at a distance Xa from an end of the second layer opposite to the first layer in the direction from the second layer to the third layer, and a position on the side of the third layer taken at a distance Xb from the end of the second layer opposite to the first layer in the direction from the second layer to the third layer, an integrated impurity concentration $$\int_{Xa}^{Xb} N_d(X) dX$$

in the first layer in a region from the distance Xa to the distance Xb satisfying a relationship expressed as $$\int_{Xa}^{Xb} N_d(X) dX \le 8 \times 10^{11} / cm^2.$$

The lifetime distribution of minority carriers can become shortest near the interface between the first layer and the second layer, and can become longest in the first layer near the interface between the first layer and the third layer. The efficiency of minority carrier injection into the first layer can be equal to or less than 0.7.

The relative maximum impurity concentration can be located at a plurality of positions in the direction from the second layer to the third layer, and the impurity concentration of the first layer can decrease from each of the positions at each of which the impurity concentration reaches the relative maximum with an inclination toward each of the second layer and the third layer.

Another aspect of the present invention is a method of manufacturing the above-described semiconductor device, where the first layer is epitaxially grown while controlling the impurity concentration during the growth. The method can involve forming the third layer from a semiconductor of the first conduction type, forming the first layer on the third layer by an epitaxial growth to a specified position in a direction opposite to the third layer, while gradually increasing the content of the impurities of the first conduction type, and then by epitaxially growing while gradually decreasing the content of the impurities of the first conduction type, and forming the second layer on the surface of the first layer.

During the epitaxial growth, the content of the impurities of the first conduction type can be made constant. Thereafter, the first layer can be epitaxially grown to a specified second position in the direction opposite to the third layer while gradually increasing the content of the impurities of the first conduction type, thereafter by carrying out epitaxial growth to a specified third position in the direction opposite to the third layer, while gradually decreasing the content of the impurities of the first conduction type, and by epitaxially growing while holding the content of the impurities of the first conduction type constant again. The second semiconductor layer can be form ed by diffusing the impurities of the second conduction type on the surface of a region in which the content of the impurities is made constant in the first semiconductor layer formed by carrying out the epitaxial growth.

The content of the impurities of the first conduction type can be made constant to form a first epitaxial layer, by implanting with impurity ions of the first conduction type on a surface of the first epitaxial layer, and then forming second epitaxial growth on the surface of the first epitaxial layer while holding the content of the impurities of the first conduction type constant to form a second epitaxial layer. The first layer formed with the first and second epitaxial layers can be heat treated to diffuse the ion-implanted impurities into the first and the second epitaxial layers. The second layer can be formed by diffusing the impurities of the second conduction type on the surface of the first layer.

The ion-implanted impurities can be diffused toward the second layer and the third layer to positions respectively reaching the second layer and the third layer. The ion-implanted impurities can be diffused toward the second layer and the third layer to positions respectively apart from the second layer and the third layer.

The third layer can be thinned and a semiconductor layer of a first conduction type with a high impurity concentration can be formed on a surface of the thinned third layer. Impurity ions of the first conduction type can be implanted on the surface of the third layer. The first layer can be formed on the surface of the third layer with epitaxial growth, while holding the content of the impurities of the first conduction type constant. The ion-implanted impurities can be diffused into the first and the third layer with heat treatment. The second layer can be formed by diffusing impurities of the second conduction type on the surface of the first layer. The third layer can be thinned as previously mentioned and a semiconductor layer of a first conduction type with a high impurity concentration can be formed on the surface of the third layer.

The dose of the ion implantation can be equal to or less than $5 \times 10^{11}$ cm$^{-2}$, more specifically, equal to or less than $3 \times 10^{11}$ cm$^{-2}$. The temperature of the heat treatment can be between 1200° C. and 1412° C.

The first layer can be formed on the third layer with epitaxial growth, while holding the content of the impurities of the first conduction type constant. The second layer of the second conduction type can be formed on the surface of the first semiconductor layer. Light ions can be implanted into the first semiconductor layer and penetrating the ions to one of the second layer and the third layer. The formed layers can be heat treated to electrically activate a region implanted with the light ions. The heat treatment can be carried out so that the light ions exist in a direction from the second layer to the third layer up to at least one of positions respectively reaching the second layer and the third layer. The heat treatment also can be carried out so that the light ions exist in a direction from the second layer to the third layer up to positions respectively apart from the second layer and the third layer.

The third layer can be thinned and a semiconductor layer of a first conduction type with a high impurity concentration can be formed on the surface of the thinned third layer.

Alternatively, the first layer can be formed from a semiconductor substrate of a first conduction type. The second layer of a second conduction type can be formed on a first principal surface of the first layer. Light ions can be implanted into the first layer by penetrating one of the first layer and the second layer with light ions. The second principal surface of the first layer can be thinned, and the thinned surface of the first layer can be thinned with impurity ions of the first conduction type. The third layer can be formed by heating treating the ion-implanted layer on the surface of the first layer, and to electrically activate a region implanted with the light ions in the first layer between the second layer and the third layer.

The light ions can exist in a direction from the second layer to the third layer up to positions respectively reaching the second layer and the third layer. The light ions can exist in a direction from the second layer to the third layer up to positions respectively apart from the second layer and the third layer. The light ions can be protons. The amount of the implanted light ions can be between $1\times10^{11}$ cm$^{-2}$ and $1\times10^{14}$ cm$^{-2}$. The temperature of the heat treatment can be between 300° C. and 600° C.

As previously mentioned, the first layer can have an impurity concentration that becomes a relative maximum at a plurality of positions in a direction from the second layer to the third layer, and the impurity concentration of the first layer decreases from the positions at each of which the impurity concentration becomes the relative maximum with an inclination toward each of the second layer and the third layer. Such a structure can be formed by forming the first layer of the first conduction type on the third layer by epitaxial growth, while holding the content of the impurities of the first conduction type constant, and epitaxially growing to a specified position in a direction opposite to the third layer while gradually increasing the content of the impurities of the first conduction type, and then carrying out epitaxial growth while gradually decreasing the content of the impurities from the specified position. The second semiconductor layer can be formed by diffusing impurities of the second conduction type on a surface of the finally formed epitaxial layer. The epitaxial growth can be carried out while stepwisely increasing and decreasing the content of the impurities of the first conduction type to form the plurality of relative maximum positions.

BRIEF DESCRIPTION OF THE DRAWINGS

FIG. 1A is a cross sectional view showing a principal part of a related device A.

FIG. 1B is a view showing an impurity concentration distribution in the related device A shown in FIG. 1A.

FIG. 2 is a perspective view showing a principal part of an MPS diode.

FIG. 12A is a cross sectional view showing a principal part of a first example of the semiconductor device according to the present invention.

FIG. 12B is a view showing an impurity concentration distribution in the semiconductor device shown in FIG. 12A.

FIG. 13A is a cross sectional view showing a principal part of a second example of the semiconductor device according to the present invention.

FIG. 13B is a view showing an impurity concentration distribution in the semiconductor device shown in FIG. 13A.

FIG. 38A is a cross sectional view showing a principal part of a sixth example of the semiconductor device according to the present invention.

FIG. 38B is a view showing an impurity concentration distribution in the semiconductor device shown in FIG. 38A.

FIG. 39A is a cross sectional view showing a principal part of a seventh example of the semiconductor device according to the present invention.

FIG. 39B is a view showing an impurity concentration distribution in the semiconductor device shown in FIG. 39A.

FIG. 40A is a cross sectional view showing a principal part of an eighth example of the semiconductor device according to the present invention.

FIG. 40B is a view showing an impurity concentration distribution in the semiconductor device shown in FIG. 40A.

FIG. 41A is a cross sectional view showing a principal part of a planer gate structure of a MOSFET as a ninth example of the semiconductor device according to the present invention.

FIG. 41B is a cross sectional view showing a principal part of a trench gate structure of a MOSFET as a ninth example of the semiconductor device according to the present invention.

FIG. 41C is a view showing an impurity concentration distribution in the MOSFET shown in each of FIG. 41A and FIG. 41B.

FIG. 43A is a cross sectional view showing a principal part of an eleventh example of the semiconductor device according to the present invention.

FIG. 43B is a view showing an impurity concentration distribution in the semiconductor device shown in FIG. 43A.

FIG. 46A is a cross sectional view showing a principal part of the semiconductor device in a finished state in the manufacturing method as the twelfth example according to the present invention.

FIG. 46B is a view schematically showing an impurity concentration distribution in the semiconductor device shown in FIG. 46A.

FIG. 47 is a cross sectional view showing a principal part of a semiconductor device in a state of a bulk wafer in a manufacturing method of a semiconductor device as a thirteenth example according to the present invention.

FIG. 48 is a cross sectional view showing a principal part of a semiconductor device in the manufacturing step subsequent to that shown in FIG. 47 in which a first epitaxial layer is formed on the bulk wafer.

FIG. 52A is a cross sectional view showing a principal part of a semiconductor device in a finished state in the manufacturing method as the thirteenth example according to the present invention.

FIG. 52B is a view schematically showing an impurity concentration distribution in the semiconductor device shown in FIG. 52A.

FIG. 53 is a cross sectional view showing a principal part of a semiconductor device in a state of a bulk wafer in a manufacturing method of a semiconductor device as a fourteenth example according to the present invention.

FIG. 54A is a cross sectional view showing a principal part of a semiconductor device in the manufacturing step subsequent to that shown in FIG. 53 in which an epitaxial layer is formed on the bulk wafer.

FIG. 54B is a view schematically showing an impurity concentration distribution in the semiconductor device in the manufacturing step shown in FIG. 54A.

FIG. 58A is a cross sectional view showing a principal part of a semiconductor device in a finished state in the manufacturing method as the fourteenth example according to the present invention.

FIG. 58B is a view schematically showing an impurity concentration distribution in the semiconductor device shown in FIG. 58A.

FIG. 59 is a cross sectional view showing a principal part of a semiconductor device in a state of a bulk wafer in a manufacturing method of a semiconductor device as a fifteenth example according to the present invention.

FIG. 60 is a cross sectional view showing a principal part of a semiconductor device in the manufacturing step subsequent to that shown in FIG. 59 in which a first epitaxial layer is formed on the bulk wafer.

FIG. 61 is a cross sectional view showing a principal part of a semiconductor device in the manufacturing step subsequent to that shown in FIG. 60 in which ion implantation with impurity ions is carried out onto the first epitaxial layer.

FIG. 65A is a cross sectional view showing a principal part of a semiconductor device in a finished state in the manufacturing method as the fifteenth example according to the present invention.

FIG. 65B is a view schematically showing an impurity concentration distribution in the semiconductor device shown in FIG. 65A.

FIG. 66 is a cross sectional view showing a principal part of a semiconductor device in a state of a bulk wafer in a manufacturing method of a semiconductor device as a sixteenth example according to the present invention.

FIG. 67A is a cross sectional view showing a principal part of a semiconductor device in the manufacturing step subsequent to that shown in FIG. 66 in which an epitaxial layer is formed on the bulk wafer.

FIG. 67B is a view schematically showing an impurity concentration distribution in the semiconductor device in the manufacturing step shown in FIG. 67A.

FIG. 72A is a cross sectional view showing a principal part of a semiconductor device in the manufacturing step subsequent to that shown in FIG. 71 in which a p-anode layer and an anode electrode are formed on the bulk wafer.

FIG. 72B is a view schematically showing an impurity concentration distribution in the semiconductor device in the manufacturing step shown in FIG. 72A.

FIG. 73A is a cross sectional view showing a principal part of a semiconductor device in the manufacturing step subsequent to that shown in FIG. 72A in which light ion irradiation is carried out.

FIG. 73B is a view schematically showing an impurity concentration distribution in the semiconductor device in the manufacturing step shown in FIG. 73A.

FIG. 74A is a cross sectional view showing a principal part of a semiconductor device in the manufacturing step subsequent to that shown in FIG. 73A in which the bulk wafer is thinned.

FIG. 74B is a view schematically showing an impurity concentration distribution in the semiconductor device in the manufacturing step shown in FIG. 74A.

FIG. 75A is a cross sectional view showing a principal part of a semiconductor device in the manufacturing step subsequent to that shown in FIG. 74A in which ion implantation with impurity ions is carried out onto the thinned bulk wafer.

FIG. 75B is a view schematically showing an impurity concentration distribution in the semiconductor device in the manufacturing step shown in FIG. 75A.

FIG. 76A is a cross sectional view showing a principal part of a semiconductor device in a finished state in the manufacturing method as the seventeenth example according to the present invention.

FIG. 76B is a view schematically showing an impurity concentration distribution in the semiconductor device shown in FIG. 76A.

FIG. 77 is a cross sectional view showing a principal part of a semiconductor device in a state of a bulk wafer in a manufacturing method of a semiconductor device as a eighteenth example according to the present invention.

FIG. 78 is a cross sectional view showing a principal part of a semiconductor device in the manufacturing step subsequent to that shown in FIG. 77 in which ion implantation with impurity ions is carried out onto the bulk wafer.

Figure 78:
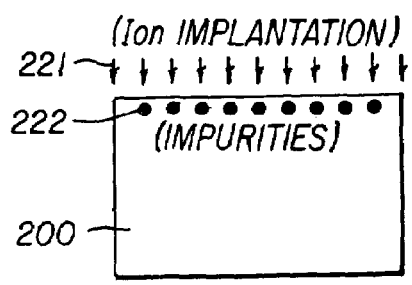
Figure 79:
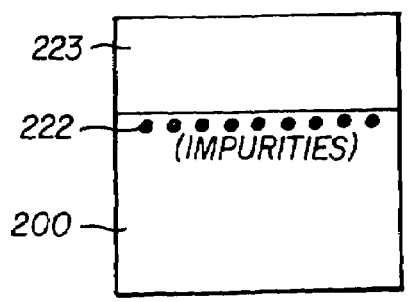

FIG. 79 is a cross sectional view showing a principal part of a semiconductor device in the manufacturing step subsequent to that shown in FIG. 78 in which a second epitaxial layer is formed on the ion-implanted bulk wafer.

FIG. 80A is a cross sectional view showing a principal part of a semiconductor device in the manufacturing step subsequent to that shown in FIG. 79 in which thermal diffusion of impurities has been carried out.

FIG. 80B is a view schematically showing an impurity concentration distribution in the semiconductor device in the manufacturing step shown in FIG. 80A.

FIG. 81A is a cross sectional view showing a principal part of a semiconductor device in the manufacturing step subsequent to that shown in FIG. 80A in which a p-anode layer and an anode electrode are formed on the second epitaxial layer.

FIG. 81B is a view schematically showing an impurity concentration distribution in the semiconductor device in the manufacturing step shown in FIG. 81 A.

FIG. 82A is a cross sectional view showing a principal part of a semiconductor device in a finished state in the manufacturing method as the eighteenth example according to the present invention.

FIG. 82B is a view schematically showing an impurity concentration distribution in the semiconductor device shown in FIG. 82A.

Figure 83A:
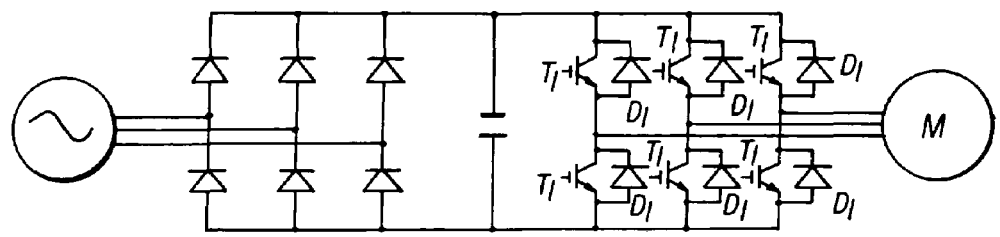

FIG. 83A is a circuit diagram showing a circuit of an AC to AC inverter/converter using the semiconductor device according to the present invention as a free wheeling diode in each of switching sections.

Figure 83B:
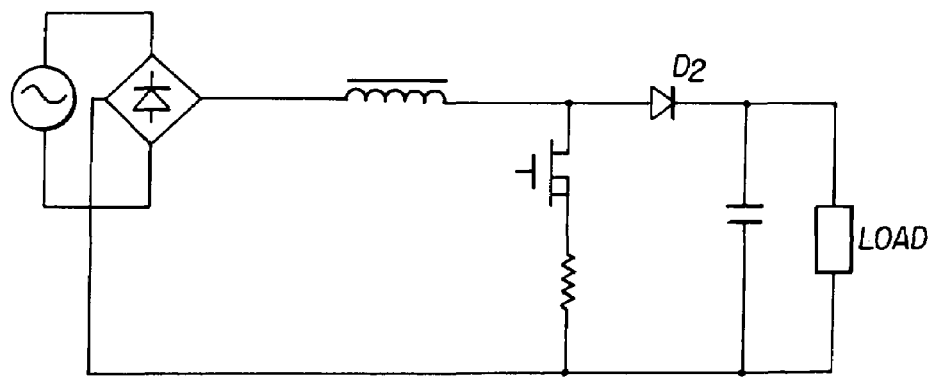

FIG. 83B is a circuit diagram showing a power factor correction circuit using the semiconductor device according to the present invention as a diode in a chopper circuit.

Figures 42A, 42B:
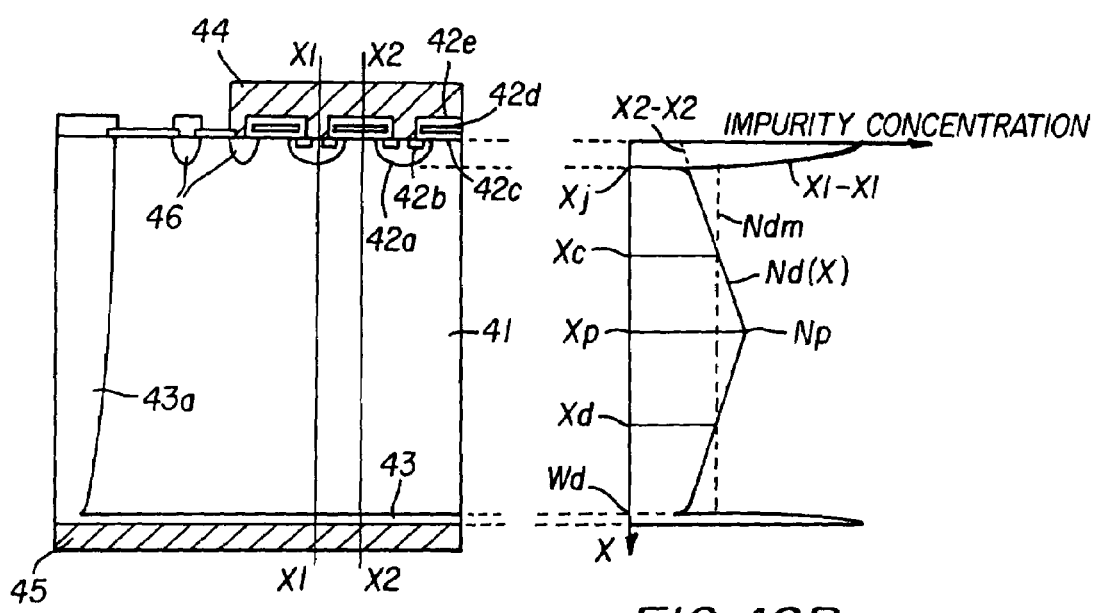
FIG. 42A is a cross sectional view showing a principal part of a tenth example of the semiconductor device according to the present invention.
FIG. 42B is a view showing an impurity concentration distribution in the semiconductor device shown in FIG. 42A.
Figure 83C:
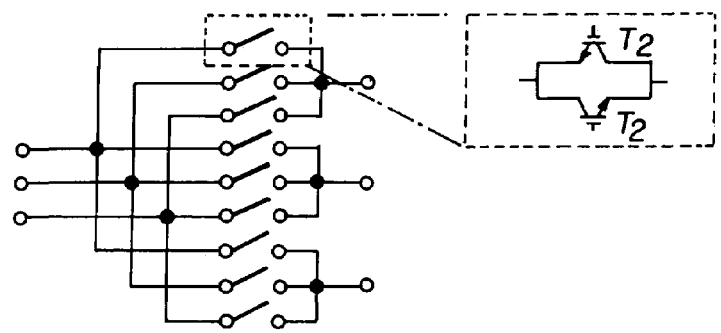

FIG. 83C is a circuit diagram showing a circuit of a direct AC to AC conversion matrix converter using the tenth example of the semiconductor device shown in FIGS. 42A and 42B.

Figure 84:
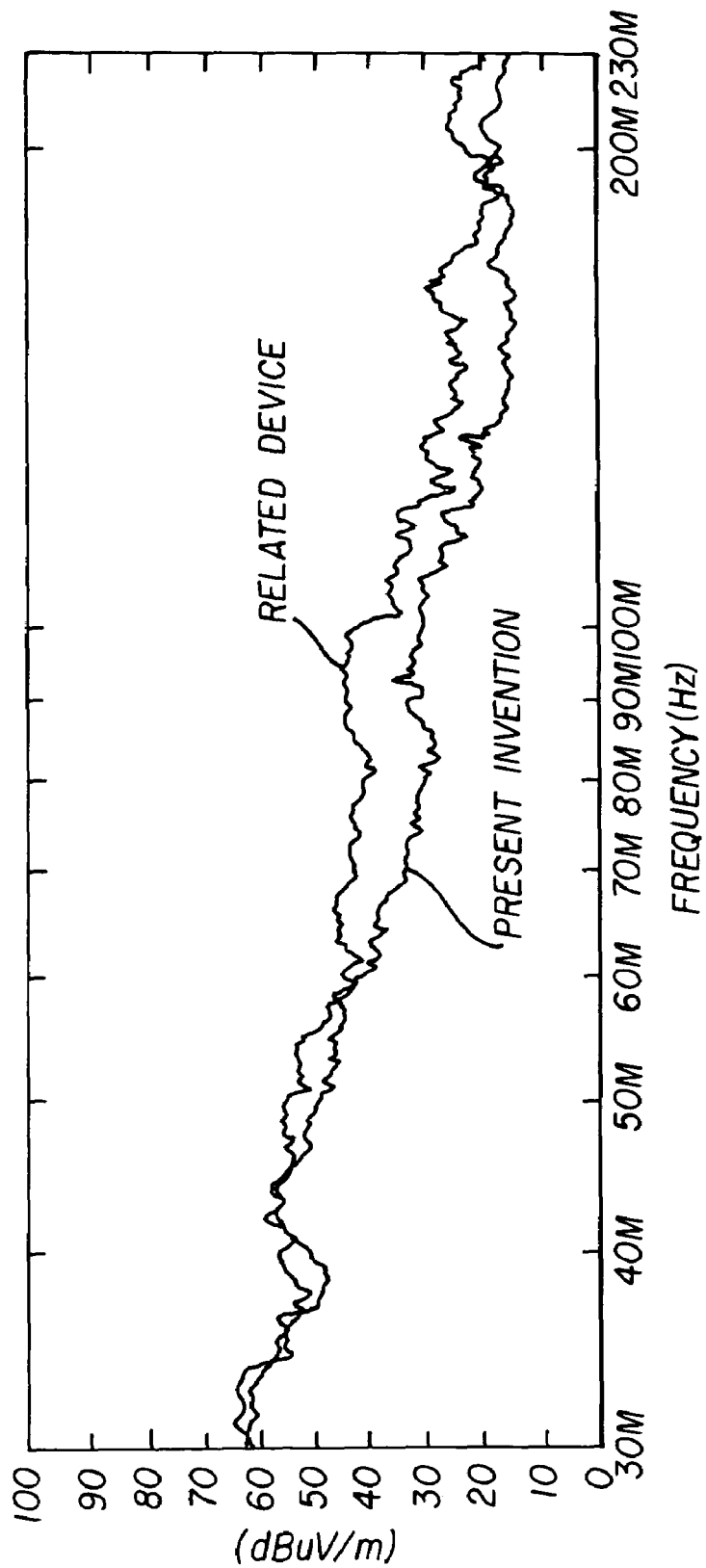

FIG. 84 is a diagram showing a result of measurement of radiated electromagnetic noise when the device according to the present invention is applied to the AC to AC inverter/converter shown in FIG. 83A.

Figure 85:
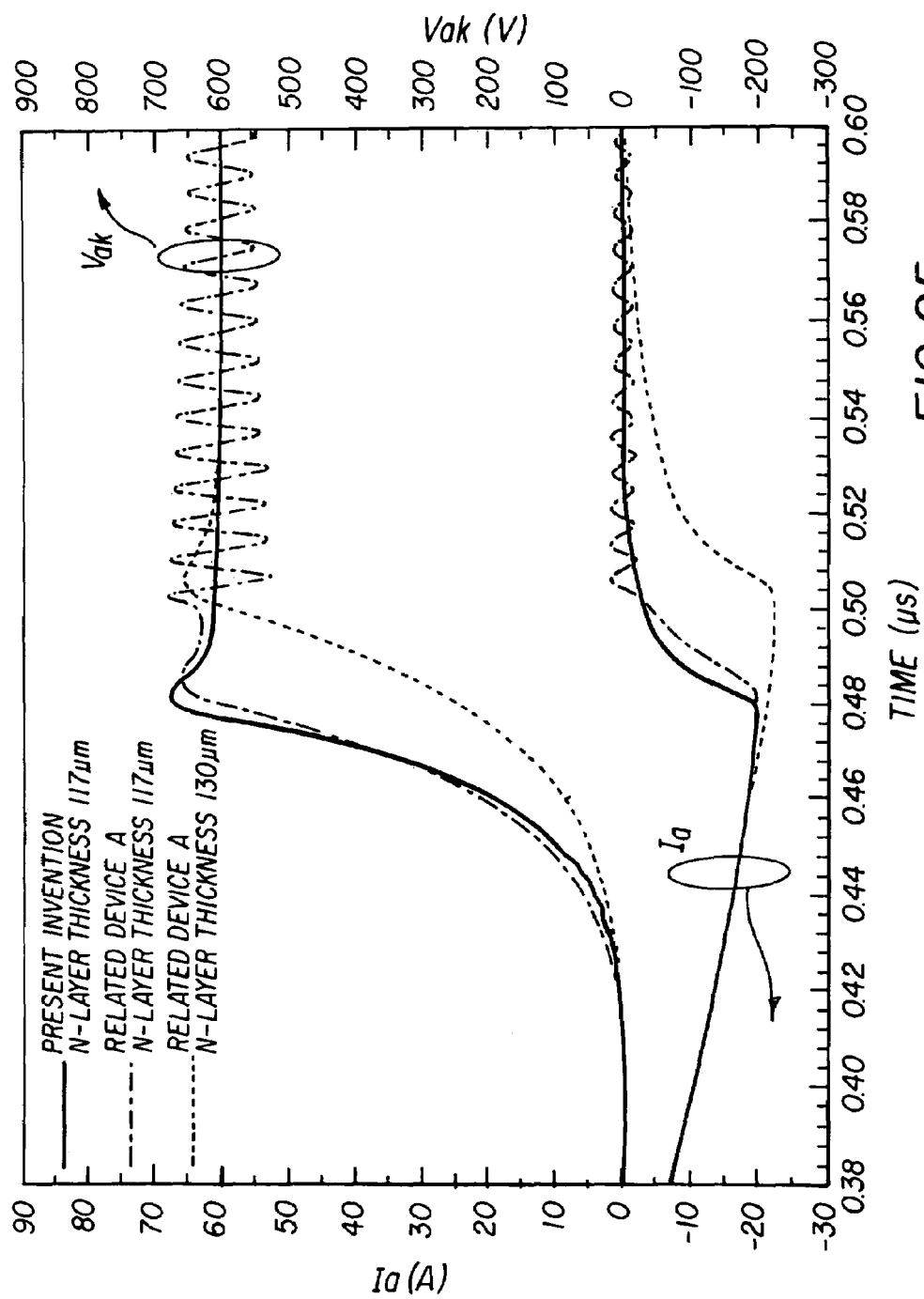

FIG. 85 is a diagram showing respective waveforms in reverse recovery in the semiconductor device according to the present invention (the total n⁻-layer thickness of 117 µm), the related device A (the same of 117 µm), and the related device A with the total n⁻-layer thickness of 130 µm.

DESCRIPTION

FIG. 12A is a cross sectional view showing a principal part of a first example of the semiconductor device according to the present invention and FIG. 12B is a view showing an impurity concentration distribution in the semiconductor device shown in FIG. 12A. The surface structure of the semiconductor device is the same as that of an ordinary p-i-n diode with a p-anode layer formed on the whole surface of an active region. In the above figures, an explanation will be made with reference to a drawing showing a cross section of only the active region, on an outer circumference of which there are provided voltage withstanding structures such as a guard ring, a field plate, and a RESURF (Reduced Surface Electric Field). On an end of the outer circumference of the surface on the anode side, there is provided a stopper region of a p-type region, on the surface of which there is provided a stopper electrode. The stopper region makes no depletion layer reach the end of the periphery, so that there is no particular problem even though an n-drift layer 1 is exposed on the side face of the outer circumference of a chip as the semiconductor device. Therefore, no particular treatment is necessary at the side end of the chip after dicing.

In the semiconductor device shown in FIG. 12A, a p-anode layer 2 is formed on one side of the n-drift layer 1 and an n-cathode layer 3 is formed on the other side. An anode electrode 4 and a cathode electrode 5 are formed on the p-anode layer 2 and the n-cathode layer 3, respectively. The impurity concentration in the n-drift layer 1 is made to peak near the center at a position at a distance Xp from the end of the p-anode layer 2 opposite to the n-drift layer 1 in a direction from the p-anode layer 2 to the n-cathode layer 3, as shown in FIG. 12B and to gradually decrease from the position of the peak toward each of the p-anode layer 2 side and the n-cathode layer 3 side.

As shown in FIG. 12B, the n-drift layer 1 is formed so that a concentration of donors, i.e., the impurity concentration $N_d(X)$ at a position at a distance X from the end of the p-anode layer 2 opposite to the n-drift layer 1 in the direction from the p-anode layer 2 to the n-cathode layer 3, has the maximum concentration at the position at the distance Xp in the n-drift layer 1, and gradually decreases from the position at the distance Xp toward each of the anode electrode 4 and the cathode electrode 5. The reduction of the impurity concentration can be in either a monotone decreasing continuous function or a succession of monotone decreasing stepwise functions with small decrements. With an interface between the p-anode layer 2 and the anode electrode 4 taken as an origin (0), a distance from the origin to an interface (unction) of the p-anode layer 2 and the n-drift layer 1 taken as $X_j$, a distance from the origin to an interface (unction) of the n-cathode layer 3 and the n-drift layer 1 taken as $W_d$, an averaged concentration $N_{dm}$, for which the impurity concentration $N_d(X)$ is integrated from $X_j$ to $W_d$ and then divided by $W_d - X_j$, is expressed as $$N_{dm} = \frac{1}{Wd - Xj} \int_{Xj}^{Wd} Nd(X) dX.$$

The impurity concentration $N_d(X)$ becomes equal to $N_{dm}$ at two positions whose respective distances from the end of the p-anode layer 2 opposite to the n-drift layer 1 can be set as Xc and Xd. A region between the distances Xc and Xd becomes an effective n-buffer layer (effective n-buffer layer 1a). Moreover, with an impurity concentration at the interface between the p-anode layer 2 and the n-drift layer 1 taken as N1 and an impurity concentration at the interface between the n-cathode layer 3 and the n-drift layer 1 taken as N1, the impurity concentrations are to be provided so as to become N1≦N2.

The n-drift layer 1 is formed by epitaxial growth with the impurity concentration in the layer adjusted by adjusting a flow rate of a gas containing phosphorus supplied during the process of the epitaxial growth. The change in the gas flow rate in a monotone continuous function in time provides a smooth impurity concentration distribution. While, the change in a stepwise function with small increments or decrements in time provides an impurity concentration distribution changing stepwise with small increments or decrements. Moreover, the position (distance Xp) of the peak in the impurity concentration distribution can be at any of positions at the center of the n-drift layer 1, to the p-anode layer 2, and to the n-cathode layer 3. The integrated donor concentration in the n-drift layer is to be of the order of $1.0 \times 10^{12}$ cm⁻².

FIG. 13A is a cross sectional view showing a principal part of a second example of the semiconductor device according to the present invention and FIG. 13B is a view showing an impurity concentration distribution in the semiconductor device shown in FIG. 13A. The surface structure of the semiconductor device is the same as that of the device shown in FIG. 12A.

The semiconductor device shown in FIG. 13A differs from the device shown in FIG. 12A in presence of regions (constant impurity concentration layers 10b and 10c) in which the impurity concentration in an n-drift layer 10 becomes constant near a p-anode layer 2 and near an n-cathode layer 3, respectively.

In the semiconductor device shown in FIG. 13A, the impurity concentration in an n-drift layer 10 is made constant in the vicinity of interfaces where the n-drift layer 10 is in contact with the p-anode layer 2 and the n-cathode layer 3, respectively. The impurity concentration is made gradually increased toward the vicinity of the center in the n-drift layer 10 from the constant low impurity concentration to peak near the center at a position at a distance Xp from the end of the p-anode layer 2 opposite to the n-drift layer 10 in a direction from the p-anode layer 2 to the n-cathode layer 3. A region in which the impurity concentration is increased is taken as an n-buffer layer 10a.

The impurity concentration $N_d(X)$, at a position at a distance X from the end of the p-anode layer 2 opposite to the n-drift layer 10 in the direction from the p-anode layer 2 to the n-cathode layer 3 in the n-buffer layer 10a, has the maximum concentration at a position at the distance Xp and gradually decreases from Xp toward each of the anode electrode 4 and the cathode electrode 5. The n-buffer layer 10a is adjacent to regions (constant impurity concentration layers 10b and 10c) at positions at respective distances Xa and Xb in the direction from the p-anode layer 2 to the n-cathode layer 3 in which regions the impurity concentration in the n-drift layer 10 becomes low and constant.

The distribution of the impurity concentration in the n-buffer layer 10A, as was explained about FIG. 12B, can be in either a monotone continuous function or a succession of monotone stepwise functions with small decrements. Moreover, the position (distance Xp), at which the impurity concentration distribution in the n-buffer layer 10a has the peak, can be at any position to the p-anode layer 2 and that to the n-cathode layer 3 as was explained about FIG. 12B. The peak, however, is positioned near the center of the n-buffer layer 10a.

Furthermore, by making $X_a - X_j$ smaller than a half (less than a half) of $W_d - X_j$ (a thickness of the n-drift layer 10), a depletion layer is made to reach the n-buffer layer 10a, having a higher impurity concentration than the n-drift layer 10, under a lower voltage. This facilitates ensuring soft recovery effect, so that the n-buffer layer 10a is well formed to the p-anode layer 2 from the center of the n-drift layer 10. In addition, the impurity distributions as shown in FIG. 12B and FIG. 13B can be combined. The combination is performed so that an arrangement is provided in which an n-buffer layer having a gradually decreasing impurity concentration is positioned on either the p-anode layer side or the n-cathode layer side with a constant impurity concentration layer provided only on the other side. Even with such an arrangement, a similar effect can be obtained.

Figure 14:
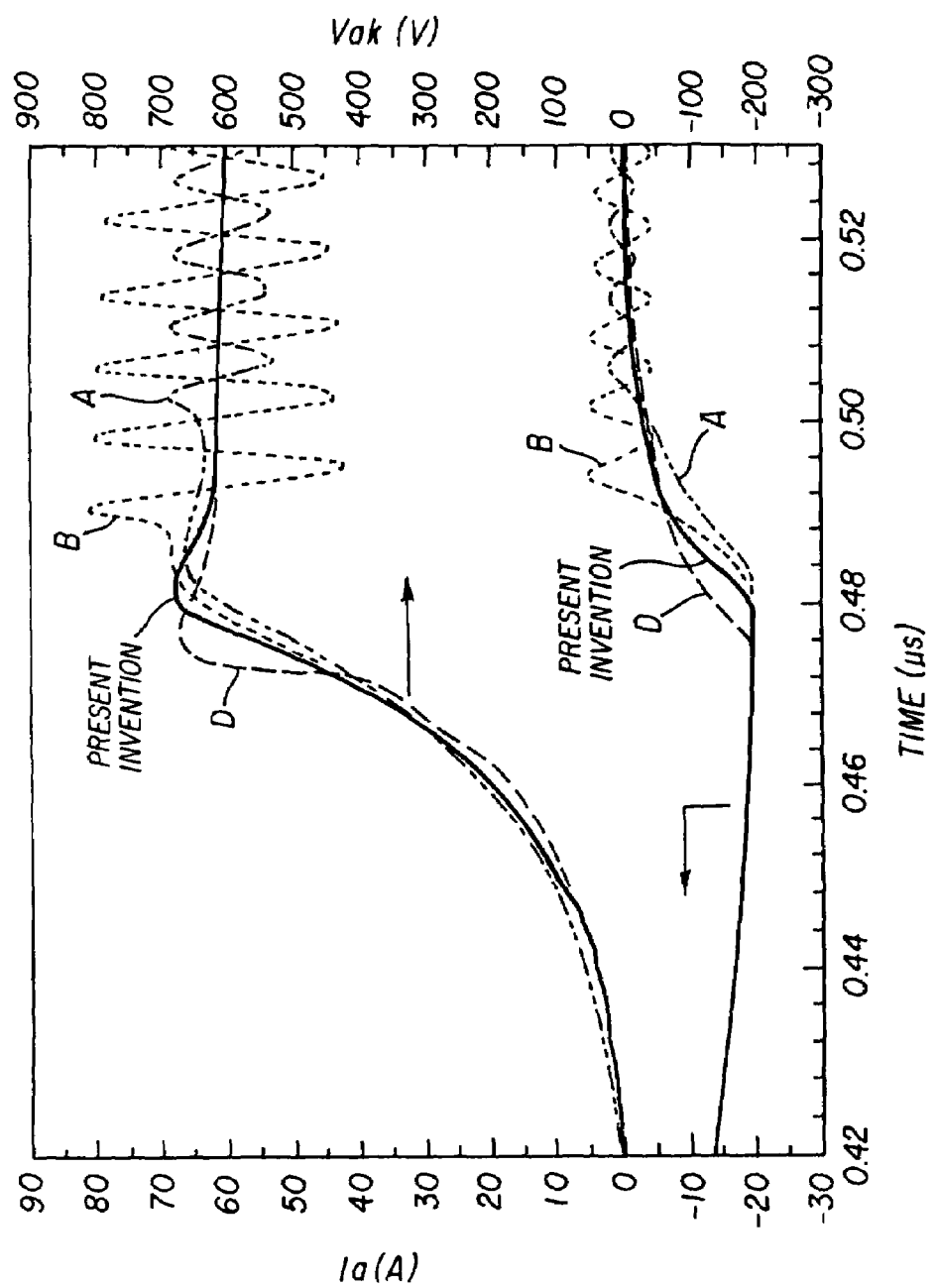
FIG. 14 is a diagram showing a comparison of reverse recovery waveforms of an anode to cathode voltage Vak and an anode current Ia of the first example of the semiconductor device according to the present invention with those of related devices A, B, and D.

FIG. 14 is a diagram showing a comparison of reverse recovery waveforms of an anode current and an anode-cathode voltage of the device according to the present invention with those of related devices A, B, and D. The device according to the present invention explained in the following is the first example of the semiconductor device shown in FIGS. 12A and 12B. In FIG. 14, Ia represents an anode current and Vak represents an anode-cathode voltage. Although the voltage generated in the reverse recovery process is a reverse voltage, the reverse voltage is presented here as a positive voltage for convenience in presentation, which is reversed in polarity from the actual waveform. In each of the above-described related devices A and B, oscillation is observed in each of reverse recovery voltages and reverse recovery currents. Contrary to this, oscillation is inhibited in the device according to the present invention. The related device D, although no oscillation is caused therein, exhibits large dV/dt near the peak of the voltage. The device according to the present invention, however, exhibits suppressed dV/dt. That is, in the device according to the present invention, dV/dt is suppressed and an oscillation is inhibited.

Figure 15:
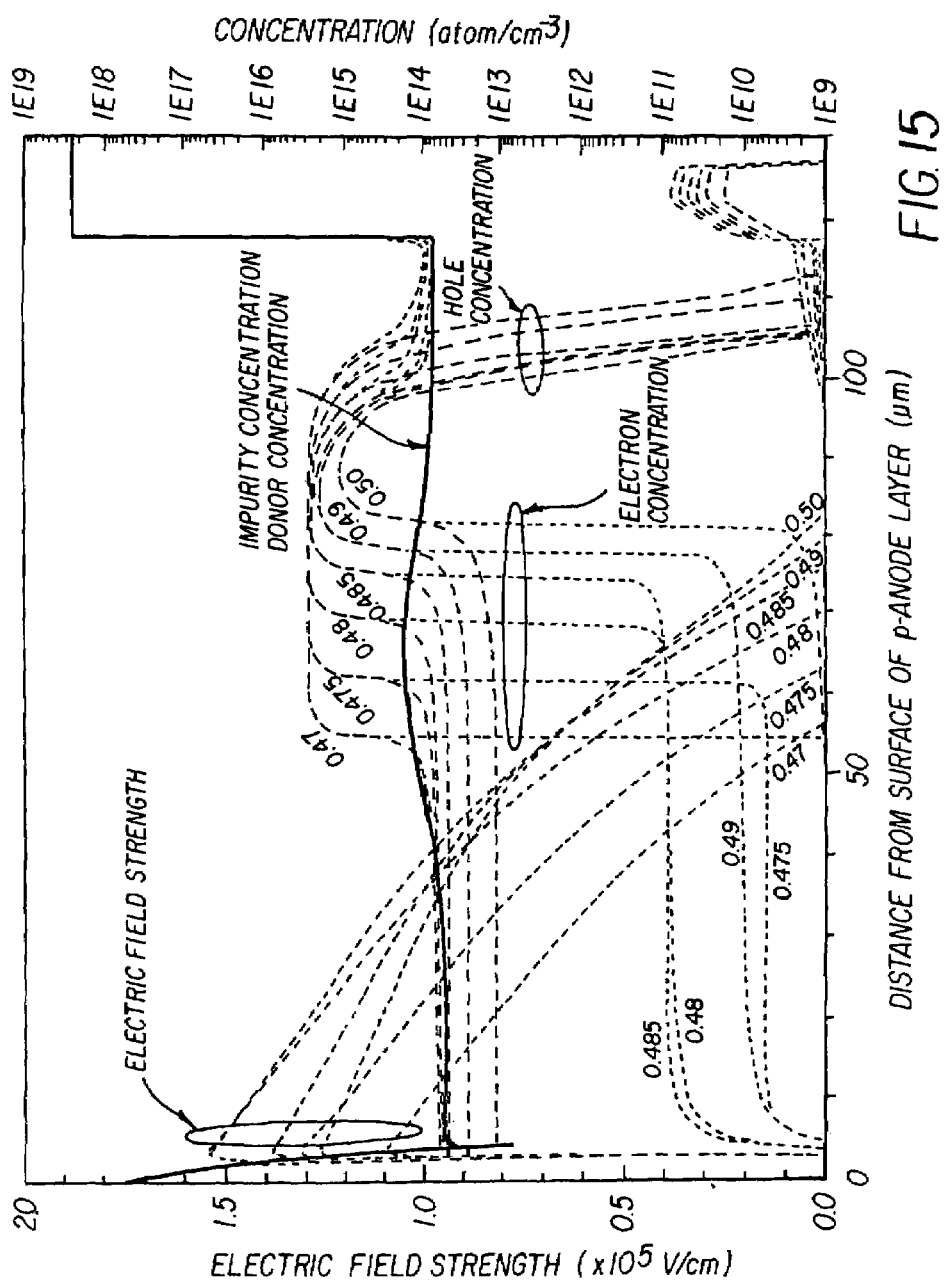
FIG. 15 is a diagram showing variations in time about distributions of electron concentration, hole concentration, and electric field strength in the reverse recovery process shown in FIG. 14 in the first example of the device according to the present invention together with an impurity (donor) concentration distribution therein, each taken to a distance from the surface of the p-anode layer.

FIG. 15 is a diagram showing variations in time about distributions of electron concentration, hole concentration, and electric field strength in the reverse recovery process shown in FIG. 14 in the first example of the device according to the present invention together with an impurity (donor) concentration distribution therein. Each distribution is taken to the distance from the surface of the p-anode layer in the direction to the n-cathode layer. Numerical values from 0.47 to 0.50 in the diagram are times (in μs) corresponding to those represented on the horizontal axis in FIG. 14.

In the device according to the present invention, sufficient carriers remain on the n-cathode layer 3 side even after the time of 0.50 μs. This shows that the anode current Ia is inhibited from oscillating to make the device perform soft recovery. Moreover, unlike the related device D, the device exhibits smooth electric field strength distributions even before and after the time of 0.475 μs. This shows that there is caused no pinning effect (stopping of the depletion layer extension) of the space charge region. Therefore, the device performs soft recovery, yet suppressing an increase in dV/dt.

Here, the value of the averaged impurity concentration $N_{dm}$ of the n-drift layer 1 in the device according to the invention is obtained by dividing the above integrated donor concentration by a width of the n-drift layer 1 to be about $8 \times 10^{13}$ cm$^{-3}$. The donor concentration (i.e. impurity concentration) with the averaged value is obtained at two positions as shown in FIG. 12B. The integrated impurity concentration between the two positions (respective distances Xc and Xd) is to be given as the integrated impurity concentration of the effective n-buffer layer 1a (hereinafter referred to as the effective buffer integrated impurity concentration) with a value of about $5 \times 10^{11}$ cm$^{-2}$. The value is approximately equal to the integrated impurity concentration of the n-buffer layer of the later described related device D. This provides sufficient effect of the soft recovery for inhibiting oscillations in reverse recovery voltage and current.

Figure 16:
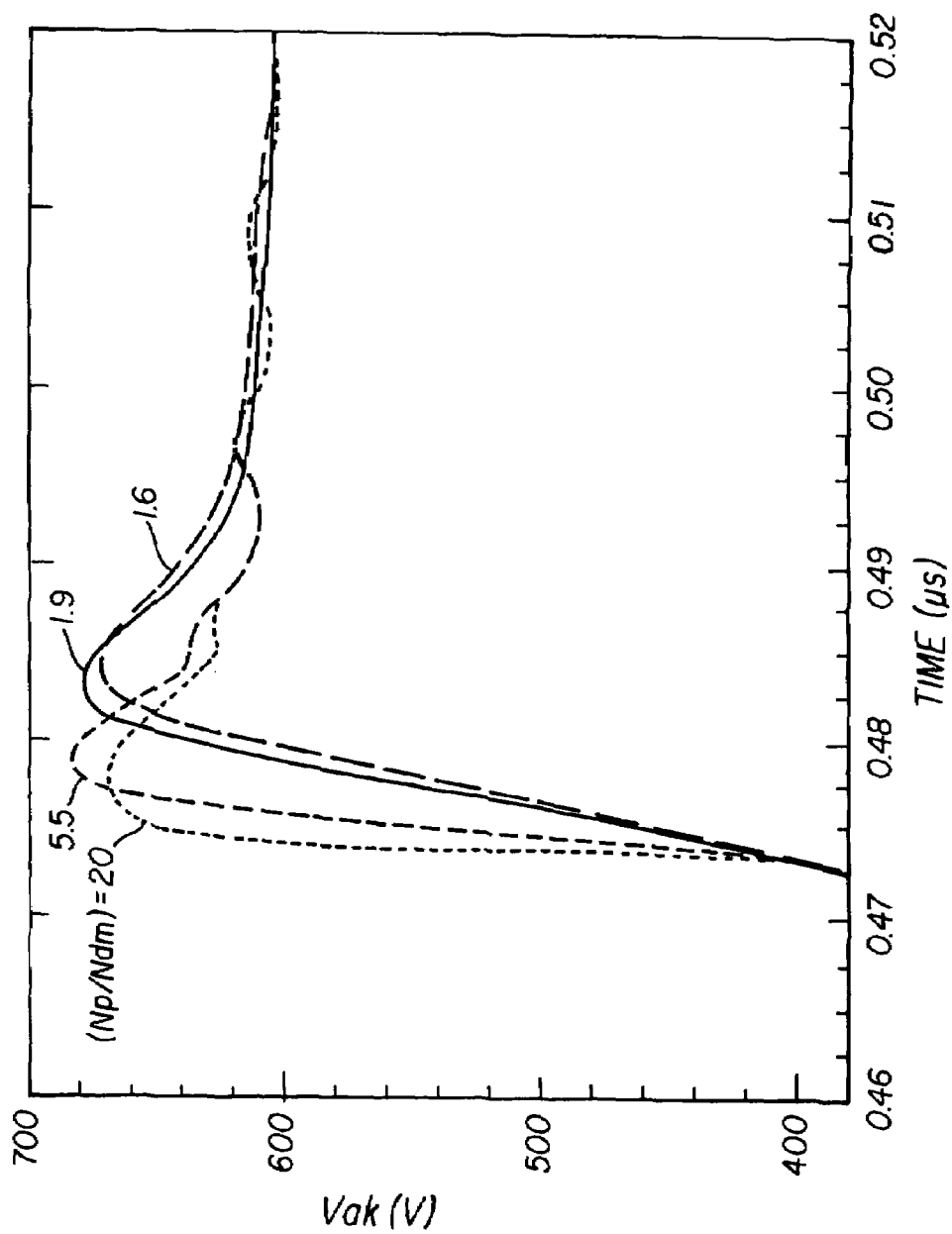
FIG. 16 is a diagram showing waveforms of reverse recovery voltages with $N_p/N_{dm}$ taken as a parameter.

FIG. 16 is a diagram showing waveforms of reverse recovery voltages with $N_p/N_{dm}$ taken as a parameter. The effect of suppressing dV/dt near the peak of the reverse recovery voltage depends on $N_p/N_{dm}$, a ratio of the maximum impurity concentration $N_p$ of the n-drift layer 1 to the averaged impurity concentration $N_{dm}$ thereof as shown in FIG. 16. As $N_p/N_{dm}$ becomes small, dV/dt is reduced. Moreover, the pinning effect (an effect of stopping spread of a depletion layer) becomes higher as the maximum impurity concentration $N_p$ in the n-drift layer 1 becomes higher than the averaged impurity concentration $N_{dm}$.

The reason of this can be explained as follows. As the impurity concentration in the n-buffer layer 1 becomes higher, suppression of entrance of the depletion layer (=space charge region) into the n-buffer layer 1 is further enhanced. Therefore, when the space charge region reaches the n-buffer layer 1 while a voltage is increasing, a voltage increment δV is carried only by a portion of the n-drift layer 1 on the p-anode layer 2 side in which portion the impurity concentration is made low (resitivity is made high). This causes an abrupt increase in an electric field strength of the portion, by which dV/dt is increased. Thus, by restricting the maximum impurity concentration $N_p$ in the n-drift layer 1 (n-buffer layer 1a), dV/dt can be suppressed. Therefore, in the device according to the present invention, the oscillation, which would be caused after the peak of the reverse recovery current, is inhibited to lower dV/dt near the peak of the reverse recovery voltage.

Figure 17:
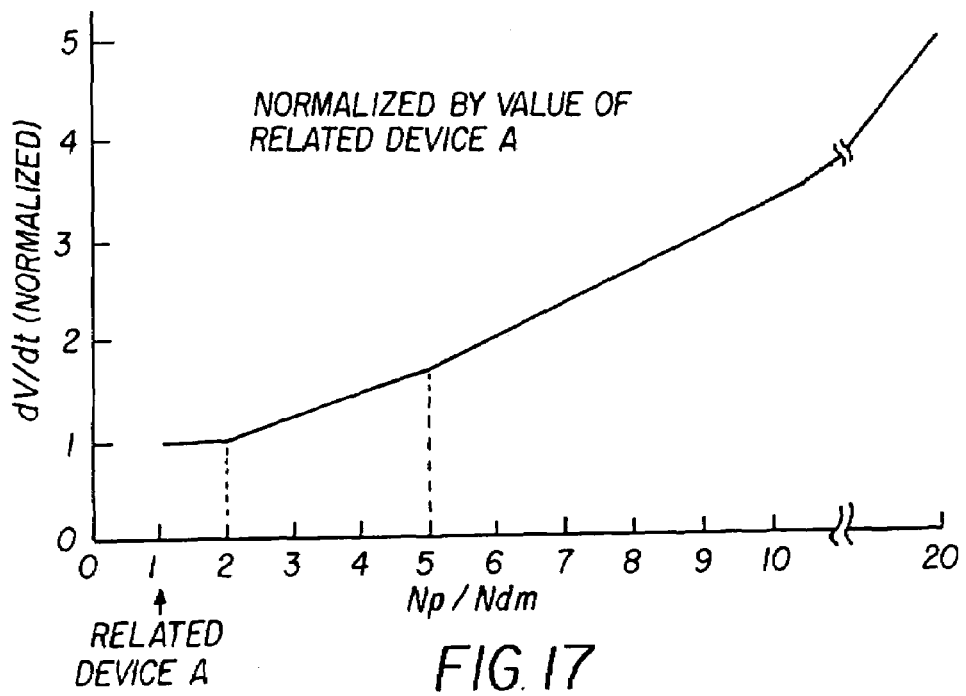
FIG. 17 is a diagram showing a relationship between $N_p/N_{dm}$, a ratio of the maximum impurity concentration $N_p$ in the n-drift layer 1 (n-buffer layer 1a) to the averaged impurity concentration $N_{dm}$, and dV/dt in the device according to the present invention.

FIG. 17 is a diagram showing a relationship between $N_p/N_{dm}$, a ratio of the maximum impurity concentration $N_p$ in the n-drift layer 1 (n-buffer layer 1a) to the averaged impurity concentration $N_{dm}$, and dV/dt in the device according to the present invention. The value of dV/dt is normalized by the value of the related device A. As shown in FIG. 17, for $N_p/N_{dm}$ smaller than 5, dV/dt becomes smaller than twice that of the related device A. For $N_p/N_{dm}$ smaller than 2, dV/dt becomes approximately equal to that of the related device A. Therefore, the ratio $N_p/N_{dm}$ equal to or smaller than 2 is preferable. This of course causes no oscillation to exhibit smaller dV/dt than the related device D where $N_p/N_{dm}$ is 20. The related device A, although exhibits small dV/dt as described in the foregoing, causes oscillation of the reverse recovery voltage and current.

Figure 18:
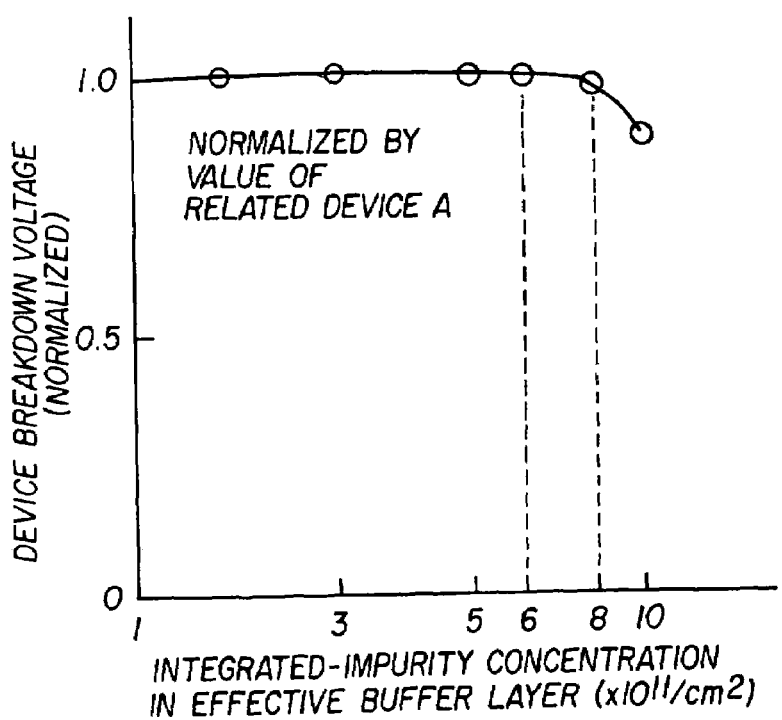
FIG. 18 is a diagram showing dependence of a device breakdown voltage on an integrated impurity concentration of the effective buffer layer in the device according to the present invention.

FIG. 18 is a diagram showing dependence of a device breakdown voltage on an integrated impurity concentration in the effective buffer layer in the device according to the present invention. The device breakdown voltage is normalized by the breakdown voltage of the related device A. The horizontal axis represents the integrated impurity concentration in the effective buffer layer. A decrement in an electric field strength between arbitrary two positions (a gradient of electric field strength), which are in the direction from the p-anode layer 2 side to the n-cathode layer 3 side in the n-drift layer 1 including the n-buffer layer 1a, is determined by a difference in the integrated impurity concentration between the two positions. Therefore, the value of the difference in the integrated impurity concentration must be adjusted for reducing the gradient of electric field strength so as not to degrade the breakdown voltage. As shown in FIG. 18, it is known that the integrated impurity concentration of the effective buffer layer exceeding $8 \times 10^{11}$ cm$^{-2}$ increases decrement in breakdown voltage. Further, it is shown that the integrated impurity concentration of the effective buffer layer being as much as $6 \times 10^{11}$ cm$^{-2}$ causes no reduction in breakdown voltage. Therefore, the integrated impurity concentration of the effective buffer layer is made equal to or less than $8 \times 10^{11}$ cm$^{-2}$, or preferably equal to or less than $6 \times 10^{11}$ cm$^{-2}$.

Figure 7:
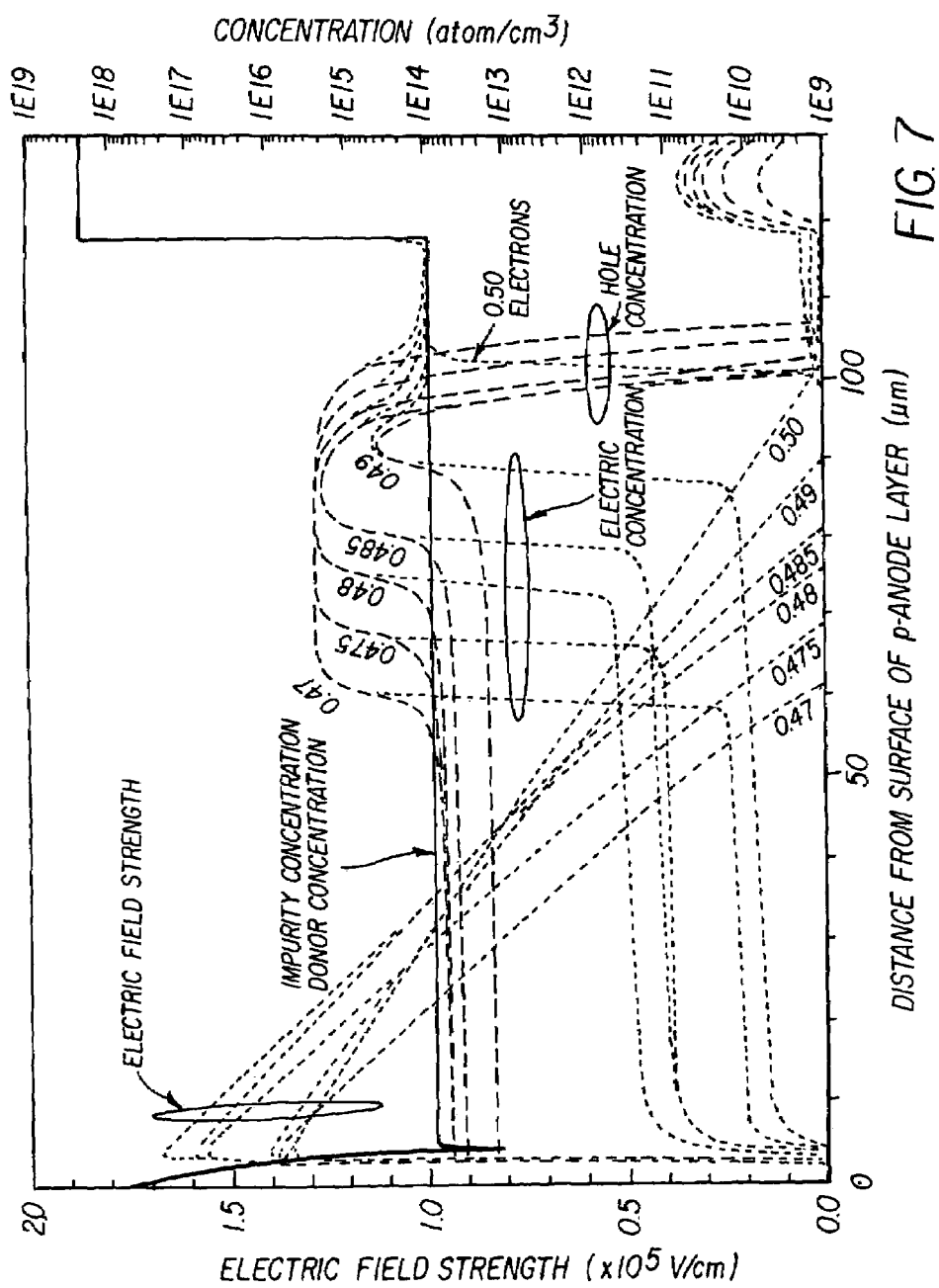
FIG. 7 is a diagram showing results of simulations of variations in time about distributions of concentrations of internal carriers (electrons and holes) and electric field strength at a reverse recovery operation in the related device A together with an impurity concentration distribution therein, each taken to a distance from the surface of the p-anode layer.
Figure 8:
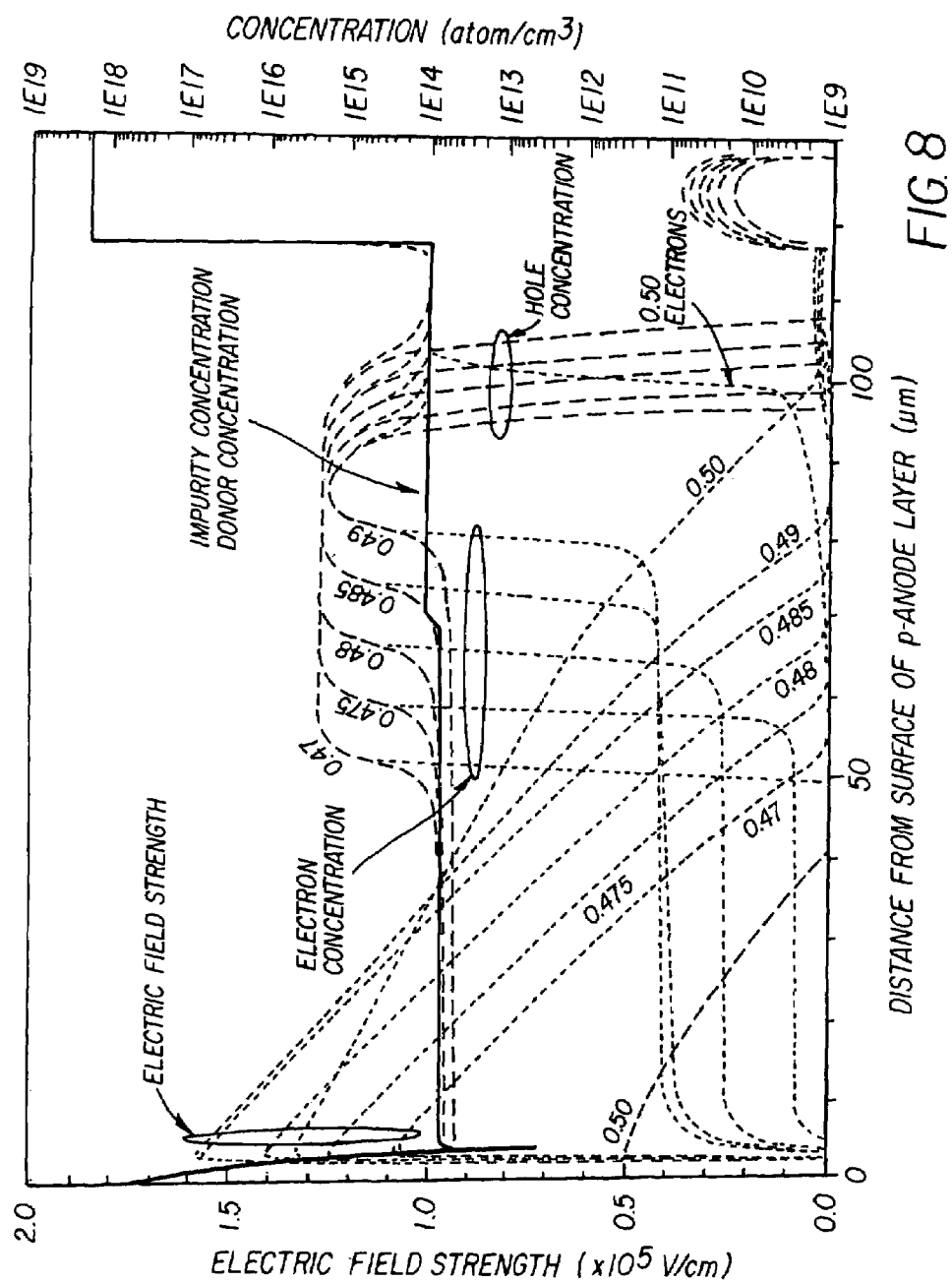
FIG. 8 is a diagram showing results of simulations of variations in time about distributions of concentrations of internal carriers (electrons and holes) and electric field strength at a reverse recovery operation in the related device B together with an impurity concentration distribution therein, each taken to a distance from the surface of the p-anode layer.
Figure 9:
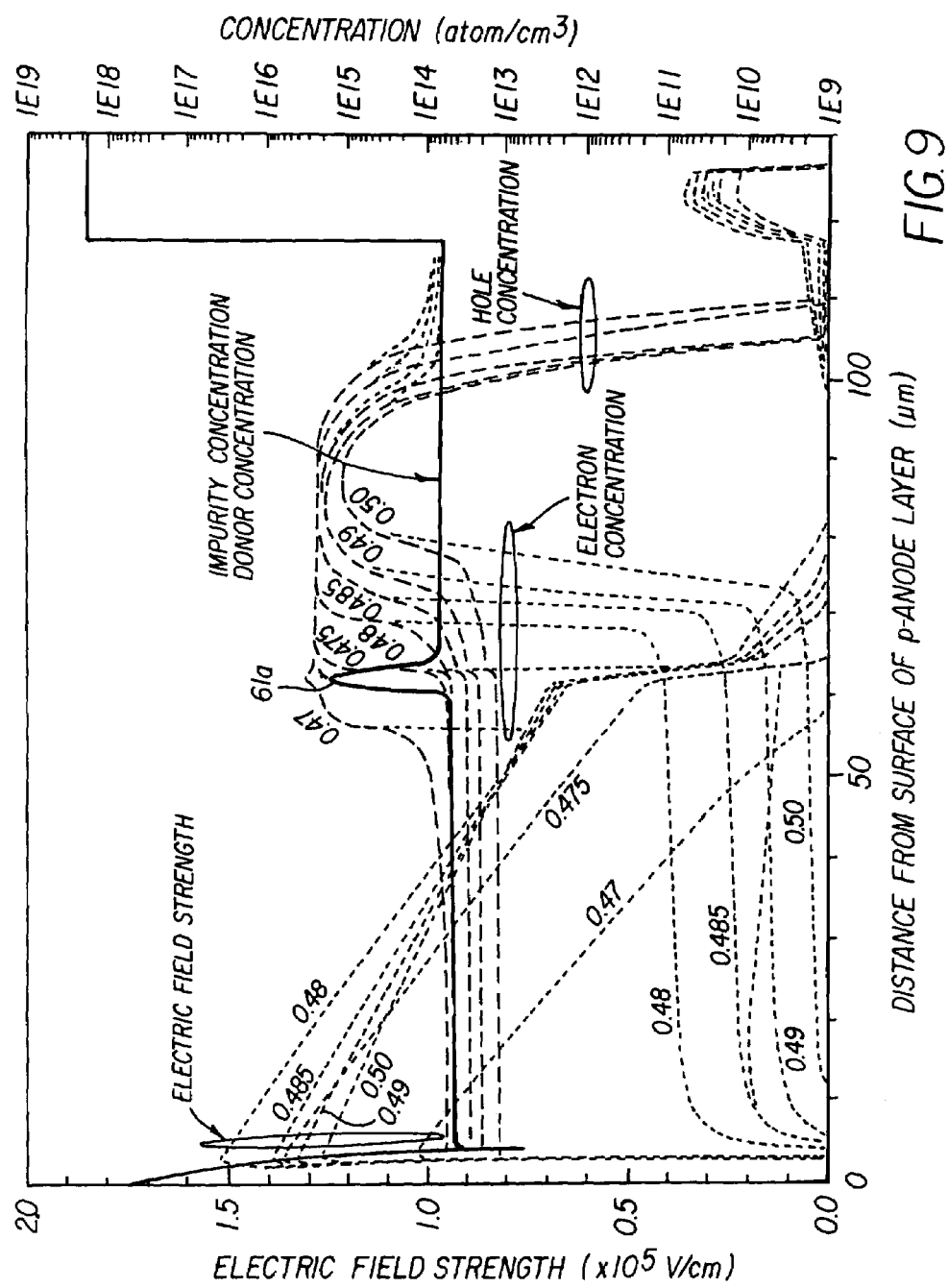
FIG. 9 is a diagram showing results of simulations of variations in time about distributions of concentrations of internal carriers (electrons and holes) and electric field strength at a reverse recovery operation in the related device D together with an impurity concentration distribution therein, each taken to a distance from the surface of the p-anode layer.
Figure 22A:
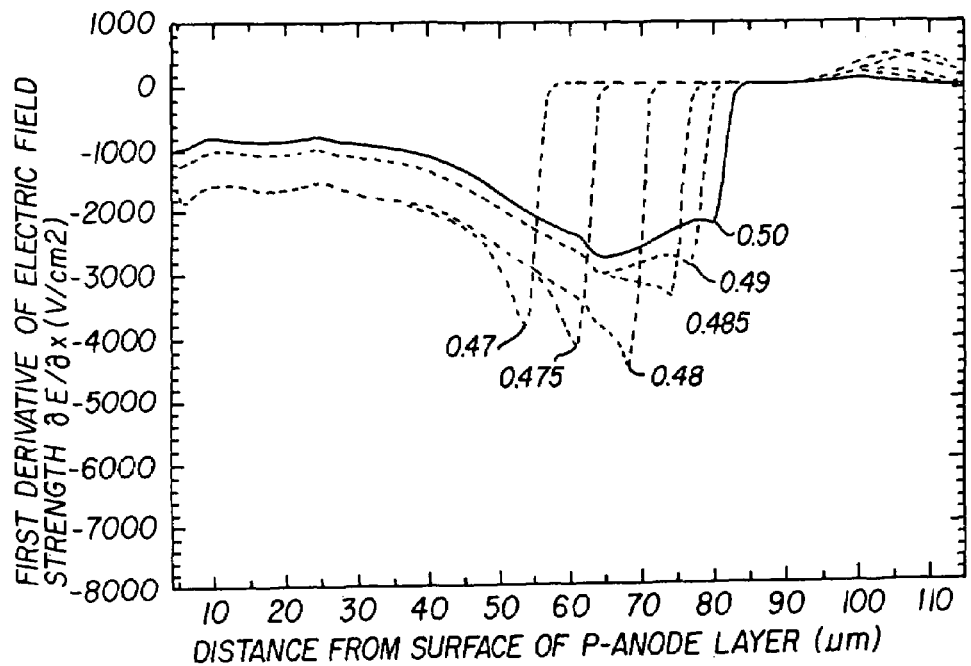
FIGS. 22A and 22B are diagrams showing first derivatives of the electric field strength distributions in the device according to the present invention shown in FIG. 15 and second derivatives thereof, respectively.

FIG. 19A, FIG. 20A, FIG. 21A, and FIG. 22A are diagrams showing first derivatives of the electric field strength distributions shown in FIG. 7, those shown in FIG. 8, those shown in FIG. 9, and those shown in FIG. 15, respectively. Moreover, FIG. 19B, FIG. 20B, FIG. 21B, and FIG. 22B are diagrams showing second derivatives of electric field strength distributions shown in FIG. 7, those shown in FIG. 8, those shown in FIG. 9, and those shown in FIG. 15, respectively. In the case of the device according to the present invention shown in FIG. 15, at each of the times t=0.47 to 0.50 μs, a gradient of the distribution of the electric field strength E is not constant but becomes steeper in a region nearer to the n-cathode layer. Namely, as shown in FIG. 22A, a region in which $\partial E/\partial X$ is not constant (about 30 to 80 μm) is broader than a region in which $\partial E/\partial X$ is constant (10 to 30 μm).

In the case of the related device D shown in FIG. 9, the buffer layer is so narrow as to be about 10 μm with the position of X=60 μm at the center. As a result, $\partial E/\partial X$ shown in FIG. 21A has a constant value up to a position of about 50 μm and then becomes larger than $\partial E/\partial X$ in the device according to the present invention in the buffer layer (at about 60 μm). This shows that the space charge region is strongly stopped there. Therefore, although no oscillation occurs due to presence of the buffer layer, there is an increase in dV/dt.

Figure 19A:
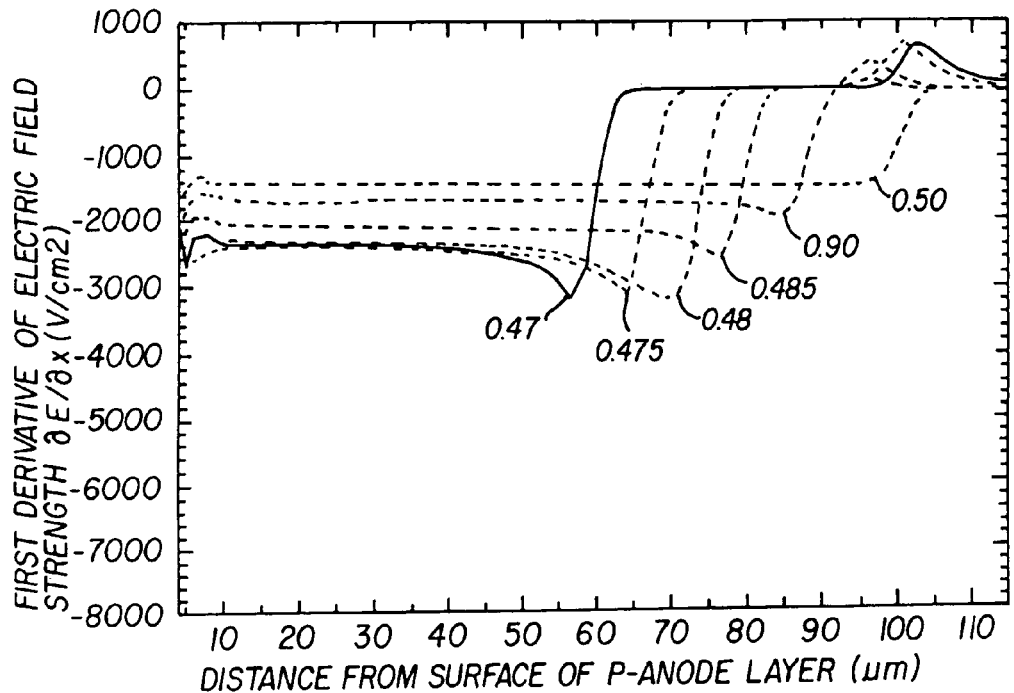
FIGS. 19A and 19B are diagrams showing first derivatives of the electric field strength distributions in the related device A shown in FIG. 7 and second derivatives thereof, respectively.
Figure 19B:
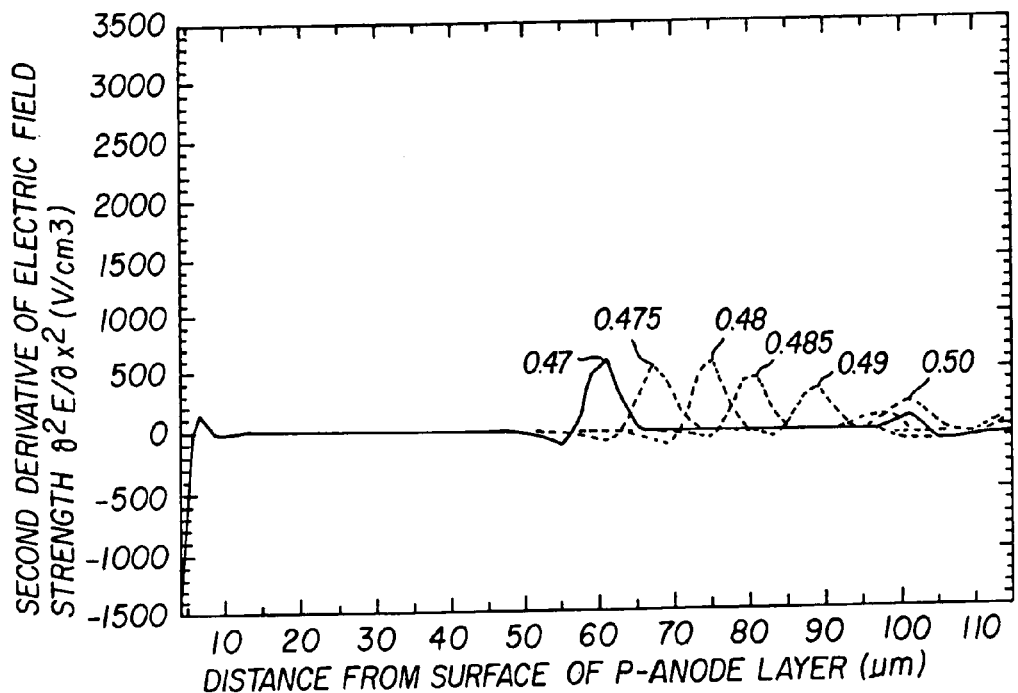

In the case of the related device A shown in FIG. 7, the impurity concentration distribution is uniform, so that the gradient of the electric field strength $\partial E/\partial X$ is constant as shown in FIG. 19A.

Figure 20A:
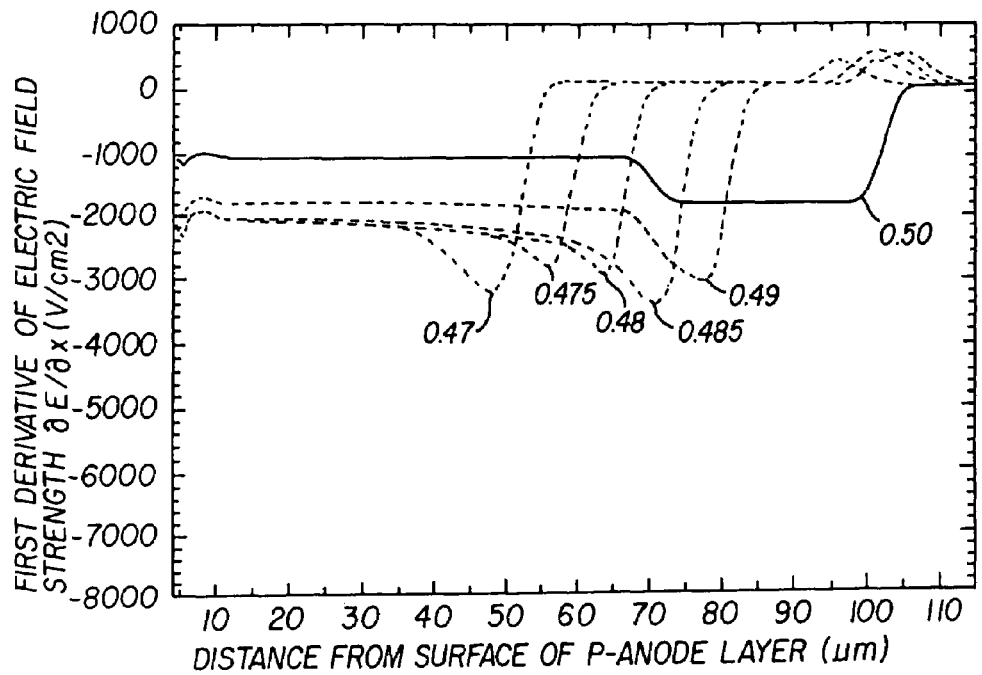
FIGS. 20A and 20B are diagrams showing first derivatives of the electric field strength distributions in the related device B shown in FIG. 8 and second derivatives thereof, respectively.
Figure 20B:
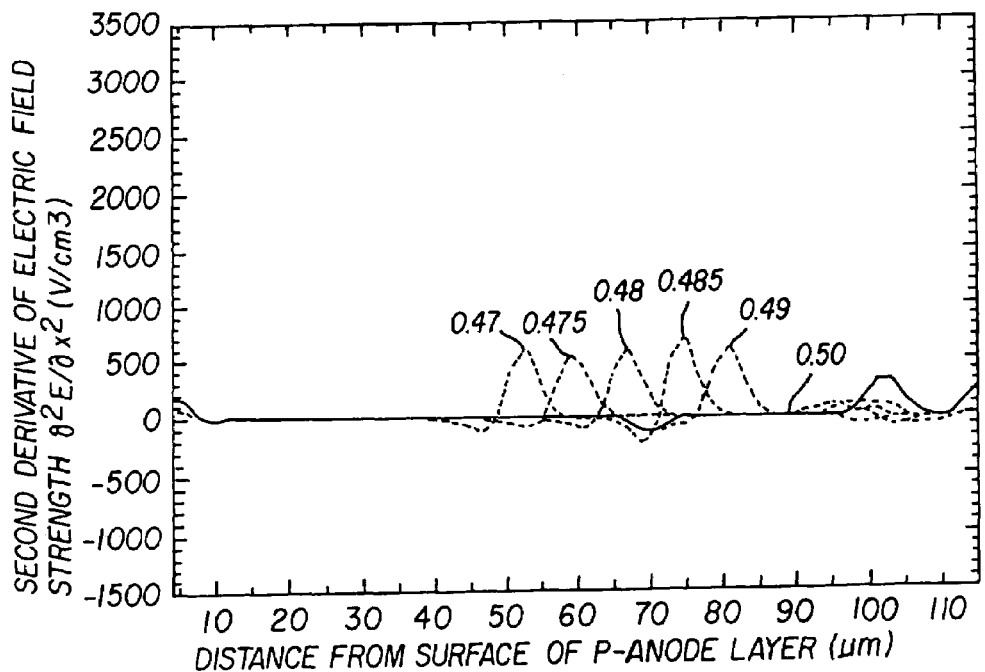
Figure 21A:
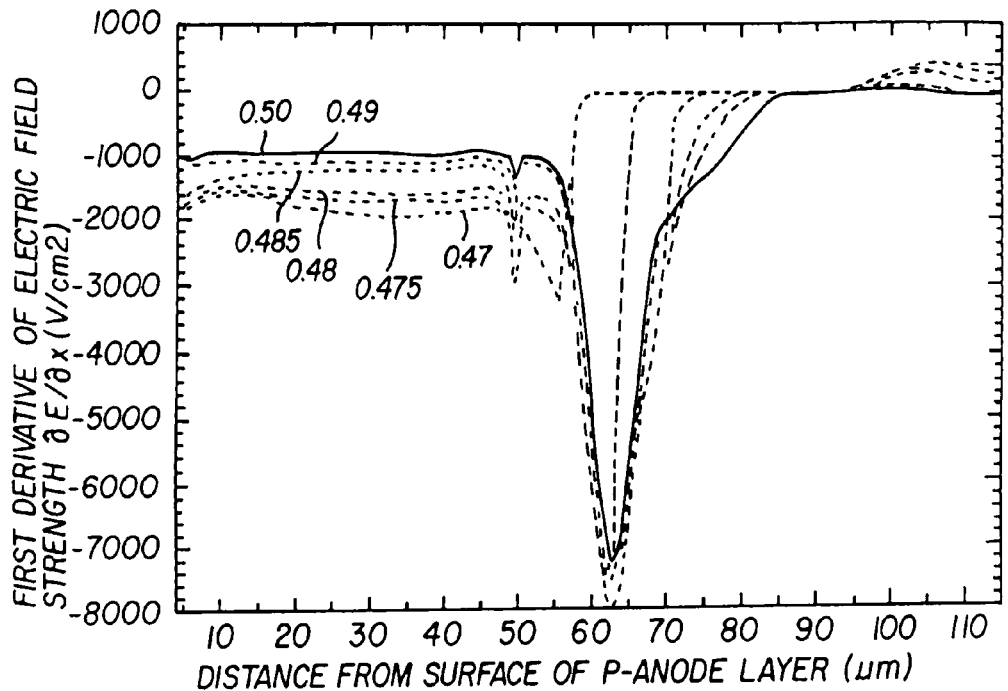
FIGS. 21A and 21B are diagrams showing first derivatives of the electric field strength distributions in the related device D shown in FIG. 9 and second derivatives thereof, respectively.
Figure 21B:
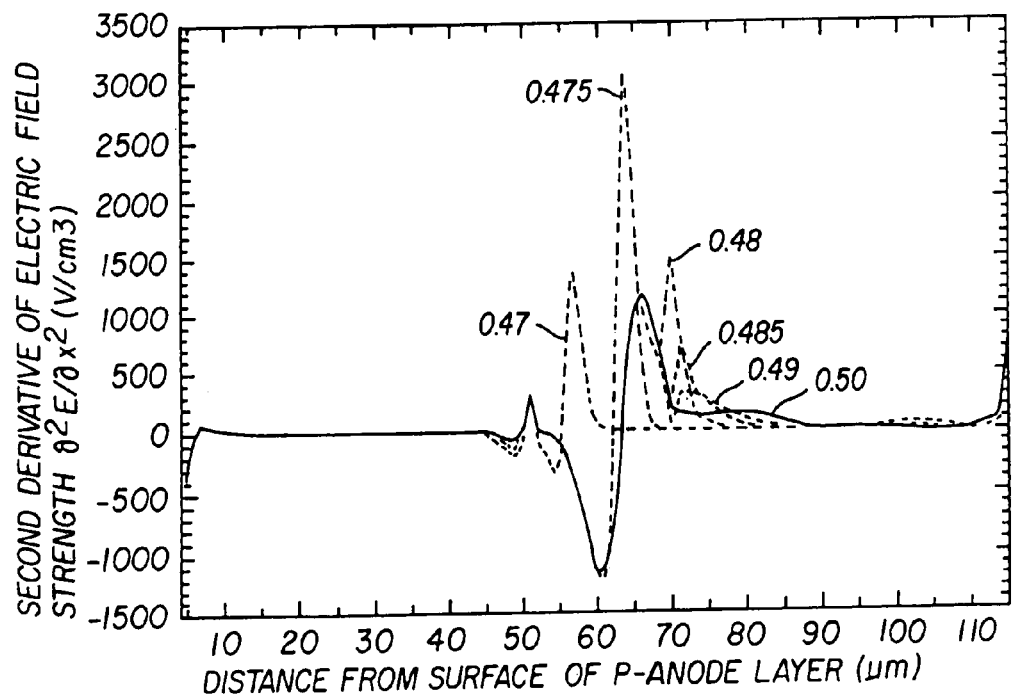

In the case of the related device B shown in FIG. 8, the impurity concentration becomes high at a distance from the surface of the p-anode layer larger than 70 μm. However, as shown in FIG. 20A, it is known that $\partial E/\partial X$ is constant in each of regions before and after 70 μm.

Figure 22B:
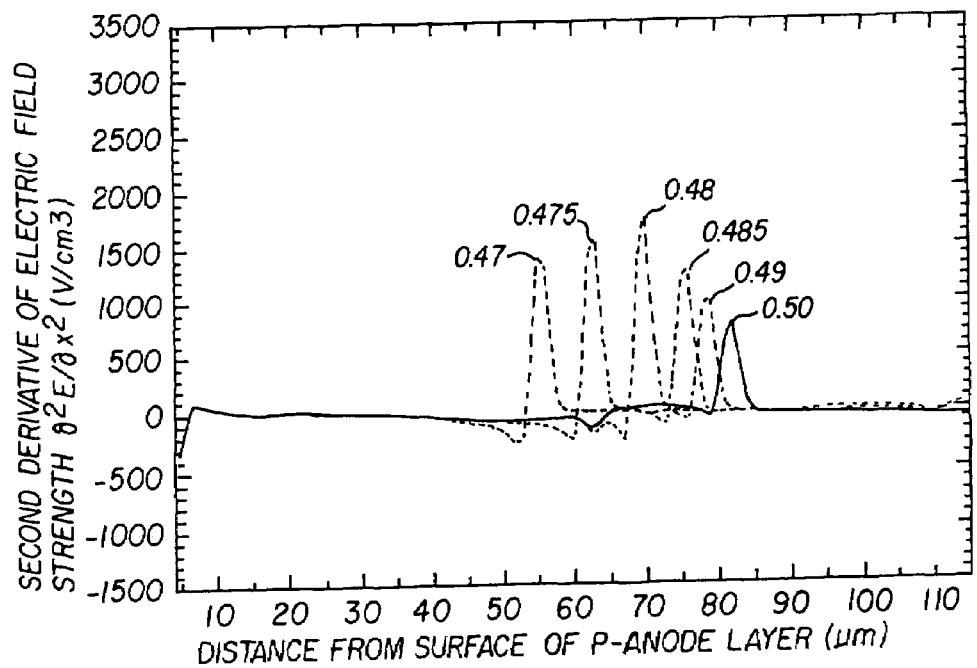

A glance at FIG. 19B to FIG. 22B, each showing second derivative $\partial^2 E/\partial X^2$ of the electric field strength distribution, shows the following. In the device according to the present invention, as shown in FIG. 22B, a region, where the second derivative $\partial^2 E/\partial X^2$ of the electric field strength distribution is not 0 in the space charge region (20 μm and farther), is broader than a region where the second derivative $\partial^2 E/\partial X^2$ is approximately 0 (the region from 10 to 20 μm). Contrary to this, in the related devices A, B, and D, as shown in FIG. 19B to FIG. 21B, as elapsed reverse recovery time becomes longer (about 0.5 μs), the region in which $\partial^2 E/\partial X^2=0$ becomes broader than the region in which $\partial^2 E/\partial X^2$ is not 0. From the foregoing, with an electric field strength controlled to suppress spread of a space charge region at reverse recovery as in the device according to the present invention, soft recovery can be performed more smoothly than in the related devices.

Figure 23A:
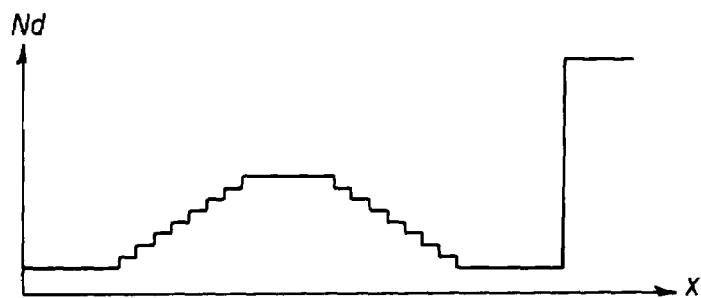
FIG. 23A is a schematic view showing a profile of an impurity concentration distribution in the case when the impurity concentration distribution gradually changes in stepwise-function-like with fine increments or decrements.
Figure 23B:
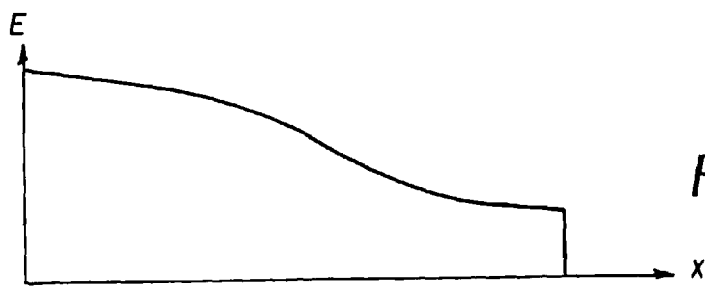
FIG. 23B is a view showing an electric field strength E under a reverse bias voltage (approximately equal to the breakdown voltage) in the case with the impurity concentration distribution shown in FIG. 23A.
Figure 23C:
FIG. 23C is a view showing the first derivative $\partial E/\partial X$ of the electric field strength shown in FIG. 23B.
Figure 23D:
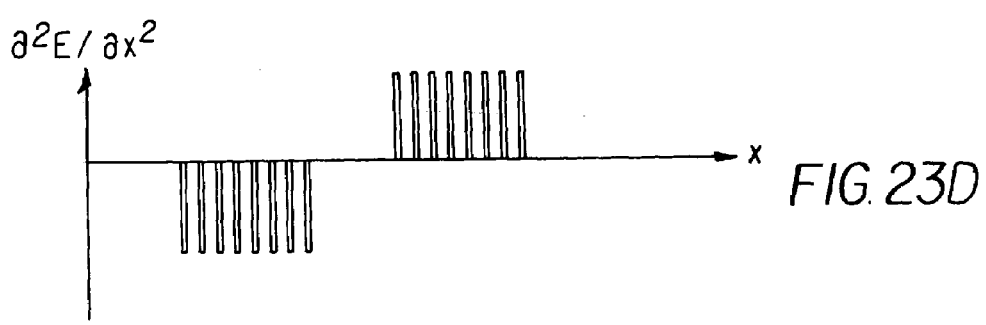
FIG. 23D is a view showing the second derivative $\partial^2 E/\partial X^2$ of the electric field strength shown in FIG. 23B.

FIGS. 23A to 23D shows the case when an impurity concentration distribution gradually changes in stepwise-function-like with fine increments or decrements. FIG. 23A is a schematic view showing a profile of the impurity concentration, FIG. 23B is a view showing an electric field strength E under a reverse bias voltage (approximately equal to the breakdown voltage), FIG. 23C is a view showing the first derivative $\partial E/\partial X$ of the electric field strength E, and FIG. 23D is a view showing the second derivative $\partial^2 E/\partial X^2$ of the electric field strength E. For example, when carrying out epitaxial growth, some ways of controlling gas flow provides an impurity concentration in a stepwise function as shown in FIG. 23A. Therefore, a first derivative $\partial E/\partial X$ thereof also becomes stepwise function as shown in FIG. 23C, and a second derivative $\partial^2 E/\partial X^2$ thereof becomes like a collection of finite δ functions as shown in FIG. 23D. With such a distribution, however, the same effect of suppressing the space charge region can be obtained as explained before, which makes the device perform soft recovery like that in the device according to the present invention shown in FIG. 14. Therefore the impurity concentration distribution in the n-drift layer can be stepped.

Figure 24:
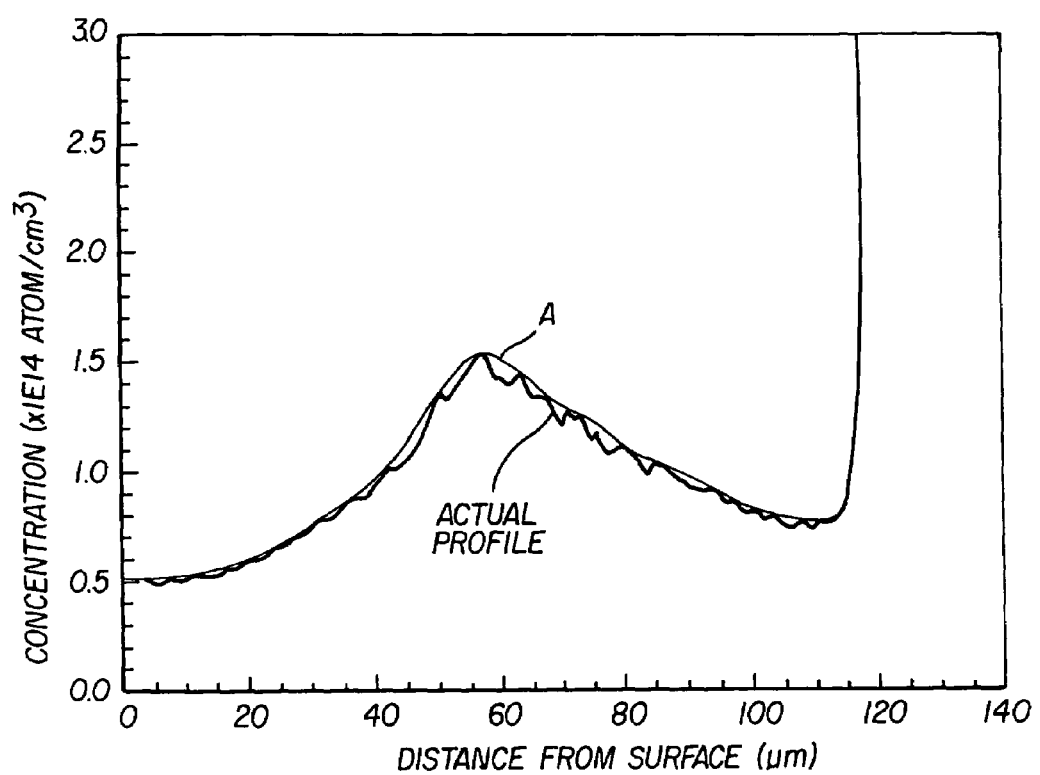
FIG. 24 is a diagram showing an actually measured stepwise impurity concentration profile.

FIG. 24 is a diagram showing an actually measured stepwise impurity concentration profile. The profile diagram corresponds to FIG. 23A. Although the impurity concentration distribution varies in a wavy form, its envelope A (a line tying local peaks on the wavy curve) shows a distribution gradually increasing monotonically and then decreasing also monotonically. One cause of such a wavy profile is considered to be due to that, when supply of doped impurity is increased or decreased by small steps at epitaxial growth, the amount of doped impurity overshoots at every change of the step.

Figure 25A:
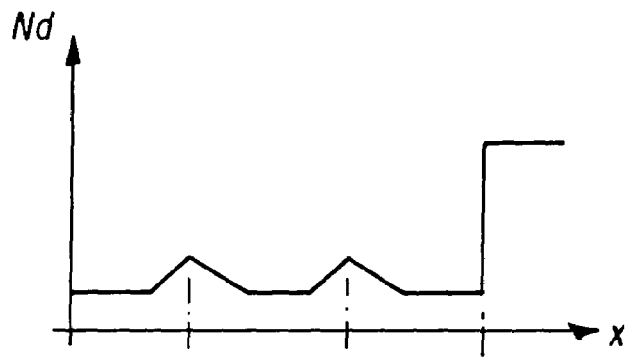
FIG. 25A is a view showing a first modification example of an impurity concentration distribution profile.
Figure 25B:
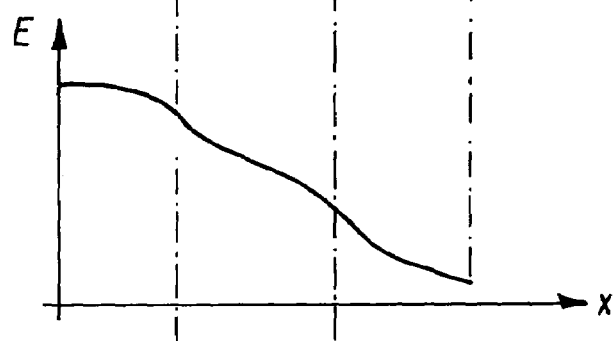
FIG. 25B is a view showing an electric field strength distribution for the impurity concentration distribution profile shown in FIG. 25A.
Figure 25C:
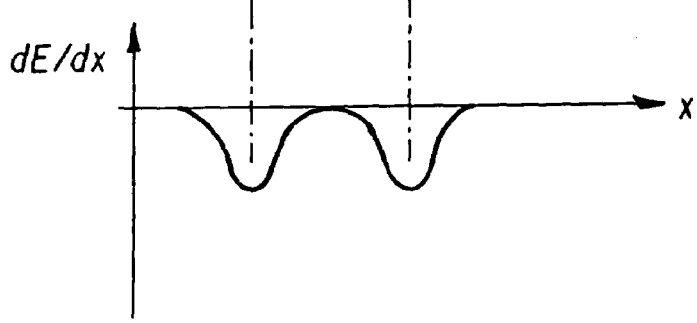
FIG. 25C is a view showing first derivative $\partial E/\partial X$ of the electric field strength distribution shown in FIG. 25B.
Figure 25D:
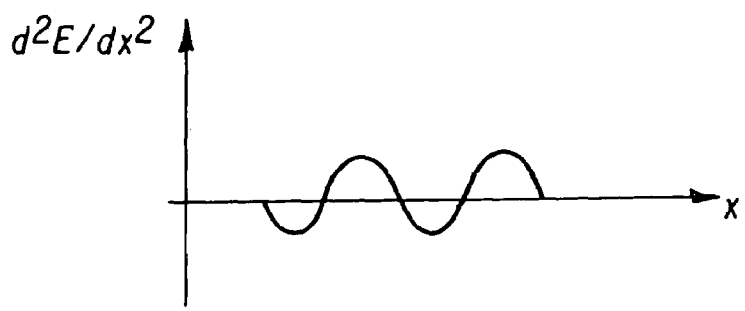
FIG. 25D is a view showing second derivative $\partial^2 E/\partial X^2$ of the electric field strength distribution shown in FIG. 25B.

In addition, the impurity concentration distributions can be also provided as follows. FIGS. 25A to 25D are views showing about a first modification example of an impurity concentration distribution profile and an electric field strength distribution. FIG. 25A is a view showing the impurity concentration distribution profile of the modification example. In the modification example, there are two relative maxima on a low constant impurity concentration distribution. FIG. 25B is a view showing an electric field strength distribution for the impurity concentration distribution profile shown in FIG. 25A, FIG. 25C is a view showing first derivative $\partial E/\partial X$ of the electric field strength distribution shown in FIG. 25B, and FIG. 25D is a view showing second derivative $\partial^2 E/\partial^2 X$ thereof. Also in this case in which two relative maxima are provided in the impurity concentration distribution, there can be obtained an effect similar to that in the case of the impurity concentration distribution shown in FIG. 12B. In this case, the second derivative $\partial^2 E/\partial^2 X$ has two finite values being positive and negative, respectively.

Figure 26A:
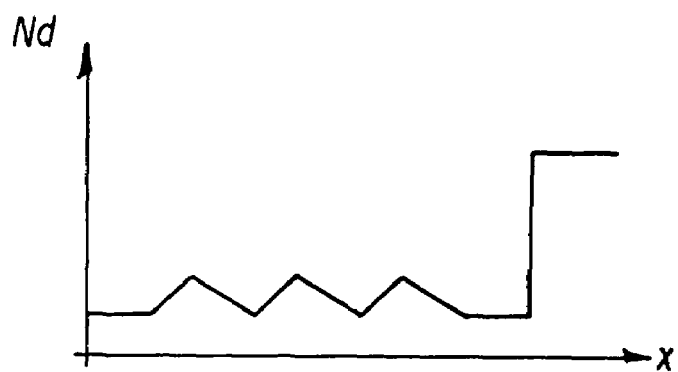
FIG. 26A is a view showing a second modification example of an impurity concentration distribution profile as a case in which the impurity concentrations at three relative maxima are equal.
Figure 26B:
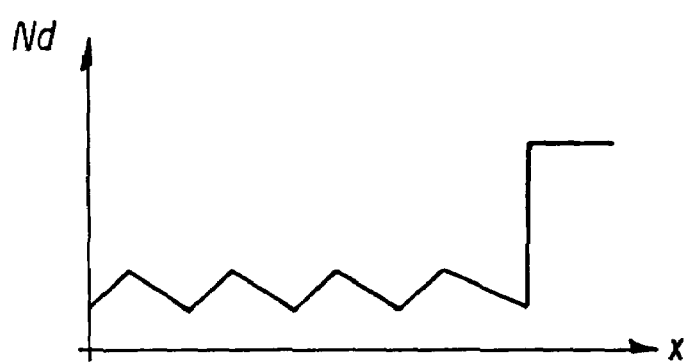
FIG. 26B is a view showing a third modification example of an impurity concentration distribution profile as a case in which the impurity concentration has four relative maxima.
Figure 26C:
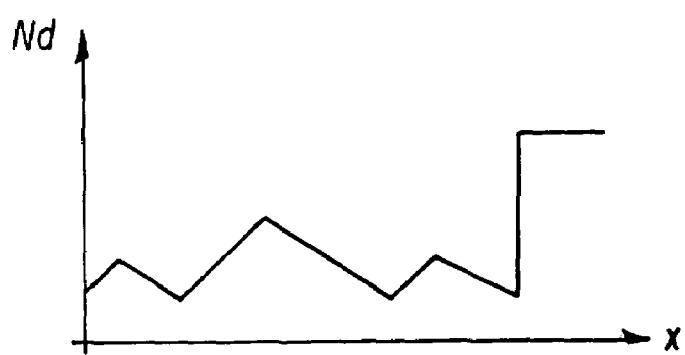
FIG. 26C is a view showing a fourth modification example of an impurity concentration distribution profile as a case in which the impurity concentrations at three relative maxima are different from one another.
Figure 26D:
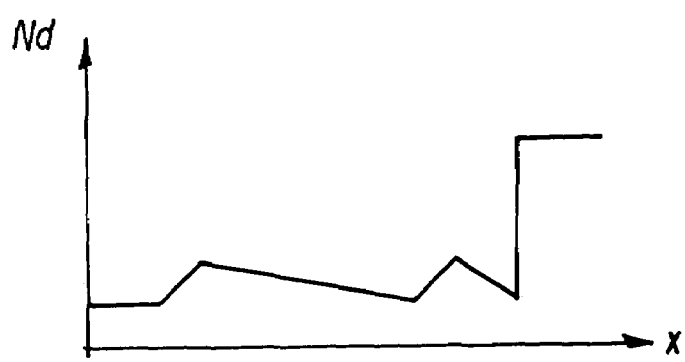
FIG. 26D is a view showing a fifth modification example of an impurity concentration distribution profile as a case in which gradients of the impurity concentration distribution decreasing from the relative maxima are largely different from one another.

Furthermore, the impurity concentration distribution can be provided as follows. FIGS. 26A to 26D are views showing second to fifth modification examples of impurity concentration distribution profiles. FIG. 26A is a view showing the second modification example of an impurity concentration distribution profile as a case in which the impurity concentrations at three relative maxima are equal. FIG. 26B is a view showing the third modification example of an impurity concentration distribution profile as a case in which the impurity concentration has four relative maxima. FIG. 26C is a view showing the fourth modification example of an impurity concentration distribution profile as a case in which the impurity concentrations at three relative maxima are different from one another. FIG. 26D is a view showing a fifth modification example of an impurity concentration distribution profile as a case in which gradients of the impurity concentration distribution decreasing from the relative maxima are largely different from one another. Also in these cases, there can be obtained similar effects to that in the case with the impurity concentration distribution shown in FIG. 12B. The impurity concentration distribution is not limited to those presented above.

Figure 27A:
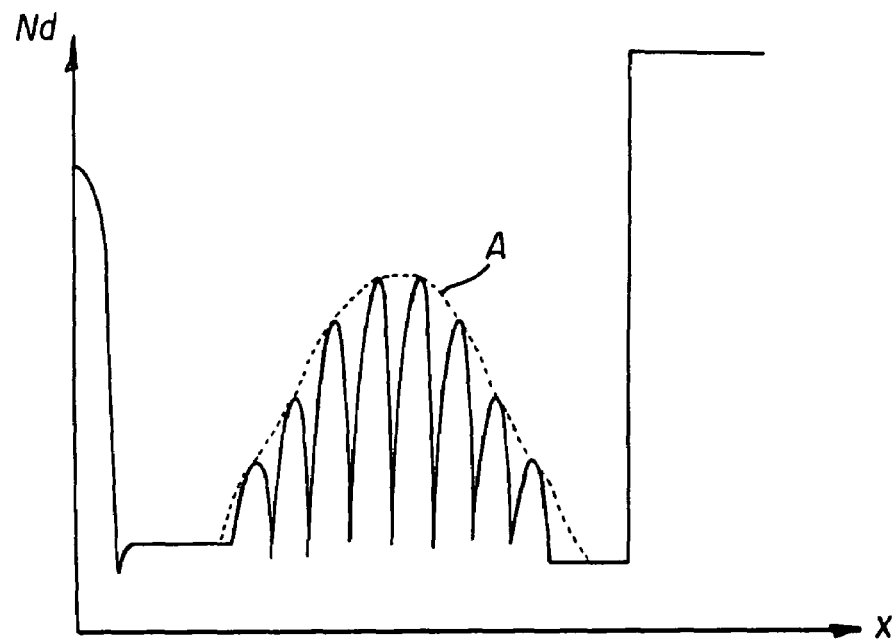
FIG. 27A is a view showing a sixth modification example of an impurity concentration distribution profile as a case in which an envelope tying relative extremes of the impurity concentration distribution becomes the maximum at one position.
Figure 27B:
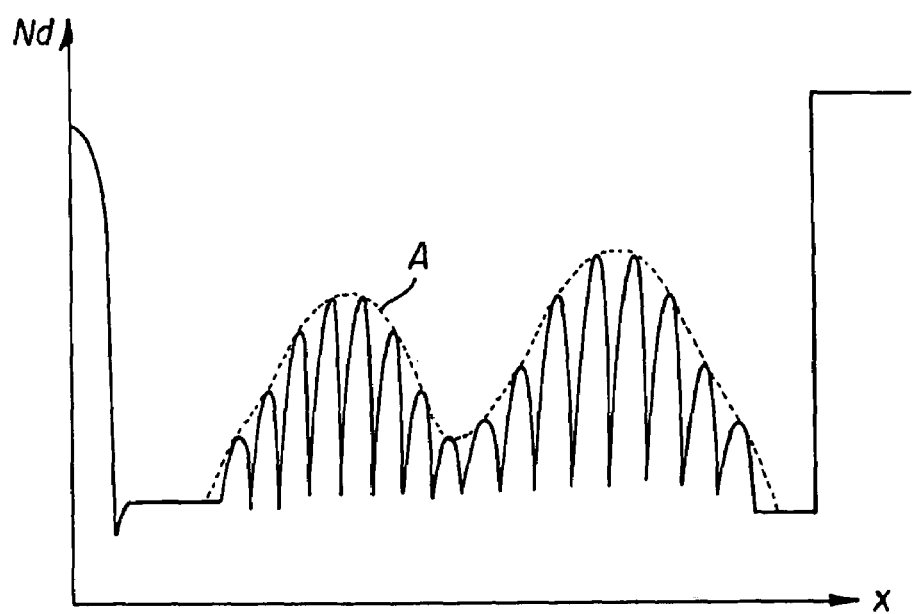
FIG. 27B is a view showing a seventh modification example of an impurity concentration distribution profile as a case in which an envelope tying relative extremes of the impurity concentration distribution becomes relative maxima at two positions.

FIGS. 27A and 27B are views showing a sixth and seventh modification examples of impurity concentration profiles, respectively. In each of the examples, the impurity concentration distribution profile has a number of small relative extremes. FIG. 27A is a view showing the sixth modification example of an impurity concentration profile as a case in which an envelope A tying the relative extremes becomes the maximum at one position. FIG. 27B is a view showing the seventh modification example of an impurity concentration profile as a case in which the envelope A tying the relative extremes becomes relative maxima at two positions. In each case, the envelope A gradually and monotonically decreases toward both of the cathode side and the anode side from the position at which the envelope A becomes maximum. In each case, an effect similar to that in the above-described examples.

Figure 28:
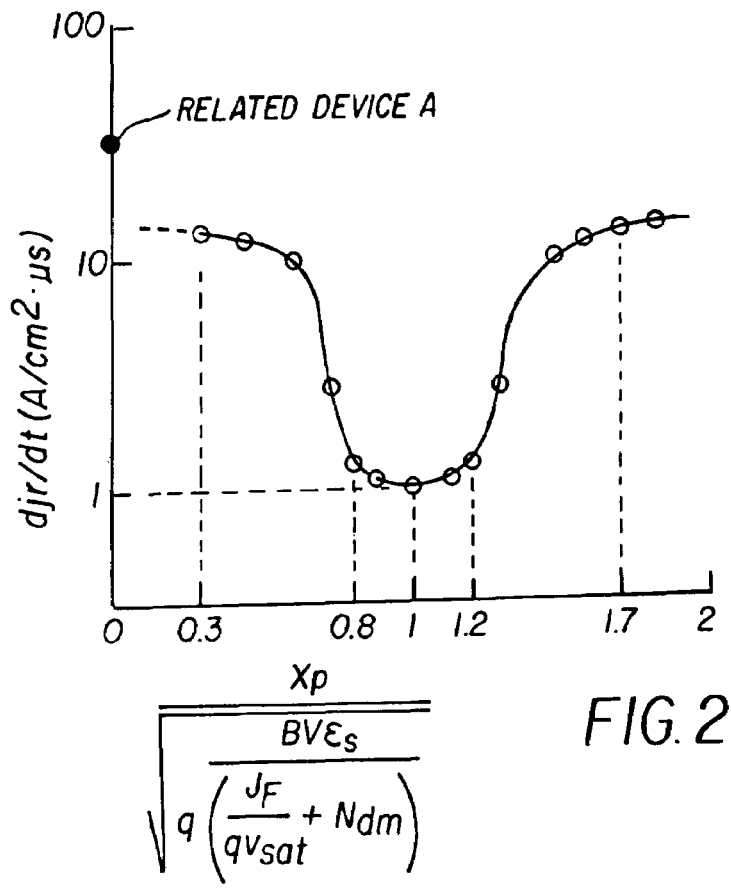
FIG. 28 is a diagram showing a relationship between a reduction rate djr/dt of a reverse recovery current jr and a ratio of a distance Xp at a peak position of the impurity concentration to a position index.

FIG. 28 is a diagram showing a relationship between a reduction rate djr/dt of a reverse recovery current jr and a ratio of a distance Xp at a peak position of the impurity concentration to a position index. The position index is given as $$\sqrt{\frac{BV\varepsilon_s}{q\left(\frac{J_F}{qv_{sat}} + N_{dm}\right)}},$$

where BV is a breakdown voltage of a semiconductor element, $\varepsilon_S$ is a semiconductor permittivity, q is the elementary electric charge, $J_F$ is a rated current density of the semiconductor element, $v_{sat}$ is a carrier saturation velocity, and $N_{dm}$ is the averaged impurity concentration in the drift layer of the first conduction type. The physical meaning of the position index has been explained in JP-A-2001-48631, which corresponds to the co-pending application identified above.

The figure shows the reverse recovery current reduction rate djr/dt with Xp is changed about the position index (the denominator of the expression representing the horizontal axis in the figure). The value of djr/dt is normalized by the value for the ratio of Xp to the position index being equal to unity. Moreover, the current in djr/dt in the vertical axis is represented by a current density (A/cm$^2$).

As is shown in FIG. 28, djr/dt becomes the minimum when the distance Xp at the position of the maximum impurity concentration $N_p$ in the n-drift layer 1 or the effective n-buffer layer 1a is equal to the position index. At the position, the device is made to perform soft recovery. As a whole, djr/dt can be made smaller than that of the related device A (represented by a closed circle ●), and can be effectively made smaller for the ratios between 0.3 and 1.7. In particular, djr/dt becomes the minimum for the ratios between 0.8 and 1.2. Therefore, the ratio is well taken between 0.3 and 1.7 as $$0.3 \leq \frac{Xp}{\sqrt{\frac{BV\varepsilon_s}{q\left(\frac{J_F}{qv_{sat}} + N_{dm}\right)}}} \leq 1.7,$$

and desirably, between 0.8 and 1.2 as $$0.8 \leq \frac{Xp}{\sqrt{\frac{BV\varepsilon_s}{q\left(\frac{J_F}{qv_{sat}} + N_{dm}\right)}}} \leq 1.2.$$

Figure 29:
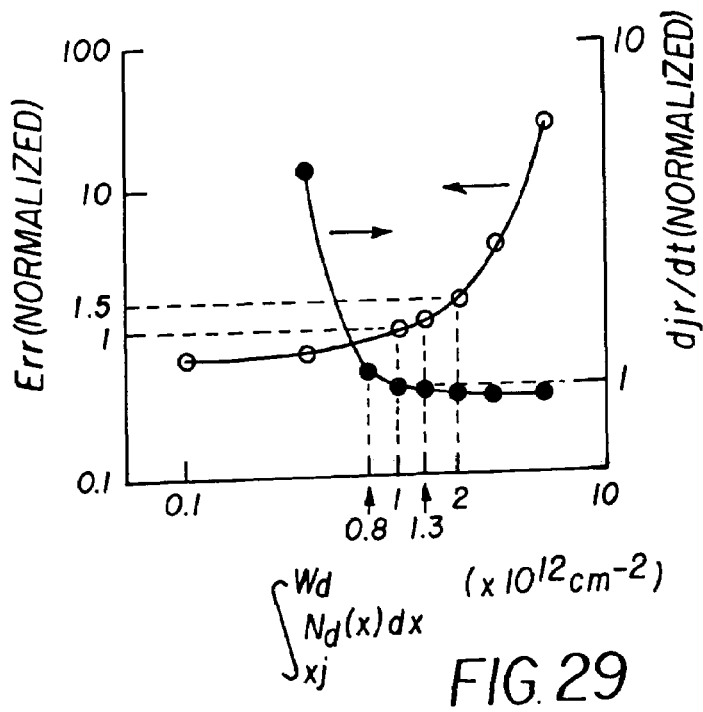
FIG. 29 is a diagram showing a relationships between the integrated impurity concentration in the whole n-drift layer and each of a reverse recovery loss Err and a reverse recovery current reduction rate djr/dt in the device according to the present invention.

FIG. 29 is a diagram showing a relationships between the integrated impurity concentration in the whole n-drift layer 1 and each of a reverse recovery loss Err and a reverse recovery current reduction rate djr/dt. The horizontal axis represents the integrated impurity concentration in the whole n-drift layer 1. The integrated impurity concentration in the whole n-drift layer 1 was made changed by changing the width of the n-drift layer ($W_d - X_j$) with the impurity concentration in the effective buffer layer fixed at $5 \times 10^{11}$ cm$^{-2}$. From the diagram, it is known that the integrated impurity concentration in the whole n-drift layer 1 exceeding about $1.3 \times 10^{12}$ cm$^{-2}$ makes the device a so-called punch-through type device in which no depletion layer reaches the n-cathode layer 3 even under a breakdown voltage.

It is also known from FIG. 29 that the integrated impurity concentration exceeding $1.3 \times 10^{12}$ cm$^{-2}$ increases in a rate of increase in Err to abrupt increase at $2 \times 10^{12}$ cm$^{-2}$ or above. Thus, an increase in the integrated impurity concentration by increasing the width of the n-drift layer results in an increase in Err. This shows that the integrated impurity concentration in the whole drift layer must be carefully designed. For inhibiting an abrupt increase in Err, the integrated impurity concentration is well given as being equal to or less than $2 \times 10^{12}$ cm$^{-2}$, preferably equal to or less than $1.3 \times 10^{12}$ cm$^{-2}$. Moreover, for inhibiting an oscillation to sufficiently lower the reverse recovery current reduction rate djr/dt, the integrated impurity concentration must be set also adequately. It is also known from FIG. 29 that, for the integrated impurity concentration to become less than $8 \times 10^{11}$ cm$^{-2}$, a thickness of the device becomes thin, as thin as about 100 μm, to cause oscillation. Therefore, it is necessary to prepare the integrated impurity concentration as being equal to or more than $8 \times 10^{11}$ cm$^{-2}$.

Figure 30C:
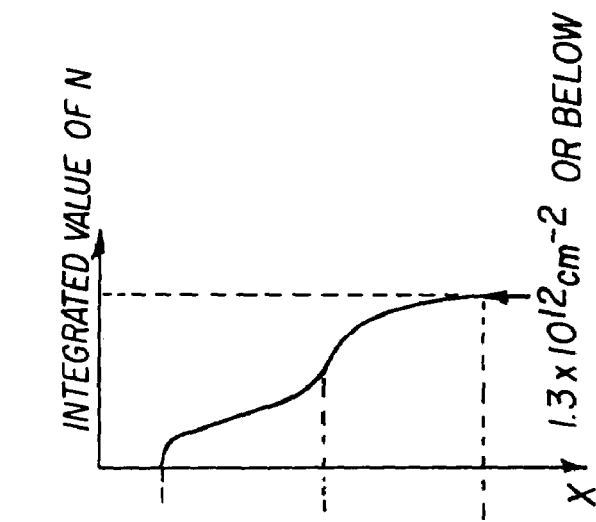
FIG. 30C is a schematic view showing an integrated impurity concentration in the device.
Figure 30B:
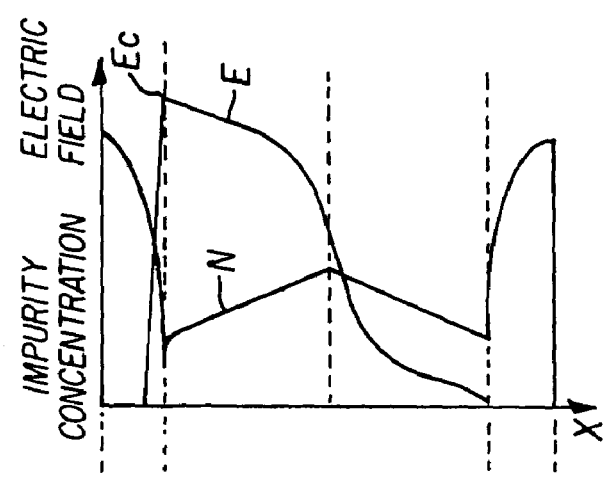
FIG. 30B is a schematic view showing a distribution of an electric field strength when the maximum value thereof becomes the critical electric field strength, and a distribution of the impurity concentration in the device.
Figure 30A:
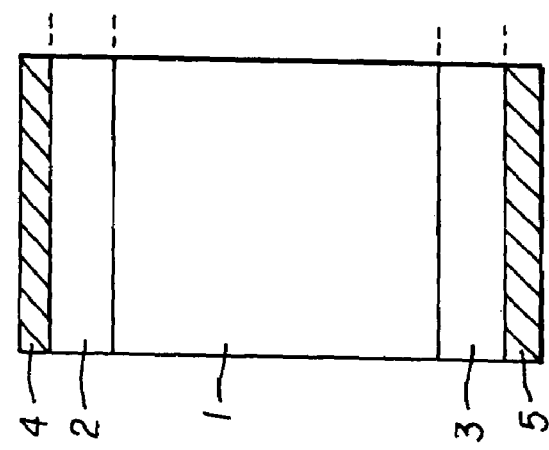
FIG. 30A is a cross sectional view again showing the principal part of the first example of the device shown in FIG. 12A.

From the above, the integrated impurity concentration is well prepared within a range between $8 \times 10^{11}$ cm$^{-2}$ and $2 \times 10^{12}$ cm$^{-2}$, desirably between $8 \times 10^{11}$ cm$^{-2}$ and $1.3 \times 10^{12}$ cm$^{-2}$. Moreover, the surface impurity concentration of the n-cathode layer 3 is prepared as being at least $1 \times 10^{17}$ cm$^{-3}$ or more for making the n-cathode layer 3 contact the electrode 5 with low resistance. FIG. 30A is a cross sectional view showing again the principal part of the first example of the device shown in FIG. 12A. FIG. 30B is a schematic view showing a distribution of an electric field strength E when the maximum value of E becomes the critical electric field strength, and a distribution of the impurity concentration N in the device. FIG. 30C is a schematic view showing an integrated impurity concentration in the device. The integrated impurity concentration is shown as that in the case-in which the integrated impurity concentration is $1.3 \times 10^{12}$ cm$^{-2}$ in the whole region of the n-drift layer. In this case, the depletion region reaches an end of the n-drift layer.

Figure 31:
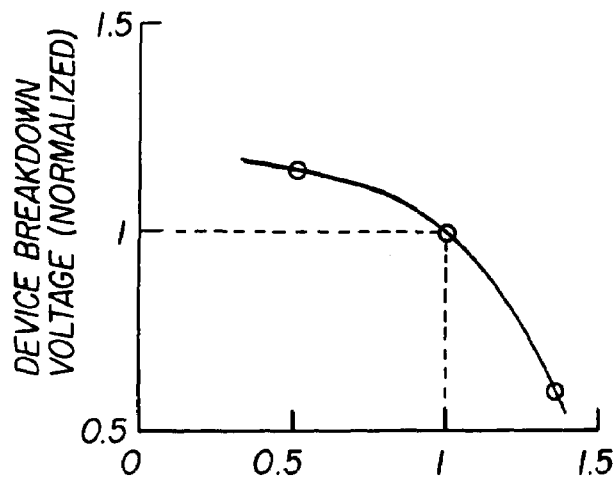
FIG. 31 is a diagram showing a relationship between an impurity concentration ratio and a breakdown voltage of the first example the device according to the present invention.

FIG. 31 is a diagram showing a relationship between an impurity concentration ratio and a breakdown voltage of the first example of the device according to the present invention. The impurity concentration ratio is given as a ratio of an impurity concentration $N_d(X_j)$ in the n-drift layer 1 near the pn junction at a distance $X_j$ between the p-anode layer 2 and the n-drift layer 1 to an impurity concentration index. The impurity concentration index is given as the denominator in the expression representing the horizontal axis and is expressed as $$\left( \frac{5.34 \times 10^{13}}{BV} \right)^{4/3},$$

where BV is a breakdown voltage of the device. The index is disclosed in *Power Semiconductor Devices* by B. J. Baliga, PWS Publishing Company (996). Here, the breakdown voltage representing the vertical axis is normalized by the breakdown voltage of the device when the impurity concentration ratio is unity. A breakdown voltage of a device is determined by a relationship between the critical electric field strength and an electric field strength distribution when the device is reverse biased, and is enhanced as the impurity concentration decreases at the junction.

In the device according to the present invention, by decreasing a donor concentration (impurity concentration) near $X_j$, the breakdown voltage of the device can be enhanced. The breakdown voltage of the device increases as the impurity concentration ratio decreases and, with the impurity concentration ratio being equal to or more than unity, abruptly reduces in reverse. Therefore, the impurity concentration ratio is desirably made equal to or less than unity as $$\frac{N_d(Xj)}{\left( \frac{5.34 \times 10^{13}}{BV} \right)^{4/3}} \leq 1.$$

Figure 32:
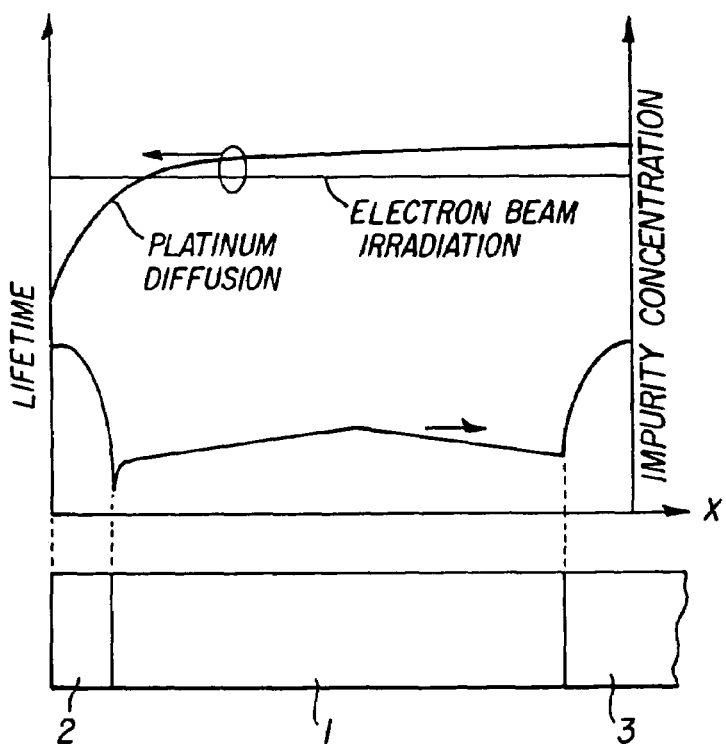
FIG. 32 is a view showing minority carrier lifetime distributions when platinum diffusion and electron beam irradiation are carried out, respectively, about the device according to the present invention.

FIG. 32 is a view showing minority carrier lifetime distributions when platinum diffusion and electron beam irradiation are carried out, respectively, about the device according to the present invention. The device according to the present invention can further enhance the soft recovery effect by inhibiting entrance of the space charge region into the n-drift layer 1 on the n-cathode 3 side, and by relatively increasing the minority carrier lifetime in the n-drift layer 1 on the n-cathode 3 side as in the case of the platinum diffusion.

Figure 33:
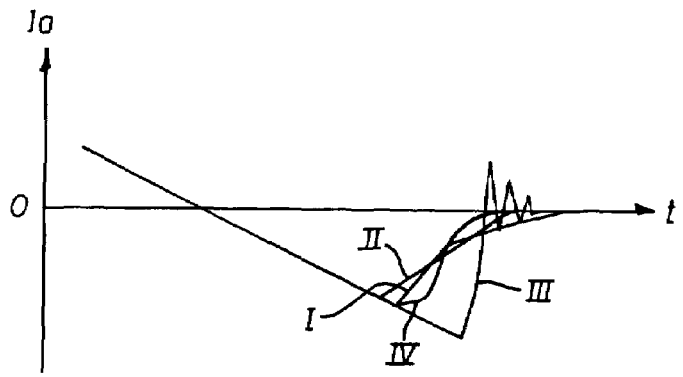
FIG. 33 is a view showing waveforms of anode currents Ia in reverse recovery about the device according to the present invention and the related device A in each of which lifetime control is carried out by platinum diffusion and electron beam irradiation.

FIG. 33 is a view showing waveforms of anode currents Ia in reverse recovery about the device according to the present invention and the related device A in each of which lifetime control is carried out by platinum diffusion and electron beam irradiation. In FIG. 33, roman numeral I denotes a waveform of the device according to the present invention in which lifetime control is carried out by electron beam irradiation, II denotes a waveform of the identical device in which lifetime control is carried out by platinum diffusion, III denotes a waveform of the related device A in which lifetime control is carried out by electron beam irradiation, IV denotes a waveform of the identical device in which lifetime control is carried out by platinum diffusion. The platinum diffusion was carried out by diffusing platinum from the anode side at 900° C. for 1 hour. The electron beam irradiation was carried out with an electron beam of 4.6 MeV with a dose of 400 kGy followed by heat treatment at 350° C. for 1 hour. A forward voltage drop at an operating current density of 180 A/cm2 in each of the devices was about 2.3V, which was equal to others.

As is apparent from FIG. 33, the device according to the present invention diffused with platinum (II) exhibited the best soft recovery with small reverse recovery charges Qrr. This, as is known from FIG. 15 for example, is because the carriers are not reduced by a drift effect, but are reduced only by recombination in the n-drift layer 1 on the n-cathode layer 3 side into which no space charge region enters. In the platinum diffusion, the carrier lifetime distribution can be weighted so that the lifetime of the carriers is increased in the n-drift layer 1 on the n-cathode 3 side, by which reduction of the carriers due to recombination can be inhibited. Namely, by the effect of lowering reduction of the carriers due to the drift effect to increase the lifetime of the carriers on the n-cathode 3 side where the carriers remain, the device is made to perform soft recovery. Moreover, the lifetime can be shortened by the platinum diffusion to reduce the reverse recovery charges Qrr, by which a significant improvement is achieved in making the device low-loss. The effect can be obtained only by increasing the lifetime of the carriers in the n-drift layer 1 on the n-cathode 3 side. Thus, the same effect can be also obtained by locally shortening the lifetime of the carriers near the p-anode layer 2 by irradiation with light ions such as He ions and protons. Furthermore, significantly improved soft recovery can be also provided by increasing the carrier concentration on the cathode side with an injection efficiency γ of the minority carriers being suppressed which are injected from the anode electrode 4 to the n-drift layer 1 and the p-anode layer.

Figure 34:
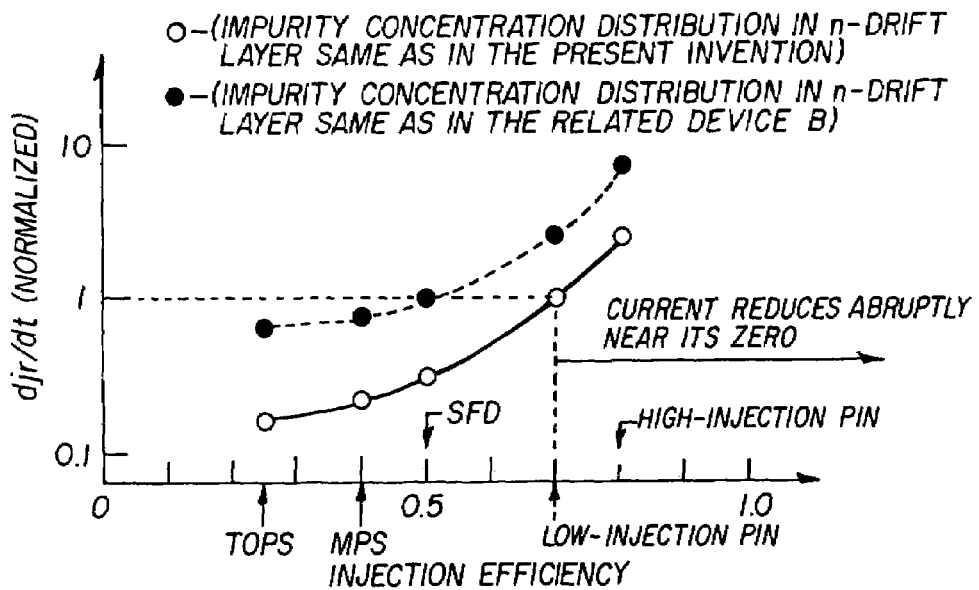
FIG. 34 is a view showing a relationship between the injection efficiency γ of the minority carriers injected into the n-drift layer and the reverse recovery current reduction rate djr/dt.

FIG. 34 is a view showing a relationship between the injection efficiency γ of the minority carriers injected into the n-drift layer 1 and the reverse recovery current reduction rate djr/dt. For the purpose of comparison, the relationship in the related device B is also presented. Both in the device according to the present invention and in the related device B, djr/dt increases with an increase in the injection efficiency γ. Over the whole range of the injection efficiency γ presented in FIG. 34, djr/dt in the device according to the present invention is exhibited as being smaller. Moreover, the value of djr/dt is normalized by the value in the related device A when the reverse recovery current therein is abruptly reduced around its zero to start oscillation. In the device according to the present invention, the injection efficiency γ for djr/dt becoming unity is 0.7. Thus, by making the value of γ smaller than the value, better soft recovery can be preferably provided. The injection efficiency γ is a proportion of a hole current density to the whole current density in the anode electrode. The value can be varied by varying the impurity concentration in the p-anode layer or a surface structure of the anode. This will be explained in detail in the following.

In FIG. 34, the value on the horizontal axis indicated by "high-injection P-I-N" is that in the case in which, in a surface structure of an anode of a p-i-n diode, an impurity concentration in a p-anode layer is increased to enhance an injection efficiency of holes into an n-drift layer. The value indicated by "low-injection P-I-N" is that in the case in which, in the surface structure of the anode of the p-i-n diode, an impurity concentration in the p-anode layer is lowered to lower the injection efficiency of holes into the n-drift layer. The value indicated by "SFD" is that in the case in which a p-anode layer is formed in being partly thinned with an impurity concentration in the thinned portions lowered as shown later in FIG. 39A as a seventh example. The value indicated by "MPS" is that in the case in which a surface structure of an anode is formed with p-anode regions and Schottky regions as shown in FIG. 2 and as shown later in FIG. 38A as a sixth example. The value indicated by "TOPS" is that in the case in which p-anode regions are formed on a bottom of each of trenches provided on a surface of an n-drift layer on which a Schottky region is formed as shown later in FIG. 40A as an eighth example. In each of the cases, the impurity concentration distribution in the n-drift layer is presented as shown in FIG. 12B.

There will be explained results of simulations carried out about the injection efficiencies in those surface structures. In the case of the MPS later shown in FIG. 38A, the value of γ is 0.4. In the case of the SFD later shown in FIG. 39A, the value of γ is 0.5. In the case of the TOPS later shown in FIG. 40A, the value of γ is 0.25. In the case of the low-injection P-I-N and the high-injection P-I-N, the values of γ are 0.7 and 0.8, respectively. The value of dij/dt is normalized by that of the low-injection P-I-N.

For making the above-described γ equal to or less than 0.7, the anode surface of the diode can be provided by a structure such as those of the low-injection P-I-N, SFD, MPS, and TOPS.

Figures 35A, 35B:
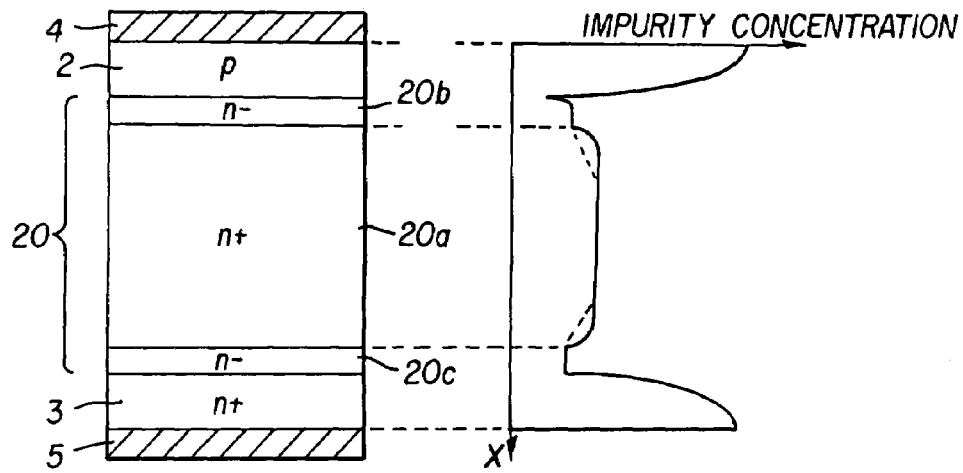
FIG. 35A is a cross sectional view showing a principal part of a third example of the semiconductor device according to the present invention.
FIG. 35B is a view showing an impurity concentration distribution in the semiconductor device shown in FIG. 35A.

In the following, there will be explained other examples of the semiconductor device according to the present invention. FIG. 35A is a cross sectional view showing a principal part of a third example of the semiconductor device according to the present invention and FIG. 35B is a view showing an impurity concentration distribution in the semiconductor device shown in FIG. 35A. The third example differs from the second example in that, in an n-buffer layer 20a, a region with the maximum impurity concentration is made widely distributed in flat with a gradual decrease at each of boundaries of the n-buffer layer 20a. With thus provided distribution, the pinning effect of a depletion layer can be more reduced, and control of the amount of impurity becomes easy when the n-buffer layer 20a is formed by epitaxial growth, for example. By providing the integrated impurity concentration and the position of the n-buffer layer so as to satisfy the above-explained expressions presented in the explanation of the first example, the same effect can be obtained. In the figure, reference numeral 20 denotes an n-drift layer, and 20a and 20b denote an n-buffer layer and a constant impurity concentration layer.

Figures 36A, 36B:
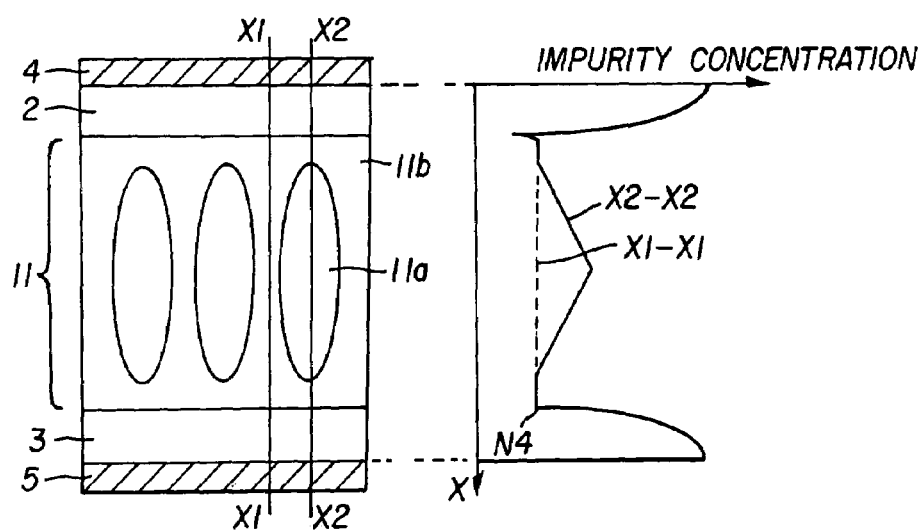
FIG. 36A is a cross sectional view showing a principal part of a fourth example of the semiconductor device according to the present invention.
FIG. 36B is a view showing an impurity concentration distribution in the semiconductor device shown in FIG. 36A.

FIG. 36A is a cross sectional view showing a principal part of a fourth example of the semiconductor device according to the present invention and FIG. 36B is a view showing an impurity concentration distribution in the semiconductor device shown in FIG. 36A. The fourth example differs from the second example in that a plurality of n-buffer layers 11a are provided in being divided in a longitudinal direction in an n-drift layer 11. Also in this case, there can be obtained the same effect as that explained above. In the case in which the n-buffer layer 1 in the first example is divided into a plurality of layers in the longitudinal direction, there can be of course obtained also the same effect. Such division can provide sections for controlling spread of a space charge region when reverse biased (the n-buffer layer 11a), and a section for spreading the space charge region (a constant impurity concentration layer 11b) as being separated to make it easy to achieve both of the soft recovery effect and a stably kept breakdown voltage.

In the figure, reference number 11 denotes an n-drift layer, 11a denotes an n-buffer layer and 11b and 11c denote constant impurity concentration layers.

Figures 37A, 37B:
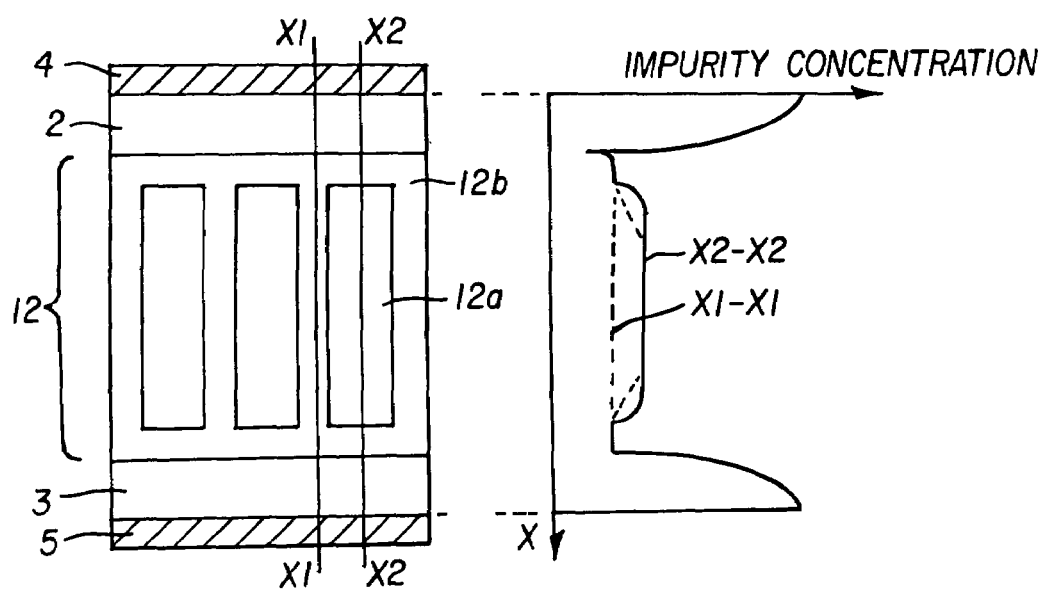
FIG. 37A is a cross sectional view showing a principal part of a fifth example of the semiconductor device according to the present invention.
FIG. 37B is a view showing an impurity concentration distribution in the semiconductor device shown in FIG. 37A.

FIG. 37A is a cross sectional view showing a principal part of a fifth example of the semiconductor device according to the present invention and FIG. 37B is a view showing an impurity concentration distribution in the semiconductor device shown in FIG. 37A. The fifth example differs from the second example in that a plurality of n-buffer layers 12a are provided in being divided in a longitudinal direction in an n-drift layer 12. Also in this case, there can be obtained the same effect as that explained above. In the figure, reference numeral 12 denotes an n-drift layer, 12a denotes an n-buffer layer and 12b denotes a constant impurity concentration layer.

FIG. 38A is a cross sectional view showing a principal part of a sixth example of the semiconductor device according to the present invention and FIG. 38B is a view showing an impurity concentration distribution in the semiconductor device shown in FIG. 38A. In the sixth example, an n-drift layer 1 equivalent to the n-drift layer 1 in the first example (FIGS. 12A and 12B) or 10 in the second example (FIGS. 13A and 13B) is provided in the MPS diode disclosed in the previously mentioned reference, *The Pinch Rectifier* by B. J. Baliga and shown in FIG. 2. This can reduce an injection efficiency γ to decrease dir/dt, by which an oscillation is better inhibited than in the first and second examples of the semiconductor devices shown in FIGS. 12A and 12B, and in FIGS. 13A and 13B, respectively. Moreover, dV/dt can be also better suppressed than in the semiconductor devices of the first and second examples. In the figure, reference numeral 21 denotes an anode layer, 21a denotes a p-region, and 21b denotes a Schottky region.

FIG. 39A is a cross sectional view showing a principal part of a seventh example of the semiconductor device according to the present invention and FIG. 39B is a view showing an impurity concentration distribution in the semiconductor device shown in FIG. 39A. In the seventh example, an n-drift layer 1 equivalent to the n-drift layer 1 in the first example (FIGS. 12A and 12B) or 10 in the second example (FIGS. 13A and 13B) is provided in the SFD disclosed in *A Novel Soft and Fast Recovery Diode (SFD) with Thin P-layer Formed by Al—Si Electrode* by M. Mori, et al, Proceedings of ISPSD'91, pp. 113-117(1991). This can reduce an injection efficiency γ to decrease dir/dt, by which an oscillation is better inhibited than in the sixth example of the semiconductor device shown in FIGS. 38A and 38B. In the figure, reference numeral 22 denotes an anode layer, 22a denotes a p-region, and 22b denotes a p⁻-region.

FIG. 40A is a cross sectional view showing a principal part of an eighth example of the semiconductor device according to the present invention and FIG. 40B is a view showing an impurity concentration distribution in the semiconductor device shown in FIG. 40A. In the eighth example, an n-drift layer 1 equivalent to the n-drift layer 1 in the first example (FIGS. 12A and 12B) or 10 in the second example (FIGS. 13A and 13B) is provided in the TOPS diode disclosed in *Great Improvement in IGBT Turn-on Characteristics with Trench Oxide P-I-N Schottky (TOPS) Diode* by M. Nemoto, et al., Proc. ISPSD'01, pp. 307-310 (2001). This can reduce an injection efficiency γ to decrease dir/dt, by which an oscillation is better inhibited than in the seventh example of the semiconductor device shown in FIGS. 39A and 39B. In the figure, reference numeral 23 denotes an anode layer, 23a denotes a p-region, 23b denotes a Schottky region, 23c denotes a trench, and 24d denotes an insulator film.

FIGS. 41A, 41B, and 41C show a ninth example of the semiconductor device according to the present invention which is provided as a MOSFET. FIG. 41A is a cross sectional view showing a principal part of a planer gate structure of the MOSFET, FIG. 41B is a cross sectional view showing a principal part of a trench gate structure of the MOSFET, and FIG. 41C is a view showing an impurity concentration distribution in the MOSFET shown in FIG. 41A or FIG. 41B. The ninth example is the case in which the arrangement in the first example is applied to that of an n-drift layer 31 in the MOSFET. The arrangements in other examples can be applied thereto. When a diode built in the MOSFET is operated to perform reverse recovery operation, it is operable smoother and at higher speed reverse recovery than that in an ordinary MOSFET. In the cases with the gate structures of both the planer structure (FIG. 41A) and the trench structure (FIG. 41B), the same effects can be obtained. In the figures, reference numeral 31 denotes an n-drift layer, 32a denotes a p-well region, 32b denotes an n-source region, 32c denotes a gate insulator film, 32d denotes a gate electrode, 32e denotes an interlayer insulator film, 32f denotes a trench, 33 denotes an n-drain layer, 34 denotes a source electrode, and 35 denotes a drain electrode.

FIG. 42A is a cross sectional view showing a principal part of a tenth example of the semiconductor device according to the present invention and FIG. 42B is a view showing an impurity concentration distribution in the semiconductor device shown in FIG. 42A. The figures show the case of a reverse-blocking IGBT in which an NPT(Non Punch-Through)-IGBT is made to have a reverse-blocking capability. The operation of the reverse-blocking IGBT includes a diode operation, so that the diode operation can be improved by providing an n-drift layer 41 equivalent to the n-drift layer 1 in the first example. The n-drift layers in other examples can be applied thereto. The n-drift layer 41 can be provided regardless of whether the layer reaches a side face p-collector 43a or not. In the figure, reference numeral 41 denotes an n-drift layer, 42a denotes a p-well region, 42b denotes an n-emitter region, 42c denotes a gate insulator film, 42d denotes a gate electrode, 42e denotes an interlayer insulator film, 43 denotes a p-collector layer, 44 denotes an emitter electrode, and 45 denotes a collector electrode.

FIG. 43A is a cross sectional view showing a principal part of an eleventh example of the semiconductor device according to the present invention and FIG. 43B is a view showing an impurity concentration distribution in the semiconductor device shown in FIG. 43A. The figures show the case of a reverse-conducting GTO thyristor. By providing an n-drift layer 51 equivalent to the n-drift layer 1 in the first example, the above-described effects can be expected at a reverse recovery operation of a diode section. The n-drift layers in other examples can be applied thereto. In the figure, reference numeral 51 denotes an n-drift layer, 52a denotes a p-layer (a p-anode layer of the diode section), 52b denotes an n-cathode layer (thyristor section), 52c denotes a gate electrode, 53 denotes a p-anode layer (thyristor section), 53a denotes an n-cathode layer (diode section), 54 denotes a cathode electrode (thyristor section), 54a denotes an anode electrode (diode section), and 55 denotes an anode electrode (thyristor section)/a cathode electrode (diode section).

Manufacturing methods of the semiconductor devices in the above-described examples will be described. Cross sectional views showing manufacturing steps of a principal part of a device in each example in the following are presented as cross sectional views of the principal part in an area corresponding to a semiconductor chip sliced from a wafer of the semiconductor device in the example on scribing lines thereon.

Figure 44:
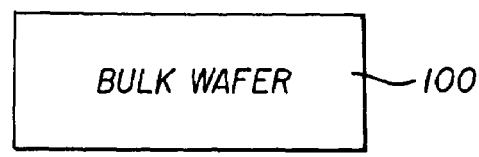
FIG. 44 is a cross sectional view showing a principal part of a semiconductor device in a state of a bulk wafer in a manufacturing method of a semiconductor as a twelfth example according to the present invention.
Figure 45A:
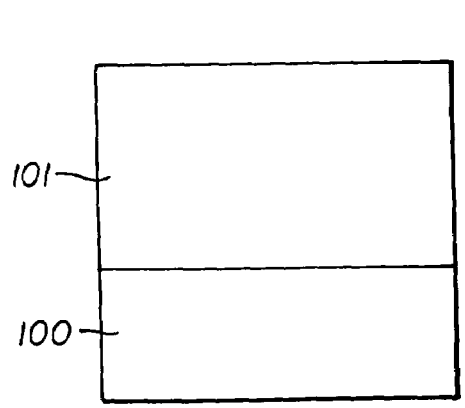
FIG. 45A is a cross sectional view showing a principal part of the semiconductor device in the manufacturing step subsequent to that shown in FIG. 44 in which an epitaxial layer is formed on the bulk wafer.
Figure 45B:
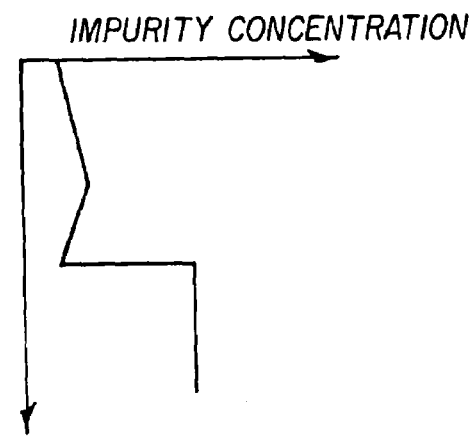
FIG. 45B is a view schematically showing an impurity concentration distribution in the semiconductor device in the manufacturing step shown in FIG. 45A.

FIGS. 44, 45A, and 46A are cross sectional views of a principal part of a semiconductor device showing a manufacturing method thereof as a twelfth example according to the present invention in the order of manufacturing steps, with FIGS. 45B and 46B showing an impurity concentration distribution in the step shown in FIGS. 45A and 46A, respectively.

A bulk wafer 100 (FIG. 44), obtained from a CZ single silicon crystal (sometimes an FZ silicon single crystal) of n-type with low resitivity doped with antimony or arsenic, is prepared as an n-type semiconductor substrate. The bulk wafer 100 is subjected to specified preliminary treatment, on which there is formed an epitaxial layer 101 with high resitivity (low impurity concentration) including n-type impurities such as phosphorus (FIGS. 45A and 45B). At this time, a gas including the n-type impurity such as phosphorus is supplied with a specified flow rate. By controlling the flow rate, such an impurity concentration distribution as shown in FIG. 45B is provided, in which the impurity concentration gradually increases toward the bulk wafer 100 to a specified position and then gradually decreases therefrom. The detail of the distribution is shown in each of previously presented FIGS. 12B, 38B, 39B, 40B, 41B, 42B, and 43B. A p-anode layer 102 and an n$^+$-layer 103 are formed for providing ohmic contact with a cathode electrode 105. Then, on the layers 102 and 103, an anode electrode 104 and the cathode electrode 105 are respectively formed (FIG. 46A). By controlling the flow rate of the gas including n-type impurities, one can obtain each of the impurity concentration distributions in the n-drift layers 10 and 20 as shown in FIG. 13B and FIG. 35B, respectively.

Figure 49:
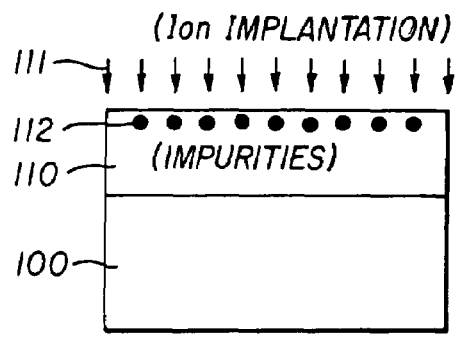
FIG. 49 is a cross sectional view showing a principal part of a semiconductor device in the manufacturing step subsequent to that shown in FIG. 48 in which ion implantation of impurities is carried out onto the first epitaxial layer.
Figure 50:
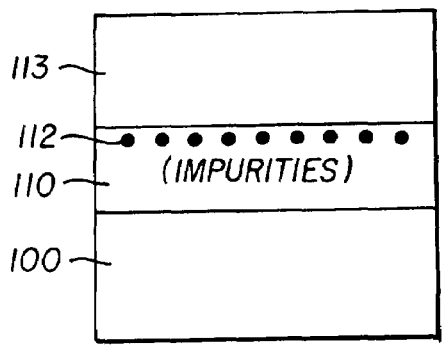
FIG. 50 is a cross sectional view showing a principal part of a semiconductor device in the manufacturing step subsequent to that shown in FIG. 49 in which a second epitaxial layer is formed on the ion-implanted first epitaxial layer.
Figure 51A:
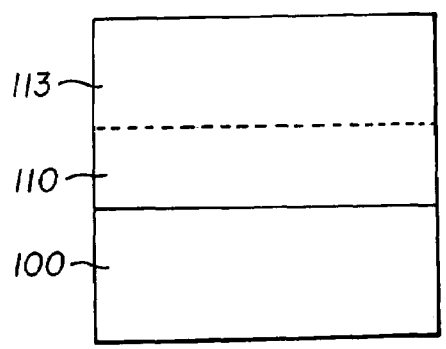
FIG. 51A is a cross sectional view showing a principal part of a semiconductor device in the manufacturing step subsequent to that shown in FIG. 50 in which thermal diffusion of the impurities has been carried out.
Figure 51B:
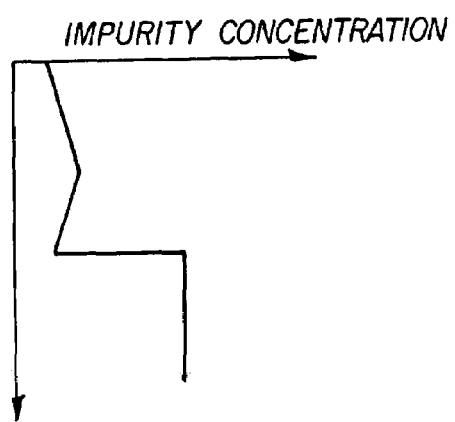
FIG. 51B is a view schematically showing an impurity concentration distribution in the semiconductor device in the manufacturing step shown in FIG. 51 A.

FIG. 47 to FIG. 51A and FIG. 52A are cross sectional views of a principal part of a semiconductor device showing a manufacturing method thereof as a thirteenth example according to the present invention in the order of manufacturing steps with FIG. 51B and FIG. 52B showing impurity concentration distributions in the steps shown in FIG. 51A and FIG. 52A. A bulk wafer 100 (FIG. 47) obtained from a CZ single silicon crystal (sometimes an FZ silicon single crystal) of n-type with low resitivity doped with antimony or arsenic can be used. The bulk wafer 100 is subjected to specified preliminary treatment, on which there is formed a first epitaxial layer 110 with high resistivity including n-type impurities such as phosphorus (FIG. 48). Ion implantation 111 is carried out with n-type ions, such as phosphorus ions (impurities 112) in a specified concentration, and heat treatment is then carried out for defect recovery (FIG. 49). Then, a second epitaxial layer 113, which includes n-type impurities such as phosphorus (FIG. 50), is formed. The impurities 112 introduced by ion implantation are subjected to thermal diffusion (drive in) to provide an impurity concentration distribution in which the impurity concentration gradually increases toward the bulk wafer 100 to a specified position and then gradually decreases therefrom as shown in FIG. 12B and FIGS. 38B, 39B, 40B, 41B, 42B, and 43B, which are represented by FIG. 12B (FIGS. 51A and 51B). Here, the ion implantation concentration is determined to be equal to or less than $5 \times 10^{11}$ cm$^{-2}$, and preferably equal to or less than $2 \times 10^{11}$ cm$^{-2}$ as described before.

In the case of phosphorus being used in the example, a diffusion coefficient is given as $3 \times 10^{-12}$ cm$^2$/s at 1250° C. At this time, the diffusion carried out for 100 hours results in a diffusion length $\sqrt{Dt}$ of 10.4 µm. Process simulation provides that the diffusion carried out at 1250° C. for 80 hours presents just the same result with a distance between two positions, at each of which the impurity concentration becomes equal to an averaged concentration $N_{dm}$ ($8.4 \times 10^{13}$ cm$^{-3}$) in the drift layer, becomes about 50 µm. The maximum impurity concentration $N_p$ in the drift layer (FIG. 12B) at this time becomes $1.9 \times 10^{14}$ cm$^{-3}$ with $N_p/N_{dm}$ being of the order of 2.

Therefore, a desired distribution can be obtained. The diffusion time, becoming the processing time of the diffusion step, is desirable so that the time required for processing the step is increased as little as possible. This necessitates the diffusion temperature to be made higher to some extent. According to the foregoing discussion, the diffusion temperature is desirably set at 1200° C. or more. Since the melting point of silicon is 1412° C. as is published in the Rika Nenpyo (The Chronological Table of Physics and Chemistry), the diffusion temperature must be equal to or lower than that.

A p-anode layer 114 and an n$^+$-layer 115 are then formed. Then, on these layers 114 and 115, an anode electrode 116 and a cathode electrode 117 are respectively formed (FIG. 52A).

FIG. 53, FIG. 54A, FIG. 55A, FIG. 56A, FIG. 57A, and FIG. 58A are cross sectional views of a principal part of a semiconductor device showing a manufacturing method thereof as a fourteenth example according to the present invention in the order of manufacturing steps with FIG. 54B, FIG. 55B, FIG. 56B, FIG. 57B, and FIG. 58B showing impurity concentration distributions in the steps shown in FIG. 54A, FIG. 55A, FIG. 56A, FIG. 57A, and FIG. 58A. A bulk wafer 200 (FIG. 53) is obtained from an FZ silicon single crystal of n-type with high resitivity including phosphorus. The bulk wafer 200 is subjected to specified preliminary treatment, on which there is formed an epitaxial layer 210 with high resitivity including n-type impurities such as phosphorus (FIG. 54A). At this time, a gas including the n-type impurity such as phosphorus is supplied with a specified flow rate. By controlling the flow rate, such an impurity concentration distribution as shown in FIG. 13B is provided. The impurity concentration is constant up to a first specified position toward the bulk wafer 200, then gradually increases from the constant concentration up to a second position (the peak position), from which gradually decreases to become constant from a third specified position (FIG. 54B). Moreover, by controlling a flow rate of the gas including n-type impurities, there can be obtained each of the impurity concentration distributions in the n-drift layers as shown in FIG. 12B and FIG. 35B.

Figure 55A:
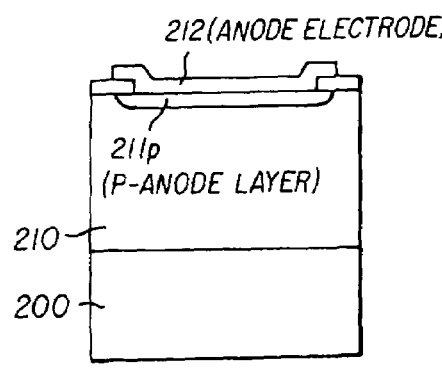
FIG. 55A is a cross sectional view showing a principal part of a semiconductor device in the manufacturing step subsequent to that shown in FIG. 54A in which a p-anode layer and an anode electrode are formed on the epitaxial layer.
Figure 55B:
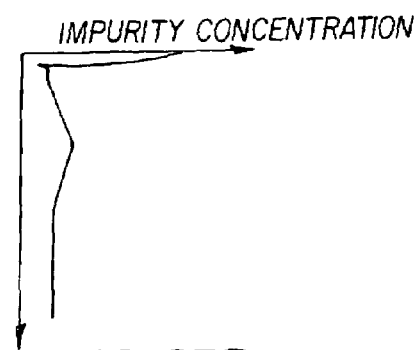
FIG. 55B is a view schematically showing an impurity concentration distribution in the semiconductor device in the manufacturing step shown in FIG. 55A.
Figure 56A:
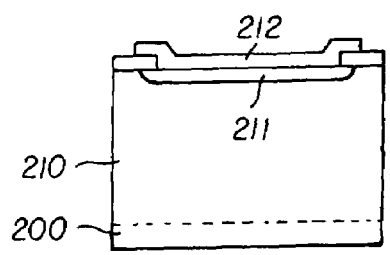
FIG. 56A is a cross sectional view showing a principal part of a semiconductor device in the manufacturing step subsequent to that shown in FIG. 55A in which the bulk wafer is thinned.
Figure 56B:
FIG. 56B is a view schematically showing an impurity concentration distribution in the semiconductor device in the manufacturing step shown in FIG. 56A.
Figure 57A:
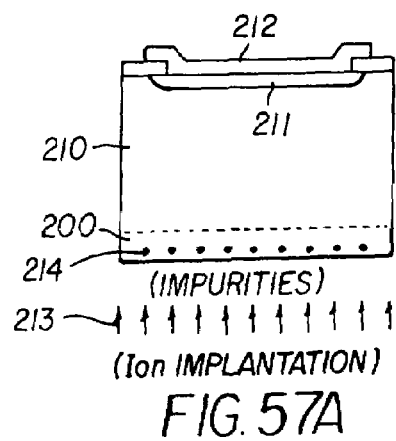
FIG. 57A is a cross sectional view showing a principal part of a semiconductor device in the manufacturing step subsequent to that shown in FIG. 56A in which ion implantation with impurity ions is carried out onto the thinned bulk wafer.
Figure 57B:
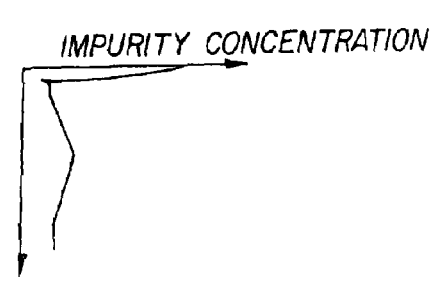
FIG. 57B is a view schematically showing an impurity concentration distribution in the semiconductor device in the manufacturing step shown in FIG. 57A.

After this, by carrying out normal process steps, a p-anode layer 211 is formed on the surface of the epitaxial layer 210 and an anode electrode 212 is then formed on the p-anode layer 211 (FIG. 55A). Thereafter, the bulk wafer 200 is thinned to a specified thickness by grinding (FIG. 56A) the back side or the bottom face. Then, ion implantation 213 is carried out with a specified dose of n-type impurity ions (impurities 214) onto the bottom face of the thinned bulk wafer 200 (FIG. 57A). Following this, heat treatment is carried out at a specified temperature before an n-cathode layer 215 is formed on which there is formed a cathode electrode 216 (FIG. 58A). The surface impurity concentration of the n-cathode layer is desirably $1 \times 10^{17}$ cm$^{-3}$ or more for achieving good ohmic contact with the cathode electrode 216.

Figure 62:
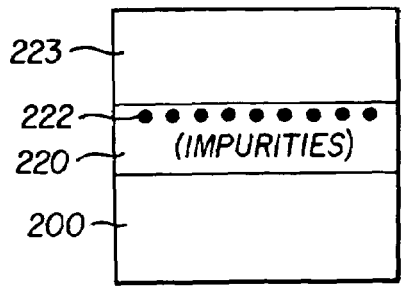
FIG. 62 is a cross sectional view showing a principal part of a semiconductor device in the manufacturing step subsequent to that shown in FIG. 61 in which a second epitaxial layer is formed on the ion-implanted first epitaxial layer.
Figure 63A:
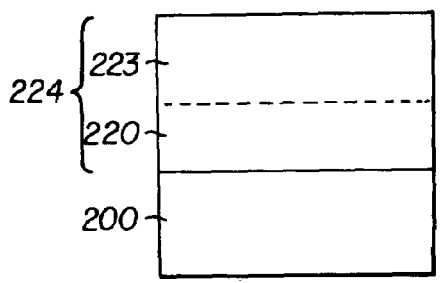
FIG. 63A is a cross sectional view showing a principal part of a semiconductor device in the manufacturing step subsequent to that shown in FIG. 62 in which thermal diffusion of impurities has been carried out.
Figure 63B:
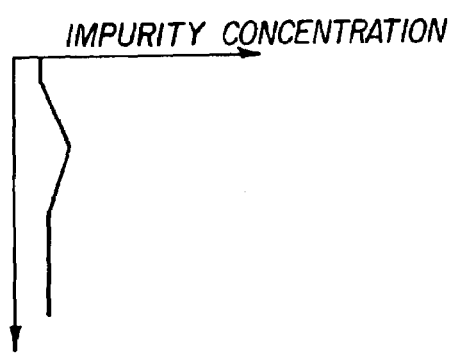
FIG. 63B is a view schematically showing an impurity concentration distribution in the semiconductor device in the manufacturing step shown in FIG. 63A.
Figure 64A:
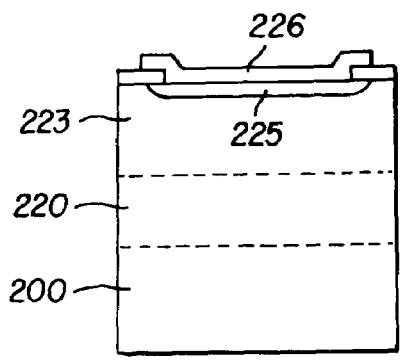
FIG. 64A is a cross sectional view showing a principal part of a semiconductor device in the manufacturing step subsequent to that shown in FIG. 63A in which a p-anode layer and an anode electrode are formed on the second epitaxial layer.
Figure 64B:
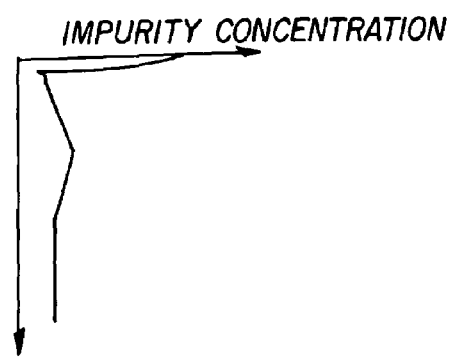
FIG. 64B is a view schematically showing an impurity concentration distribution in the semiconductor device in the manufacturing step shown in FIG. 64A.

FIG. 59 to FIGS. 62, and FIG. 63A, FIG. 64A, and FIGS. 65A are cross sectional views of a principal part of a semiconductor device showing a manufacturing method thereof as a fifteenth example according to the present invention in the order of manufacturing steps with FIG. 63B, FIG. 64B, and FIG. 65B showing impurity concentration distributions in the steps shown in FIG. 63A, FIG. 64A, and FIG. 65A.

A bulk wafer 200 (FIG. 59) obtained from an FZ silicon single crystal of n-type with high resitivity doped with phosphorus. The bulk wafer 200 is subjected to specified preliminary treatment, on which there is formed an epitaxial layer 220 with high resitivity including n-type impurities such as phosphorus (FIG. 60). Thereafter, ion implantation 221 is carried out with n-type ions such as phosphorus ions (impurities 222) in a specified concentration and heat treatment is then carried out for defect recovery (FIG. 61). Then, a second epitaxial layer 223 is formed, which includes n-type impurities such as phosphorus (FIGS. 62). After this, the impurities 222 introduced by the ion implantation are subjected to thermal diffusion (drive in) to provide an impurity concentration distribution as shown in FIG. 13B (FIG. 63B). Moreover, there can be provided an impurity concentration distribution represented by that shown in FIG. 12B. Here, the ion implantation concentration is well determined to be equal to or less than $5 \times 10^{11}$ cm$^{-2}$, and preferably equal to or less than $2 \times 10^{11}$ cm$^{-2}$ as described before.

In the case of phosphorus being used in the example, a diffusion coefficient is given as $3 \times 10^{12}$ cm$^2$/s at 1250° C. At this time, the diffusion carried out for 100 hours results in a diffusion length $\sqrt{Dt}$ of 10.4 µm. Process simulation provides that the diffusion carried out at 1250° C. for 80 hours presents just the same result with a distance between two positions, at each of which the impurity concentration becomes equal to an averaged concentration $N_{dm}$ ($8.4 \times 10^{13}$ cm$^{-3}$) in the drift layer, becomes about 50 µm. The maximum impurity concentration $N_p$ in the drift layer at this time becomes $1.9 \times 10^{14}$ cm$^{-3}$ with $N_p/N_{dm}$ being 2.3. Therefore, in an epitaxial layer 224 including the first epitaxial layer 220 and the second epitaxial layer 223, the impurity concentration distribution becomes substantially as desired. The diffusion time, becoming the processing time of the diffusion step, is desirable so that the time required for processing the step is increased as little as possible. This necessitates the diffusion temperature to be made higher to some extent. According to the foregoing discussion, the diffusion temperature is desirably set at 1200° C. or more. Since the melting point of silicon is 1412° C. as is published in the Rika Nenpyo (The Chronological Table of Physics and Chemistry), the diffusion temperature must be equal to or lower than that.

After this, a p-anode layer 225 is formed on the surface of the epitaxial layer 224 and an anode electrode 226 is then formed on the p-anode layer 225 (FIG. 64A). Thereafter, the bulk wafer 200 can be thinned to a specified thickness by grinding the back side or the bottom face. Then, ion implantation is carried out with a specified dose of n-type impurity ions onto the bottom face. Following this, heat treatment is carried out at a specified temperature before an n-cathode layer 227 is formed on which there is formed a cathode electrode 228 (FIG. 65A). The surface impurity concentration of the n-cathode layer 227 is desirably $1 \times 10^{17}$ cm$^{-3}$ or more for achieving good electric contact with the cathode electrode 228.

Figure 68A:
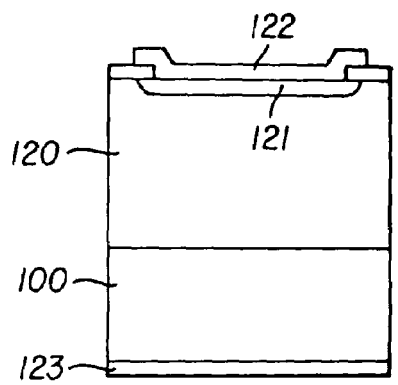
FIG. 68A is a cross sectional view showing a principal part of a semiconductor device in the manufacturing step subsequent to that shown in FIG. 67A in which a p-anode layer and an anode electrode are formed on the epitaxial layer, and an n-cathode layer on the bulk wafer.
Figure 68B:
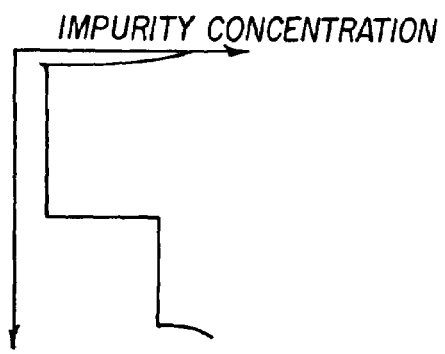
FIG. 68B is a view schematically showing an impurity concentration distribution in the semiconductor device in the manufacturing step shown in FIG. 68A.
Figure 69A:
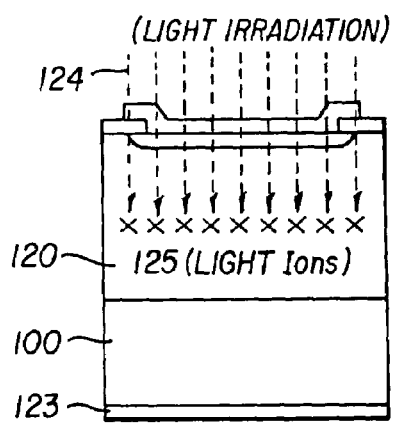
FIG. 69A is a cross sectional view showing a principal part of a semiconductor device in the manufacturing step subsequent to that shown in FIG. 68A in which light ion irradiation is carried out.

FIG. 66, FIG. 67A, FIG. 68A, FIG. 69A, and FIG. 70A are cross sectional views of a principal part of a semiconductor device showing a manufacturing method thereof as a sixteenth example according to the present invention in the order of manufacturing steps with FIG. 67B, FIG. 68B, FIG. 69B, and FIG. 70B showing impurity concentration distributions in the steps shown in FIG. 67A, FIG. 68A, FIG. 69A, and FIG. 70A. A bulk wafer 100 (FIG. 66) obtained from a CZ silicon single crystal of n-type with low resitivity doped with antimony or arsenic is subjected to specified preliminary treatment, on which there is formed a first epitaxial layer 120 with high resitivity including n-type impurities such as phosphorus. At this time, an impurity concentration distribution is made uniform (FIG. 67B). After this, by carrying out normal process steps, a p-anode layer 121 and an anode electrode 122 are formed on the surface of the epitaxial layer 120, and an n-cathode layer 123 is formed on the surface of the bulk wafer 100 (FIG. 68A). Up to this step, there is no difference in the method from the related one. After this, light ion irradiation 124 is carried out onto the anode side (FIG. 69A). Light ions can be helium ions, protons, and deuterons. In the case shown in FIG. 69A, the irradiation was carried out with protons. With the light ions, local defects can be formed at a desired depth (for example, see *Power Device Handbook*, Edited by the Institute of Electrical Engineers of Japan). The light ion irradiation 124 can be carried out onto the cathode side. Moreover, the light ion irradiation can be carried out before the n-cathode layer 123 is formed. In this case, the bulk wafer 100 can be ground from the bottom side down to a specified thickness after the irradiation.

Figures 3A, 3B:
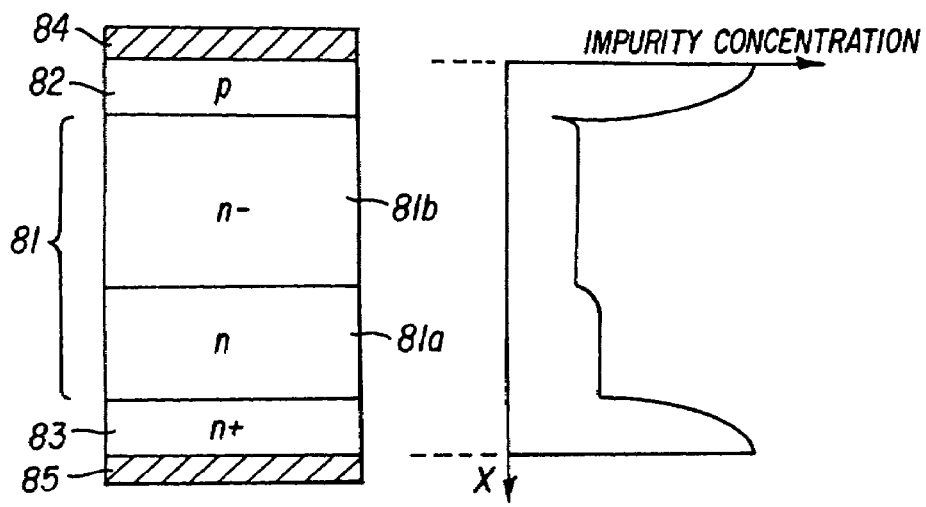
FIG. 3A is a cross sectional view showing a principal part of a related device B.
FIG. 3B is a view showing an impurity concentration distribution in the related device B shown in FIG. 3A.
Figures 4A, 4B:
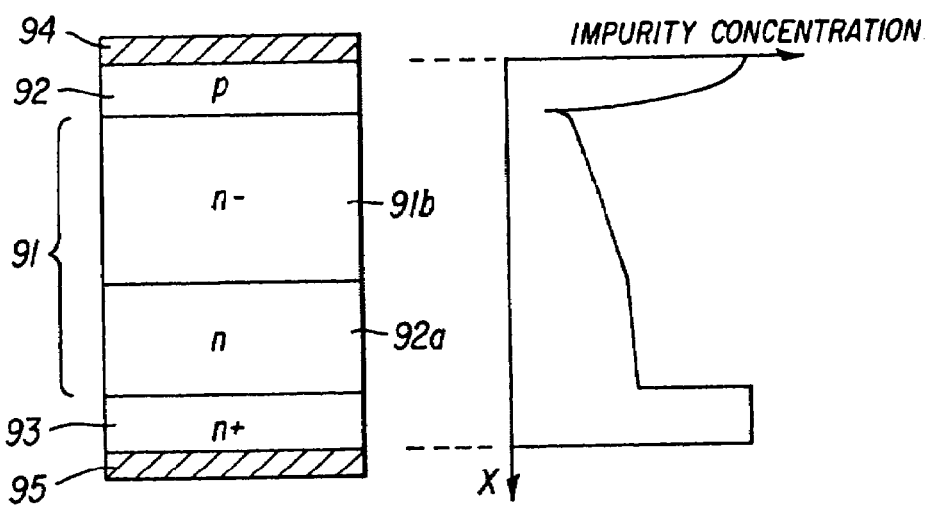
FIG. 4A is a cross sectional view showing a principal part of a related device C.
FIG. 4B is a view showing an impurity concentration distribution in the related device C shown in FIG. 4A.
Figures 5A, 5B:
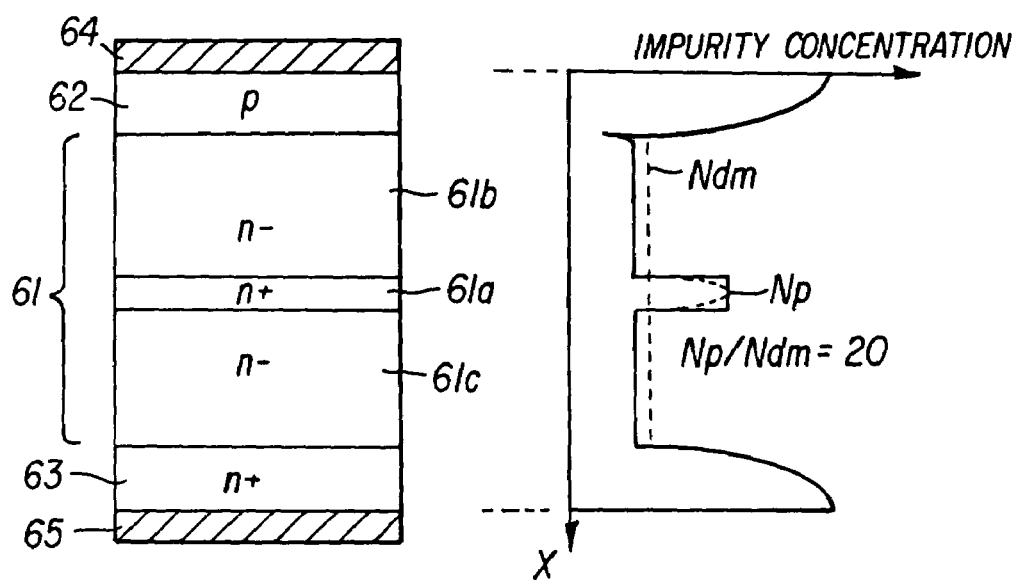
FIG. 5A is a cross sectional view showing a principal part of a related device D.
FIG. 5B is a view showing an impurity concentration distribution in the related device D shown in FIG. 5A.
Figure 6:
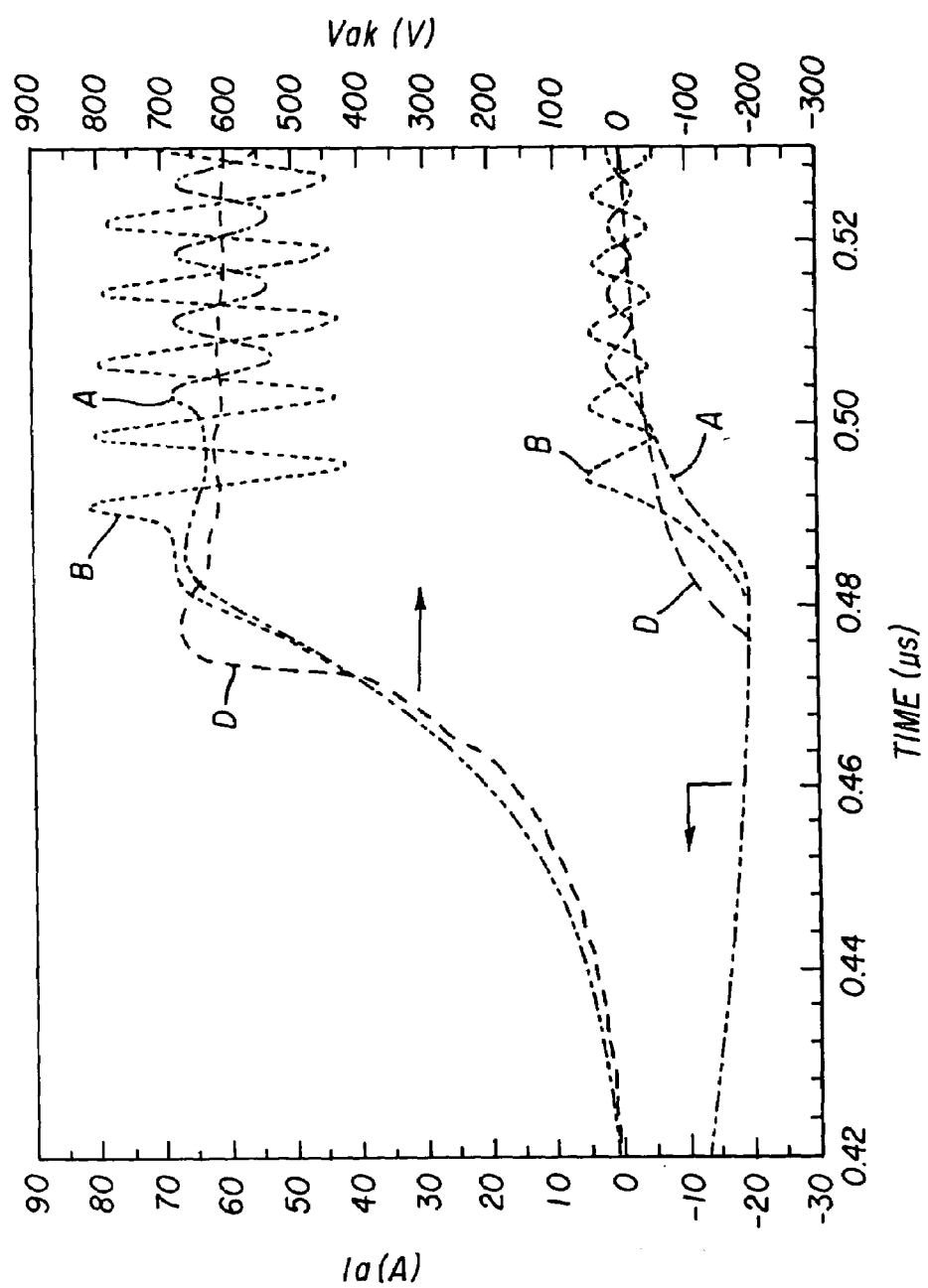
FIG. 6 is a diagram showing results of simulations of waveforms about anode to cathode voltages Vak and anode currents Ia at revere recovery in each of the related semiconductor devices A, B, and D

In the example according to the present invention, the light ion irradiation is carried out so that the range Xp of the light ion satisfies before presented expressions about the ratio Xp to the position index. The heat treatment carried out thereafter brings about not only recovery of defects in the epitaxial layer 120 but also so-called activation of donor atoms by light ions by which the donor concentration increases in a region with localized defects. This is because the heat treatment brings the light ions to occupy a relatively shallow level of about 0.2 eV above the forbidden band from the CB (Conduction Band) of Si. This can provide an impurity concentration distribution like that shown in FIG. 13B (FIG. 70B). Moreover, the impurity concentration distribution can be also provided like the distribution represented by that shown in FIG. 12B. For example, JP-A-9-232332, JP-A-2000-77350, or the domestic re-publication of PCT international publication for patent application WO00/16408, discloses activating donor atoms by light ions. JP-A-9-232332, however, disclosed that the light ion irradiation is used for carrying out counter doping of a gate section of an IGBT, which is essentially different from the use of the light ions as impurities into the n-drift layer in the present invention. Moreover, the description presented in JP-A-2000-77350 is that only for carrying out activation of donor atoms of a semiconductor substrate of a gate turn-off thyristor (GTO). Thus, no suggestion is given about the function of the layer formed by activation of donor atoms, the physical effect obtained in the device by the activation, a further effect on the electrical characteristics of the device itself, and an effect on industry obtained by using the device. Furthermore, in the activation described in the domestic re-publication of PCT international publication for patent application WO00/16408, the layer formed by the activation is provided at a position at which the layer is in contact with an n-cathode layer like the related device B previously shown in FIGS. 3A and 3B. This essentially differs from the structure according to the present invention in position where the layer is formed by the activation and in physical effect achieved by the activation.

Figure 69B:
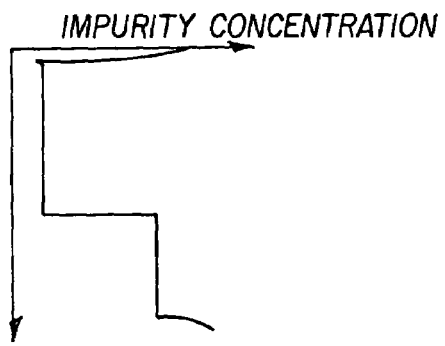
FIG. 69B is a view schematically showing an impurity concentration distribution in the semiconductor device in the manufacturing step shown in FIG. 69A.
Figure 70A:
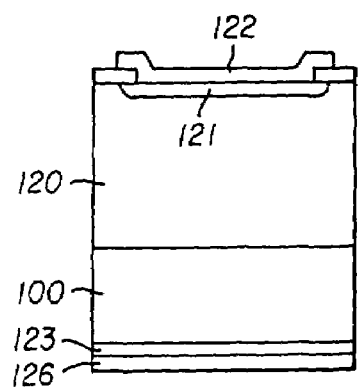
FIG. 70A is a cross sectional view showing a principal part of a semiconductor device in a finished state in the manufacturing method as the sixteenth example according to the present invention.
Figure 70B:
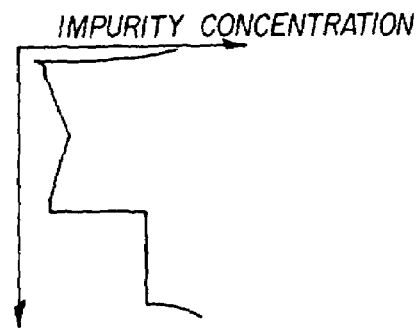
FIG. 70B is a view schematically showing an impurity concentration distribution in the semiconductor device shown in FIG. 70A.
Figure 71:
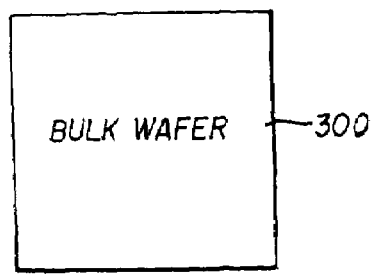
FIG. 71 is a cross sectional view showing a principal part of a semiconductor device in a state of a bulk wafer in a manufacturing method of a semiconductor device as a seventeenth example according to the present invention.

Following the step shown in FIGS. 69A and 69B, a cathode electrode 126 is formed on the n-cathode layer 123 (FIGS. 70A and 70B).

In the sixteenth example, as described above, it is characterized that the impurity concentration distribution in the n-drift layer 120 is formed at a relatively low temperature in the latter steps in the process. The proton irradiation is desirably carried out with irradiation doses from $1 \times 10^{11}$ cm$^{-2}$ to $1 \times 10^{14}$ cm$^{-2}$ in the step previous to that of forming a back electrode. Furthermore, the heat treatment temperature is well determined between 300° C. and 600° C. A proton irradiation with a dose of $1 \times 10^{11}$ cm$^{-2}$ and heat treatment at 300° C. resulted in an impurity concentration by activation of donor atoms of $1.0 \times 10^{14}$ cm$^{-3}$, which is a value very close to the value of the impurity concentration of $8 \times 10^{13}$ cm$^{-3}$ in the FZ silicon wafer, showing that there was a little effect of the activation of donor atoms. In addition, there remained a large numbers of lattice defects to result in a decreased carrier lifetime as short as about 0.1 μs.

Meanwhile, a proton irradiation with a dose of $1 \times 10^{14}$ cm$^{-2}$ and heat treatment at 300° C. resulted in an impurity concentration by activation of donor atoms as much as $1.0 \times 10^{14}$ cm$^{-3}$. This, however, caused so many lattice defects as to result in a significantly decreased carrier lifetime being as short as about 0.01 μs. Furthermore, heat treatment at 600° C. or above produces no activation of donor atoms to make the irradiation meaningless. Thus, a proton irradiation with a dose of $1 \times 10^{12}$ cm$^{-2}$ and heat treatment at 350° C., for example, resulted in adequate activation of donor atoms and an adequate carrier lifetime value. For the light ions, in addition to protons, there are named helium ions and deuterons. However, from the view point of offering a balance of the width of a region of activation of donor atoms and a half width of a region with lattice defects (a thickness of a layer with lattice defects), the proton irradiation provides a width of a region of activation of donor atoms about 40 μm, which presents an almost desired impurity concentration distribution.

Figure 72A:
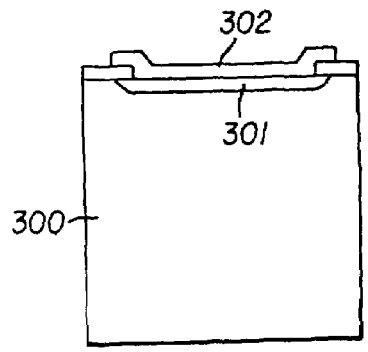
Figure 72B:
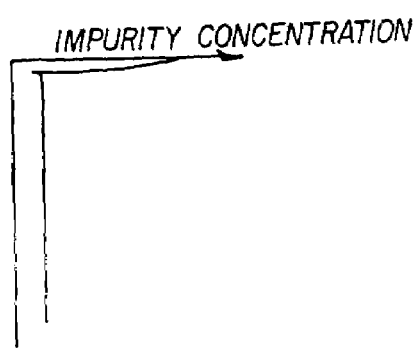
Figure 73A:
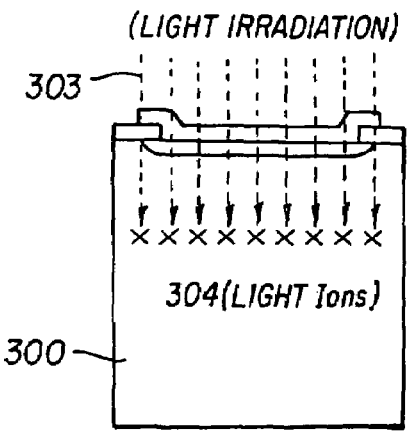
Figure 73B:
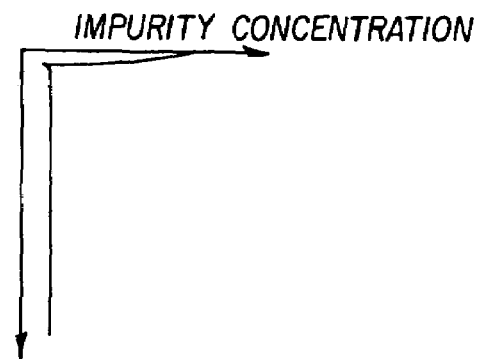
Figure 74A:
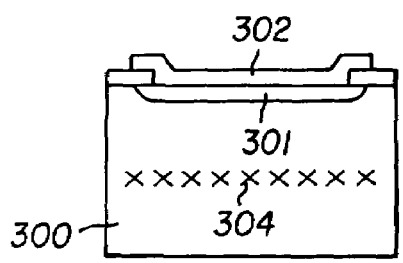
Figure 74B:
Figure 75A:
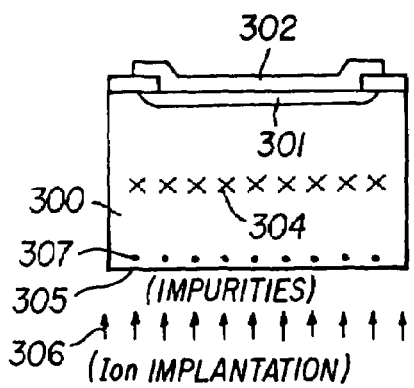
Figure 75B:
Figure 76A:
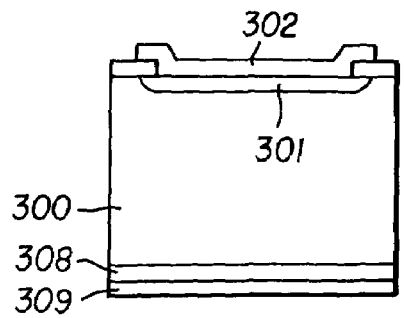
Figure 76B:
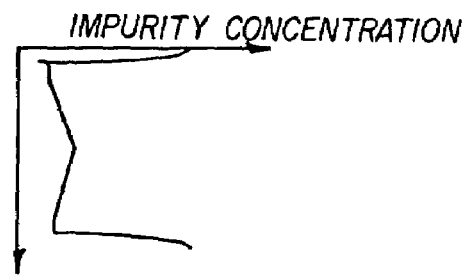
Figure 77:
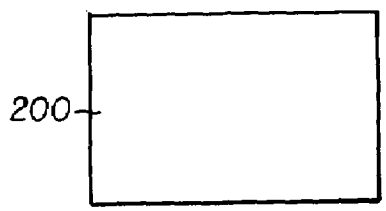

FIG. 71, FIG. 72A, FIG. 73A, FIG. 74A, FIG. 75A, and FIG. 76A are cross sectional views of a principal part of a semiconductor device showing a manufacturing method thereof as a seventeenth example according to the present invention in the order of manufacturing steps with FIG. 72B, FIG. 73B, FIG. 74B, FIG. 75B, and FIG. 76B showing impurity concentration distributions in the steps shown in FIG. 72A, FIG. 73A, FIG. 74A, FIG. 75A, and FIG. 76A. Similarly, a bulk wafer 300 (FIG. 71) obtained from an FZ silicon single crystal of n-type with high resitivity including phosphorus is subjected to an ordinary processing, on which there are formed a p-anode layer 301 and an anode electrode 302 (FIGS. 72A and 72B). Thereafter, a light ion irradiation 303 is carried out with light ions such as protons like in the sixteenth example (FIGS. 73A and 73B). After the irradiation, the bulk wafer 300 is ground from the bottom face to be thinned down to a specified thickness (FIGS. 74A and 74B). This can reduce the number of processing steps to be carried out after the bulk wafer 300 is thinned. After the grinding, ion implantation 306 is carried out with n-type impurity ions (impurities 307) onto a ground face 305 as a bottom face (FIGS. 75A and 75B). Following this, heat treatment is carried out, by which an impurity concentration distribution like that shown in FIG. 13B is provided together with formation of an n-cathode layer 308 (FIG. 76B). Moreover, the impurity concentration distribution can be also provided like the distribution represented by that shown in FIG. 12B. Following this, a cathode electrode 309 is formed on the n-cathode layer 308 (FIG. 76A). The heat treatment temperature can be the same as that in the sixteenth example. Moreover, decrease in carrier lifetime in an area with localized light ions may be actively used for enhancing characteristics of the device.

FIG. 77 to FIG. 79, FIG. 80A, FIG. 81A, and FIG. 82A are cross sectional views of a principal part of a semiconductor device showing a manufacturing method thereof as an eighteenth example according to the present invention in the order of manufacturing steps with FIG. 80B, FIG. 81B, and FIG. 82B showing impurity concentration distributions in the steps shown in FIG. 80A, FIG. 81A, and FIG. 82A, respectively. The manufacturing method is similar as that in the fifteenth example, but differs therefrom in that, with the formation of the first epitaxial layer 220 shown in FIG. 60 omitted, ion implantation is carried out onto a bulk wafer 200, on which a second epitaxial layer 223 is formed. By thus omitting the formation of first epitaxial layer 220, the manufacturing cost can be lowered compared with that of the device in the fifteenth example. Also in the above twelfth to eighteenth examples, the impurity concentration distributions can be provided as those in previously described first to seventh modification examples.

FIGS. 83A, 83B, and 83C are circuit diagrams each showing an example of a circuit in an electric power converter to which the semiconductor device according to the present invention is applied. FIG. 83A is a circuit diagram showing a circuit of an AC to AC inverter/converter. The inverter/converter is capable of so efficiently controlling an induction motor and a servomotor as to be widely used in industries and electric railways. The device according to the present invention is used as a free wheeling diode D1 for an IGBT T1 in each of switching sections in a DC to AC inverting section on the right-hand side of the diagram. FIG. 83B is a circuit diagram showing a power factor correction circuit using the device according to the present invention as a diode D2 in a chopper circuit on the right-hand side of the diagram. The correction circuit controls an input current in AC to AC conversion so as to be in a sinusoidal waveform to thereby carry out waveform correction. Thus, the power factor correction circuit can be used not only for an AC to AC conversion circuit but also for other switching power source circuits. FIG. 83C is a circuit diagram showing a circuit of a direct AC to AC conversion matrix converter using the reverse-blocking IGBT T2 shown in FIGS. 42A and 42B as the tenth example. A pair of the IGBTs T2 forms each of switching circuits in the converter.

FIG. 84 is a diagram showing a result of measurement of radiated electromagnetic noise when the device according to the present invention is particularly applied to the AC to AC inverter/converter shown in FIG. 83A. The diagram shows a noise spectrum obtained when the inverter/converter is operated in a radio wave dark room shielded from external electromagnetic noises. There is also shown in FIG. 84 a result when a related device is applied to the same AC to AC inverter/converter. As is apparent from FIG. 84, the inverter/converter using the device according to the present invention attains 10 dB or more noise reduction.

FIG. 85 is a diagram showing respective waveforms in reverse recovery in the semiconductor device according to the present invention (the total n⁻-layer thickness of 117 μm), the related device A (the same of 117 μm), and the related device A with the total n⁻-layer thickness of 130 μm. In each of the devices, a forward voltage Vf when a forward current flows in the device is given as Vf=1.7V. In the related devices the total n⁻-layer thickness must be increased up to 130 μm for inhibiting oscillation as shown in FIG. 85. The reverse recovery loss Err at this time is 0.609 mJ. Compared with this, the device according to the present invention causes no oscillation with the total n⁻-layer thickness of 117 μm. The recovery loss Err of the device is 0.328 mJ, which provides reduction in loss as much as 46%.

The semiconductor device according to the present invention is characterized by providing a structure in which a distribution of a donor concentration in a drift layer gradually decreases from the position, at which the donor concentration is the maximum, toward each of the anode electrode and the cathode electrode. Furthermore, the device is formed so that the maximum donor concentration, the position of the maximum donor concentration, and an integrated donor concentration within a specified section satisfy the foregoing expressions. Such a structure makes it possible not only to thin the total thickness of the drift layer without degrading a breakdown voltage to make the device perform a high speed operation and soft recovery, but also to suppress a rate of change of a voltage dV/dt at reverse recovery.

Namely, the space charge region spreading at reverse recovery is once stopped at the n-buffer layer, by which minority carriers on the anode side from the buffer layer are quickly swept-out by the space charge region. While, on the cathode side from the buffer layer, the space charge region a little enters the rest of the drift region on the cathode side over the buffer layer without further spreading any more. This causes the minority carriers on the cathode side to be reduced only by recombination without being swept-out into the space charge region. Therefore, sufficient carriers are remained compared with related diodes, by which current decreasing rate is held low to make the diode perform soft recovery. Therefore, the total thickness of the drift layer can be made thin. As a result, compared with related diodes, the diode can be made to perform soft recovery yet perform a high-speed and low-loss reverse recovery operation.

Moreover, by decreasing the maximum concentration in a distribution of donor concentration in the drift layer (or the buffer layer), the space charge region spreads more smoothly than in buffer structures of the related diodes. Furthermore, with an integrated donor concentration in the buffer layer provided as a specified concentration, the dV/dt at reverse recovery can be held low so as not to degrade a breakdown voltage and a soft recovery effect.

Figures 10A, 10B, 10C:
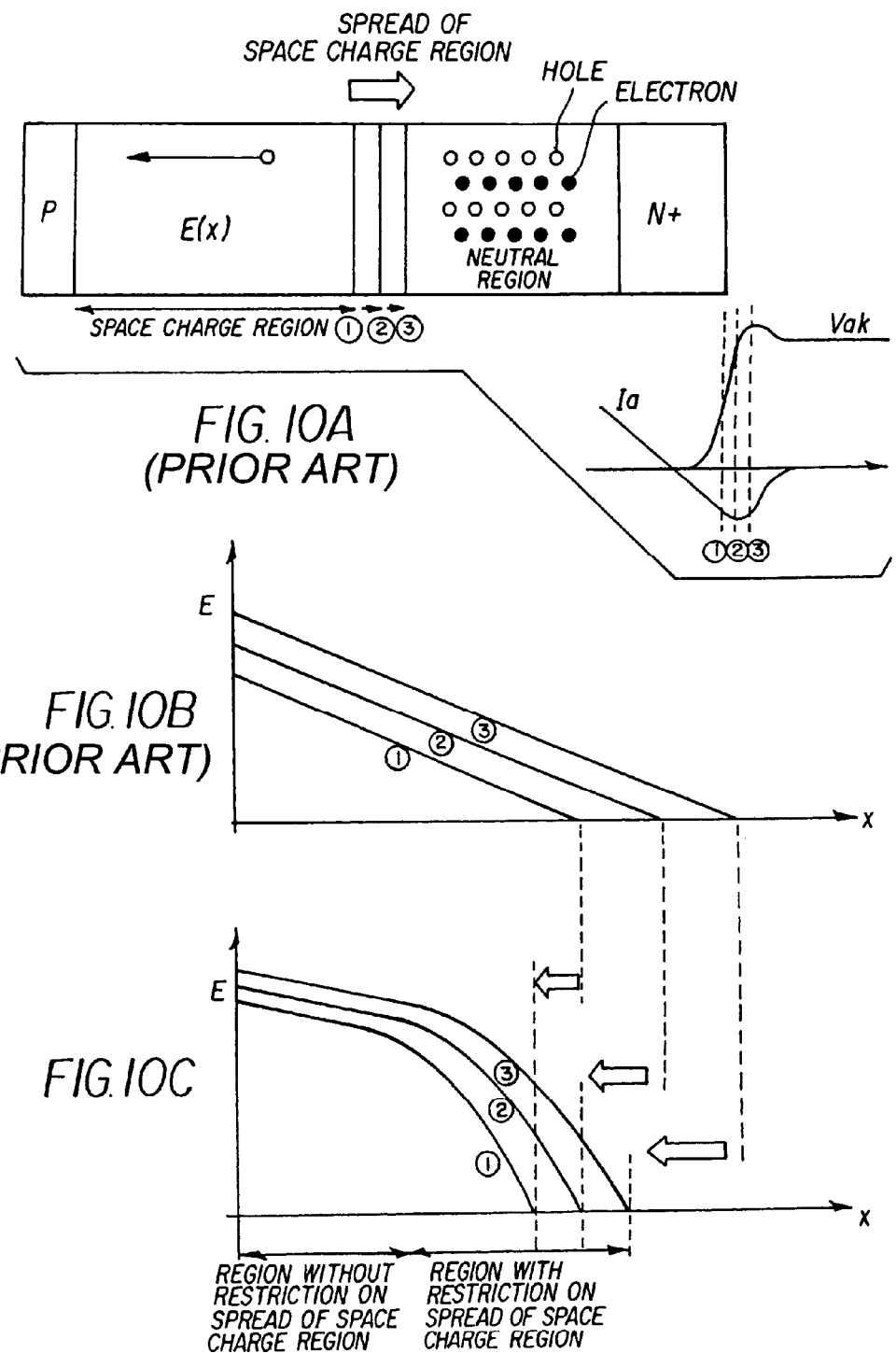
FIG. 10A is a view schematically showing movements of a space charge region and carriers at reverse recovery in a p-i-n structure.
FIG. 10B is a view showing distributions of electric field strengths at reverse recovery in a related p-i-n structure.
FIG. 10C is a view showing distributions of electric field strengths at reverse recovery in a p-i-n structure according to the present invention.

Above operation is an effect obtained by restricting the spread of the space charge region at the reverse recovery and by increasing the restricted range more than a range on which no particular restriction is provided. The spread of the space charge region is restricted as presented in FIGS. 10A to 10C. FIG. 10A is a view schematically showing movements of a space charge region and carriers at reverse recovery in a p-i-n structure, FIG. 10B is a view showing distributions of electric field strengths at reverse recovery in a related p-i-n structure, and FIG. 10C is a view showing distributions of electric field strengths at reverse recovery in a p-i-n structure according to the present invention. In each of FIGS. 10B and 10C, vertical axis represents an electric field strength E and a horizontal axis represents a distance X in a direction from a pn-junction to the cathode electrode.

A region is provided in which an absolute value of a gradient of electric field strength E increases during reverse recovery (first derivative $\partial E/\partial X$) and the region is made larger than a region in which the absolute value of the gradient is constant in average. Large numbers of minority carriers existed at conduction of a current are swept-out while being drifted mainly by the spread of the space charge region. The swept-out carriers pass through the space charge region to reach an anode layer P. Thus, carriers in a neutral region are reduced more as the space charge region spreads faster to finally disappear.

Therefore, with the electric field strength distributions provided as shown in FIG. 10C, a width of the spread space charge region is restricted compared with those in a related device shown in FIG. 10B. This reduces the number of minority carriers swept-out from the neutral region to the space charge region while being drifted. Thus, sufficient excess carriers are remained in the neutral region with the number thereof being increased by the number of carriers left without being swept-out, by which snappy reverse recovery due to abrupt reduction of carriers is avoided to make the diode perform soft recovery. The effect is more remarkable as a region where spread of the space charge region is restricted becomes broader than a region without such restriction, namely, a region with a fixed $\partial E/\partial X$.

Meanwhile, for keeping reverse blocking characteristics while well ensuring the soft recovery characteristics, it is preferable to relax the restriction on the spread of the space charge region after the space charge region has passed through the region where the spread is restricted. Namely, it is preferable that second derivative of the electric field strength $\partial^2 E/\partial X^2$ exhibits both of positive and negative polarities. Therefore, the impurity concentration is well made distributed so as to gradually decrease toward each of the anode and the cathode in the n⁻-drift layer.

Figure 11A:
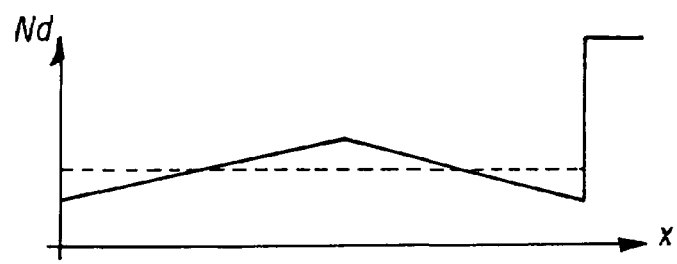
FIG. 11A is a view showing an impurity concentration distribution in a diode as a semiconductor device according to the present invention.
Figure 11B:
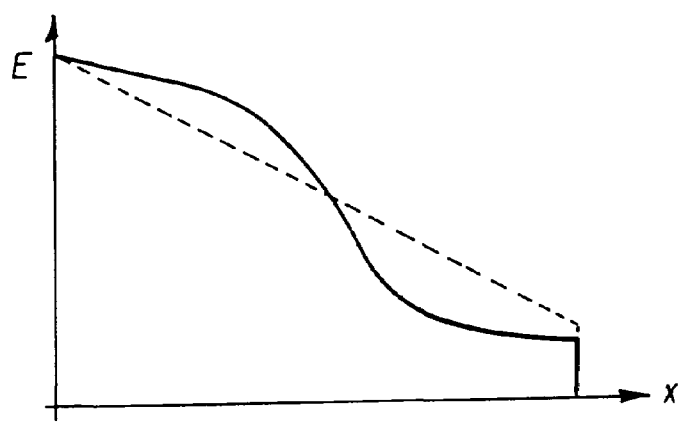
FIG. 11B is a view showing an electric field strength distribution when a reverse bias voltage of a certain value is statically applied to the semiconductor device shown in FIG. 11A.
Figure 11C:
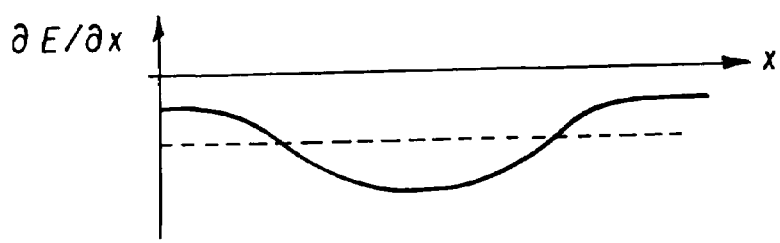
FIG. 11C is a view showing first derivative $\partial E/\partial X$ of the electric field strength distribution shown in FIG. 11B.
Figure 11D:
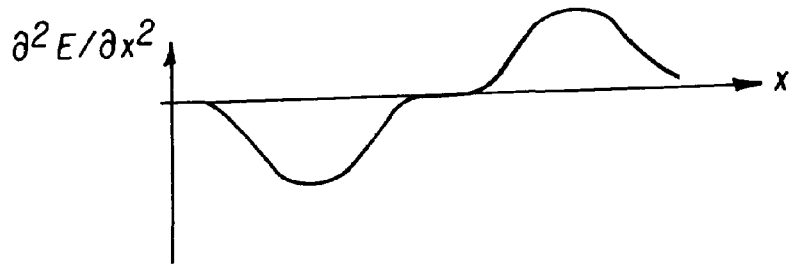
FIG. 11D is a view showing second derivative $\partial^2 E/\partial X^2$ of the electric field strength distribution shown in FIG. 11B.

FIGS. 11A to 11D are views showing about an impurity concentration distribution and an electric field strength distribution in a diode as a semiconductor device according to the present invention. FIG. 11A is a view showing an impurity concentration distribution in the diode to a distance X from the anode layer, FIG. 11B is a view showing an electric field strength distribution when a reverse bias voltage of a certain value is statically applied to the diode shown in FIG. 11A, FIG. 11C is a view showing first derivative $\partial E/\partial X$ of the electric field strength distribution shown in FIG. 11B, and FIG. 11D is a view showing second derivative $\partial^2 E/\partial X^2$ of the electric field strength distribution shown in FIG. 11B. With the impurity concentration distribution provided according to the present invention as shown in FIG. 11A, the distribution of the electric field strength E exhibits abrupt reduction near the center of the n⁻-drift layer as shown in FIG. 11B. By such an electric field strength distribution, the spread of the space charge region is restricted near the center of the n⁻-drift layer. Further, on the cathode side from the center, the space charge region spreads a little again. This is accomplished by the electric field strength distribution with the first derivative $\partial E/\partial X$ thereof having a relative extreme in the n⁻-drift layer as shown FIG. 11C. Furthermore, as shown in FIG. 11D, the second derivative $\partial^2 E/\partial X^2$ of the electric field strength distribution has not only a negative relative extreme but also a positive relative extreme. The presence of the positive relative extreme allows the space charge region to spread a little toward the cathode side to also allow the breakdown voltage to be kept high. With this, under an operating voltage about a half the normal breakdown voltage, the restricted space charge region allows the diode to perform soft recovery at reverse recovery with a breakdown voltage also made sufficiently higher.

The present invention makes it possible to reduce in reverse recovery loss, further enhance soft recovery characteristics, suppress dV/dt reverse recovery voltage, and inhibit oscillation in reverse recovery voltage and current. As a result, there can be provided environment-friendly semiconductor devices such as IGBT modules and IPMs (Intelligent Power Modules) with less electric loss and electromagnetic noise radiation.

While the present invention has been particularly shown and described with reference to preferred embodiments thereof, it will be understood by those skilled in the art that the foregoing and other changes in form and details can be made therein without departing from the spirit and scope of the present invention.

The disclosures of the priority application, JP PA 2002-042469 and JP 2002-214657, and the co-pending U.S. application Ser. No. 10/083,673, in their entirety, including the drawings, claims, and the specification thereof, are incorporated herein by reference.

What is claimed is:

1. A method of manufacturing a semiconductor device comprising the steps of:
   providing a semiconductor substrate of a first conductivity type as a first semiconductor layer;
   forming a second semiconductor layer of a second conductivity type on a first principal surface of the first semiconductor layer;
   implanting light ions into the first semiconductor layer by penetrating into one of the first semiconductor layer or the second semiconductor layer with light ions;
   thinning a second principal surface of the first semiconductor layer;
   implanting on the thinned second principal surface of the first semiconductor layer with impurity ions of the first conductivity type; and
   heat treating to form a third semiconductor layer with an ion-implanted layer on the second principal surface of the first semiconductor layer, and to electrically activate a region implanted with the light ions in the first semiconductor layer between the second semiconductor layer and the third semiconductor layer.

2. The method of manufacturing a semiconductor device as claimed in claim 1, wherein the light ions exist in a direction from the second semiconductor layer to the third semiconductor layer up to positions respectively reaching the second semiconductor layer and the third semiconductor layer.

3. The method of manufacturing a semiconductor device as claimed in claim 1, wherein the light ions exist in a direction from the second semiconductor layer to the third semiconductor layer up to positions respectively apart from the second semiconductor layer and the third semiconductor layer.

4. The method of manufacturing a semiconductor device as claimed in claim 1, 2, or 3, wherein the light ions are protons.

5. The method of manufacturing a semiconductor device as claimed in claim 1, 2, or 3, wherein an amount of the implanted light ions is between $1\times10^{11}$ cm$^{-2}$ and $1\times10^{14}$ cm$^{-2}$.

6. The method of manufacturing a semiconductor device as claimed in claim 1, 2, or 3, wherein a temperature of the heat treatment is between 300° C. and 600° C.

7. A method of manufacturing a semiconductor device comprising:
- a first semiconductor layer of a first conductivity type;
- a second semiconductor layer of a second conductivity type formed on one principal surface of the first semiconductor layer with an impurity concentration higher than that of the first semiconductor layer; and
- a third semiconductor layer of a first conductivity type formed on the other principal surface of the first semiconductor layer with an impurity concentration higher than that of the first semiconductor layer,
- wherein the first semiconductor layer has an impurity concentration becoming a relative maximum at a plurality of positions in a direction from the second semiconductor layer to the third semiconductor layer, and
- wherein the impurity concentration of the first semiconductor layer decreases from the positions at each of which the impurity concentration becomes the relative maximum with an inclination toward each of the second semiconductor layer and the third semiconductor layer, the method comprising the steps of:
- providing a semiconductor substrate of the first conductivity type as the third semiconductor layer;
- forming the first semiconductor layer of the first conductivity type on the third semiconductor layer by an epitaxial growth, while holding the impurity concentration of the first conductivity type constant, and epitaxially growing to a specified position in a direction opposite to the third semiconductor layer while gradually increasing the impurity concentration of the first conductivity type, and then carrying out epitaxial growth while gradually decreasing the impurity concentration of the first conductivity type from the specified position; and
- forming the second semiconductor layer by diffusing impurities of the second conductivity type on a surface of the finally formed epitaxial layer.

8. The method of manufacturing a semiconductor device as claimed in claim 7, wherein the epitaxial growth is carried out while stepwisely increasing and decreasing the impurity concentration of the first conductivity type.

* * * * *